United States Patent [19]

Beyers, Jr. et al.

[11] 4,162,513

[45] Jul. 24, 1979

[54] TELEVISION SYSTEM SCHEDULER

[75] Inventors: Billy W. Beyers, Jr., Greenfield; Adam J. Suchko, Indianapolis, both of Ind.

[73] Assignee: RCA Corporation, New York, N.Y.

[21] Appl. No.: 945,042

[22] Filed: Sep. 26, 1978

[30] Foreign Application Priority Data

Sep. 30, 1977 [GB] United Kingdom .............. 40763/77

[51] Int. Cl.² .......................... H04N 5/48; H04B 1/26
[52] U.S. Cl. ................................... 358/191; 325/396; 325/464
[58] Field of Search ....................... 358/188, 190, 191; 325/389, 395, 396, 464; 334/14, 15

[56] References Cited

U.S. PATENT DOCUMENTS

| 3,886,307 | 5/1975 | Evane et al. .......................... 358/191 |
| 4,004,085 | 1/1977 | Makino et al. ....................... 325/396 |

OTHER PUBLICATIONS

Kokado et al., "A Programmable TV Receiver," *IEEE Transactions on Consumer Electronics*, Feb. 1976, pp. 69–82.

"Farbfernsehgerat mit Mikroprozessor-Steuerung," Baum, *Funkschau* 1977, Heft 17.

Heathkit Electronic Center Catalog 841R, Fall 1978, Heath Company, pp. 90, 91.

*Primary Examiner*—John C. Martin
*Attorney, Agent, or Firm*—Eugene M. Whitacre; Paul J. Rasmussen; Peter M. Emanuel

[57] ABSTRACT

A television receiver includes a chassis having a digital tuner for generating local oscillator signals for tuning the receiver to respective channels in response to binary signals representing corresponding channel numbers and a signal processing unit for controlling at least one characteristic of the receiver such as the sound level, in response to binary signals representing the controllable characteristic. The receiver also includes a microcomputer including a RAM (Random Access Memory) with at least one memory location for storing binary signals representing the present time and a plurality of memory locations for storing binary signals representing future times and channel numbers of channels to be tuned at those times. A control portion of the microcomputer causes binary signals representing the channel number associated with a future time to be coupled to the digital tuner when the present time matches the future time. A keyboard having ten digit keys for generating binary signals representing the decimal digits between 0 and 9 and two characteristic keys to generate binary signal representing an increase and a decrease in the controllable characteristic is provided to enable user control of various operating modes of the receiver. When a user operates digit keys to form a number within a predetermined range of channel numbers, e.g., 2–83, the control portion of the microcomputer causes a channel to be tuned. Subsequently, operation of digit keys within the predeterined range of channel numbers causes the channel to be changed and operation of the characteristic keys causes the controllable characteristic to change. When a user operates digit keys to form a number not within the predetermined range of channel numbers, the control portion of the microcomputer causes power to be decoupled from the chassis. Subsequently, in response to the operation of a predetermined one of the characteristic keys, the control portion causes binary signals generated in response to the operation of the digit keys to be selectively coupled to either the RAM location associated with the present time or to the RAM location for future selections.

15 Claims, 40 Drawing Figures

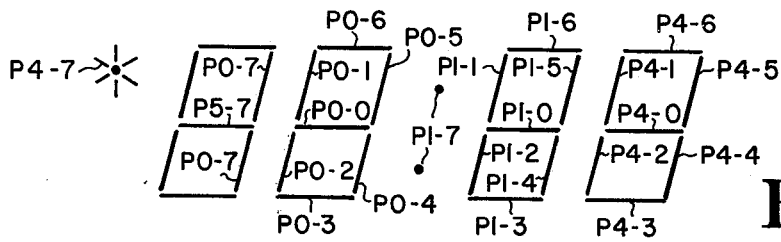
Fig. 4
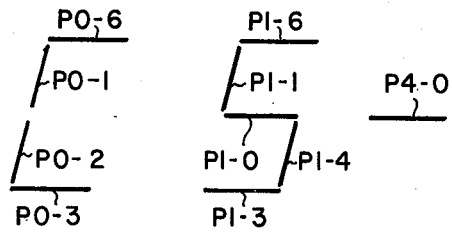
Fig. 4a
Fig. 4b
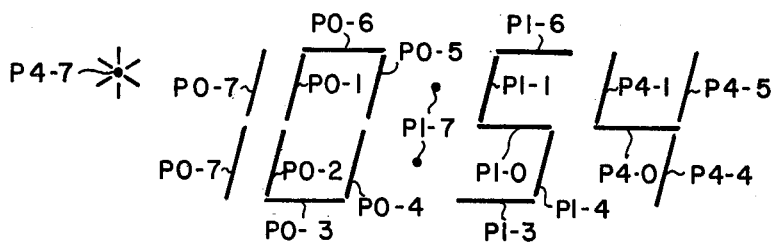
Fig. 4c
Fig. 4d
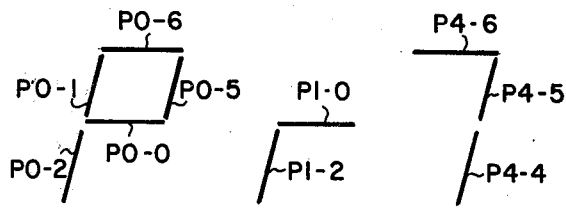
Fig. 4e
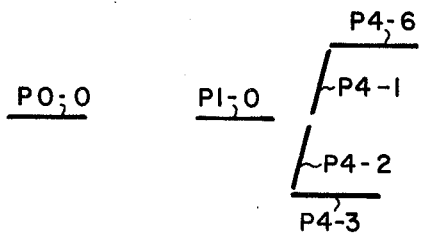
Fig. 4f

| RAM ADDRESS | FUNCTIONAL NAME | BIT ALLOCATION ||||||||
|---|---|---|---|---|---|---|---|---|---|
| | | CBS | CHDS | ESS | EDT | CS | PR | UP | EOS |
| H'00 | FLAG | | | | | | | | |
| H'01 | TMP 0 | | | | | | | | |
| H'02 | TTIM | ←—PRO | MPT | | DE | LAY—→ | | | |
| H'03 | TEM 1 | ←—DAY—→ | | ←—HOURS—→ | | | | | |
| H'04 | TEM 2 | ½ HR ← | | ←—CHANNEL—→ | | | | | |
| H'05 | DAT | ← | KEY | BOA | RD—→ | | | | |
| H'06 | CHAN | ← | | ←—CHANNEL—→ | | | | | |
| H'07 | TMP 1 | | | | | | | | |
| H'08 | SEC | ← | | SEC—→ | | | | | |
| H'09 | NEXT | | | | | | | | |
| H'0A | HR | ←—DAY—→ | | ←—HOURS—→ | | | | | |
| H'0B | MIN | ½ HR ← | —30 | MIN | CTR—→ | | | | |
| H'0C | JUMPH (KU) | | | | | | | | |
| H'0D | JUML (KL) | | | | | | | | |
| H'0E | DCU (QU) | | | | | | | | |
| H'0F | DCL (QL) | | | | | | | | |
| H'10 | KB | KD | | | | | ←—CODE—→ | | |
| H'11 | TTIM(START) | ←—PRO | MPT | | DE | LAY—→ | | | |
| H'12 | HZR | ← | | 60 | HZ—→ | | | | |
| H'13 | VCNT | ← | | VOL | UME—→ | | | | |
| H'14 | ↑ | ←—DAY—→ | | ←—HOURS—→ | | | | | |
| H'15 | | ½ HR ← | | ←—CHANNEL—→ | | | | | |
| ⋮ | SELECTION LIST | | | | | | | | |
| H'3E | ↓ | ←—DAY—→ | | ←—HOURS—→ | | | | | |
| H'3F | | ½ HR ← | | ←—CHANNEL—→ | | | | | |
| | | 8 | 7 | 6 | 5 | 4 | 3 | 2 | 1 |

Fig. 5

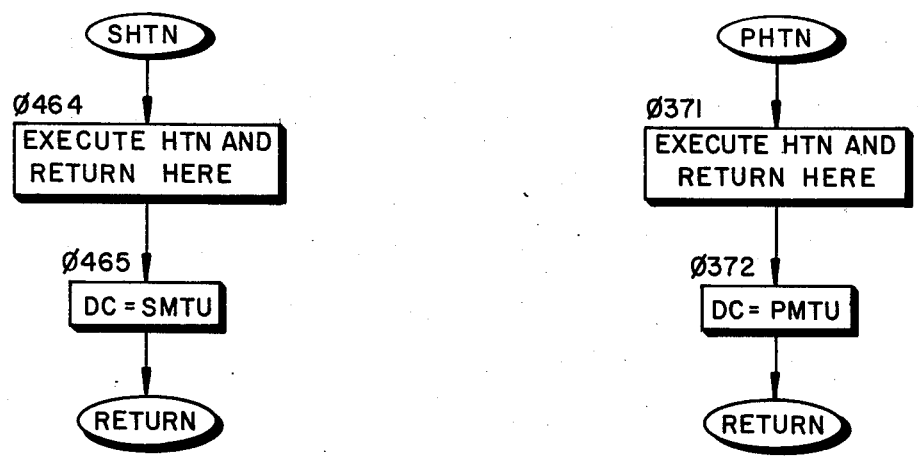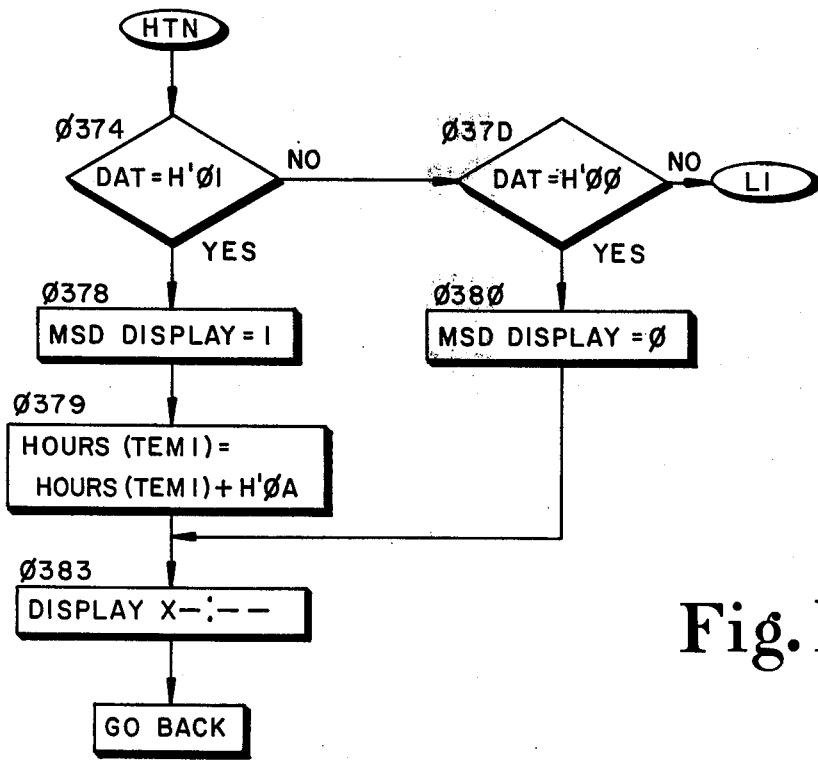
Fig. 17

TELEVISION SYSTEM SCHEDULER

BACKGROUND OF THE PRESENT INVENTION

The present invention relates to television systems including apparatus for programming the television system so that it is automatically tuned to preselected channels at corresponding future times.

A variety of so-called television "programmers" or "schedulers" have recently been proposed for programming a television system such as a television receiver or video tape recorder so that it is automatically tuned to preselected channels at corresponding future times. These systems have necessitated adding control apparatus to the television system for entering and verifying the information related to the future selections. Since many present day television receivers already include a calculator-like keyboard for generating binary signals representing channel numbers of channels to be tuned by a digital tuner portion of the receiver and a receiver characteristic such as volume to be controlled by a signal processing portion of the receiver, it is desirable to minimize the cost and complexity of additional apparatus for a scheduling feature so that the scheduler portion be capable of utilizing the same keyboard, without any additional control devices for entering and verifying scheduling information. Furthermore, in such a scheduler apparatus, in which the same keyboard has a multiplicity of functions, it is desirable to provide prompt features which suggest or remind a viewer of which operational steps to follow in the various operating modes, again desirably without the necessity of additional apparatus. Finally, it is desirable that such scheduler apparatus operate in a manner which tends to reduce the possibility of entry of information which is improper due to operator error.

SUMMARY OF THE PRESENT INVENTION

In accordance with one feature of the present invention in a television system including programmable means for at least temporarily storing binary signals representing information to be selected by a user, digital tuner means for tuning the television system to various channels identified by respective channel numbers in a predetermined range of numbers in response to binary signals representing said channel numbers and keyboard means including a plurality of digit keys for normally generating binary signals representing said channel numbers in response to the operation of said digit keys by the user, control means are provided which are responsive to the operation of at least one of the digit keys to generate binary signals representing channel numbers within the predetermined range of numbers for causing the digital tuner means to tune the television system to respective channels and which are responsive to the operation of at least one of the digit keys to generate a predetermined number not within said predetermined range for enabling the programmable means to receive binary signals generated in response to the subsequent operation of the digit keys.

In accordance with another feature of the present invention, in a television system including programmable means for at least temporarily storing binary signals representing information selected by a user, digital tuning means for tuning the television system to various channels identified by respective channel numbers in response to binary signals representing the channel numbers to thereby generate an IF signal having components representing picture and audio information, signal processing means for deriving picture and audio signals from the components of the IF signal, first power supply means for selectively coupling and decoupling operating power to at least one of the digital tuner means and the signal processing means to thereby establish an on condition of the television system and an off condition of the television system, keyboard means including digit keys for normally generating binary signals representing the channel numbers in response to the operation of said digit keys by the user, there is provided second power supply means and control means receiving operating power from said second power supply means and being coupled to said first power supply means for enabling binary signals generated in response to the operation of the digit keys to be coupled to said digital tuner means when the television system is in said on condition and for enabling binary signals generated in response to the operation of the digit keys to be coupled to the programmable means when said television system is in the off condition.

BRIEF DESCRIPTION OF THE DRAWING

FIGS. 4 and 4a–4k indicate how a display is utilized to convey information to a user during the various operating modes of the receiver shown in FIG. 4;

FIG. 5 is a block diagram of the organization of the RAM memory portion of the scheduler shown in FIG. 1;

FIGS. 7–29 are detailed flow charts indicating the manner in which binary signals are coupled between various portions of the television receiver shown in FIG. 1 during its various operating modes.

DETAILED DESCRIPTION OF THE DRAWING

Figure 1:
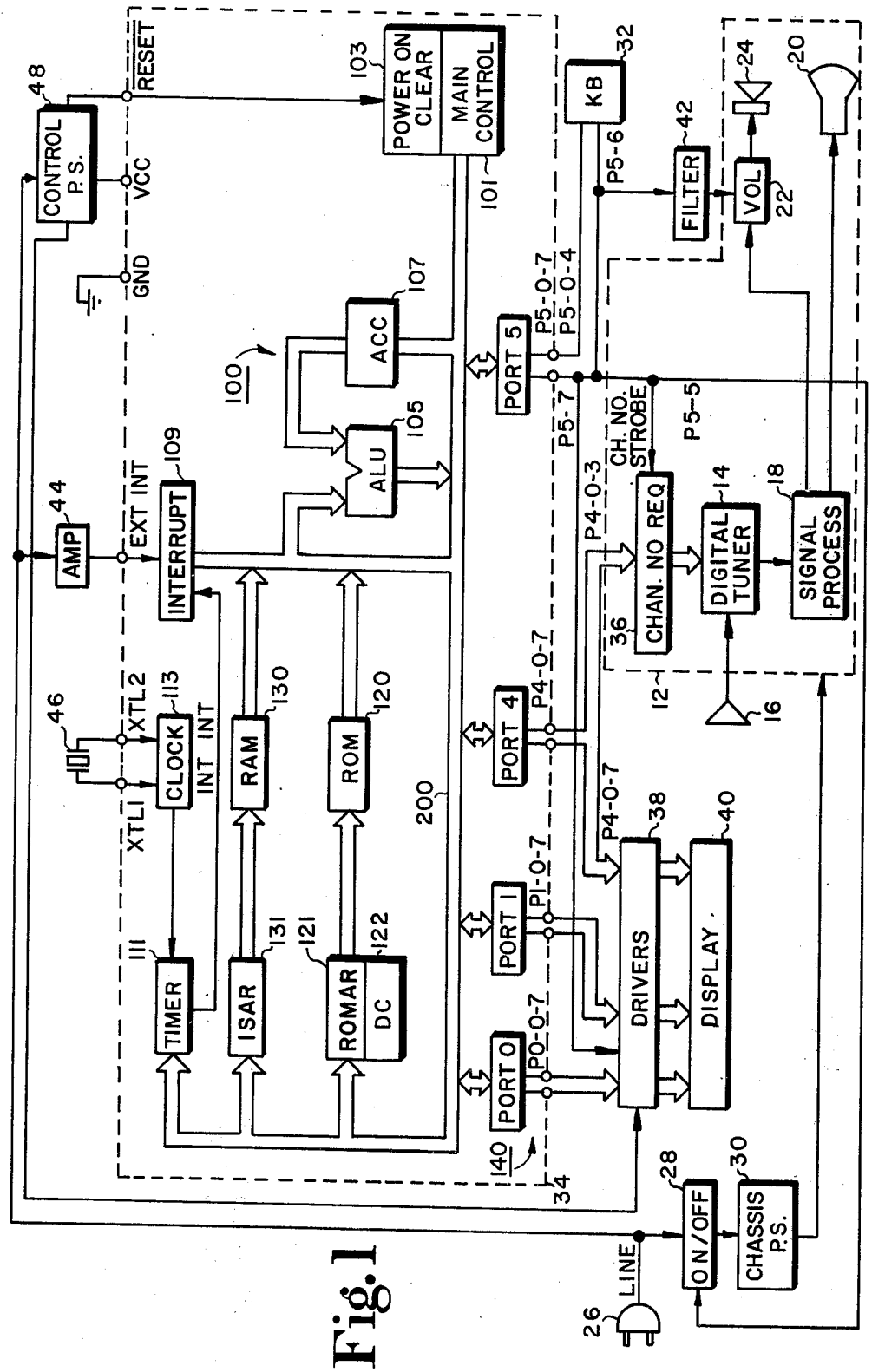
FIG. 1 is a block diagram of a television receiver including a scheduler constructed in accordance with the present invention.

The television receiver shown in FIG. 1 includes a chassis 12 comprising the tuning and signal processing portions of the receiver. Specifically, chassis 12 includes a digital tuner 14 which converts RF signals received from a source such as an antenna 16 to IF signals. The IF signals include carriers bearing video, color and sound information. Signal processing unit 18 separates, amplifies and otherwise processes the various components of the IF signal to derive video, color and sound signals. The video and color signals are coupled to a picture tube 20. The sound information is coupled through a volume level control unit 22 to a speaker 24. Chassis 12 also includes a deflection portion, not shown. Power for the various portions of the receiver is derived from a source of 60 Hz line voltage indicated by a power plug 26. The line voltage is coupled through an on/off switching unit 28 to a chassis power supply unit 30 which derives the DC operating voltages for chassis 12.

Figures 2, 3:
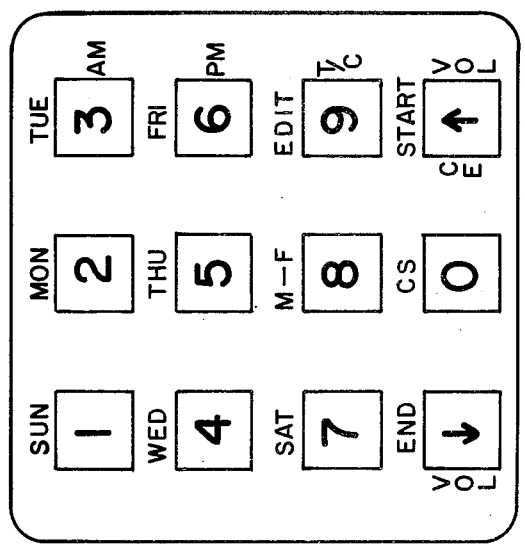
FIG. 2 is a mechanical layout of the keyboard utilized to control the receiver shown in FIG. 1 in its various modes of operation.
FIG. 3 is a table indicating the binary signals generated when each of the keys of the keyboard shown in FIG. 2 are operated.

A viewer controls the various operating modes of the receiver and the entry of information during these modes by means of a calculator-like keyboard 32. As is indicated in FIG. 2, keyboard 32 includes ten digit keys labelled 0 through 9, an up (↑) key and a down (↓) key. When any one of the keys is operated by depressing it, four binary data signals are generated followed by a binary keyboard strobe signal. The various data signals generated by the operation of each key and their hexidecimal code equivalent are indicated in FIG. 3. The keyboard strobe signal when a binary "1" indicates that the data signals have been generated and processed.

The binary signals generated by keyboard 32 are coupled to a microcomputer 34. The structure of microcomputer 34 will be described in detail below. However, it will be helpful at this point to briefly identify its various portions. Microcomputer 34 includes a control portion 100 which controls arithmetic and logical operations, decision making operations and the coupling of binary signals within microcomputer 34 to portions of the receiver outside microcomputer 34. Control portion 100 operates according to a set of instructions permanently stored in binary format in respective memory locations of a ROM (Read Only Memory) 120. A RAM (Random Access Memory) 130 contains a number of memory portions or registers for temporarily storing binary signals representing, among others as will subsequently be explained, information related to the key of keyboard 32 which was last operated, the present time, the present channel tuned, and future times and channel numbers of corresponding channels to be tuned at those future times. The binary signals stored in RAM 130 are processed under the control of control portion 100. A set of bidirectional input/output ports couple binary signals between microcomputer 34 and the remainder of the receiver under the control of control portion 100.

Microcomputer 34 is responsive to the binary signals generated when keys of keyboard 32 are operated to establish and control various operating modes of the receiver. The operating modes of the receiver include: a normal mode in which the operation of the digit keys of keyboard 32 causes the television receiver to be turned on and off and channels to be selected and operation of the up and down keys causes the volume level to be increased and decreased, respectively; a clock setting mode in which operation of the digit keys causes a counter portion of RAM 130 to be set to the present day and time of day; a programming mode in which operation of the digit keys causes information pertaining to future selections, i.e., future times and channel numbers of channels to be tuned at those times, to be stored in a portion of RAM 130; an editing mode in which operation of the digit keys causes information stored in RAM 130 corresponding to future selections to be reviewed for verification; and a deleting mode in which operation of the digit keys and the volume down key causes an unwanted future selection stored in RAM 130 to be deleted. Microcomputer 34 also controls a scheduling mode during which the future time information of each of the future selections stored in RAM 130 are compared to the present time and if a match exists, the corresponding channel is automatically tuned.

Binary signals generated by microcomputer 34 are coupled to various portions of the receiver to control its operation during the various modes identified above.

On/off switching unit 28 is responsive to a binary signal generated by microcomputer 34 to selectively couple or decouple operating voltage from chassis 12 and thereby control when the receiver proper (i.e., the portion of the receiver excluding microcomputer 34) is on or off.

A channel number register 36 stores binary signals generated by microcomputer 34 representing the channel number of a channel manually selected by means of keyboard 32 during the normal mode or automatically selected under the control of microcomputer 34 during the scheduling mode. The binary signals stored in channel number register 36 control the frequency of a local oscillator signal generated by digital tuner 14 to tune the receiver to a selected channel. For this purpose, channel number register 36 may desirably be coupled to a programmable frequency divider for determining the loop frequency of a phase locked loop tuning system.

A display 40 is responsive to binary signals generated by microcomputer 34 and suitably amplified by drivers, generally designated as 38, to selectively display the channel number of a selected channel or the present time during the normal mode. For this purpose, display 40 includes four seven-segment arrays, as indicated in FIG. 4, for normally displaying the decimal digits between 0–9 and an asterisk (*) symbol to indicate whether the present time is AM or PM. Display 40 is also responsive to binary signals generated by microcomputer 34 to display information stored or to be stored in RAM 130 during the clock setting, programming, editing and deleting modes. In addition, during these modes, display 40 is reponsive to binary signals generated by microcomputer 34 to display prompt symbols, typically including at least one letter, as indicated in FIGS. 4a–4k, to suggest the next operation to be performed by a user.

A low pass filter 42 is responsive to a pulse signal generated by microcomputer 34 during the normal mode to generate a DC control signal for controlling the volume level. Specifically, the DC control signal controls the gain of volume control unit 22 and thereby controls the volume level.

In order to minimize the apparatus for controlling the receiver during the various modes of operation described above, keyboard 32 is the exclusive means by which the receiver is turned on and off, channel selections are made and the volume level is changed and, in addition, is the exclusive means by which the other user controlled modes of operation, i.e., the clock setting, programming, editing and deleting modes of operation are initiated and by which information pertaining to these modes is entered. Before proceeding to a detailed description of the structure by which this is made possible, it will be helpful to describe the various modes from a user's point of view. To facilitate an understanding of the following description, reference to FIGS. 2, 4 and 4a–4k should be made.

When plug 26 is first plugged in, display 40 will display —:— (FIG. 4a) indicating to a user that the clock must be set. The clock setting operation is explained below. To turn the receiver on, the user selects a predetermined channel number within a range of legal channel numbers, e.g., in the United States any of the channel numbers between 2 and 83 corresponding to the broadcast carriers designated by the FCC (Federal Communications Commission). Specifically, the user first hits the digit key corresponding to the tens digit of the channel number and then hits the digit key corresponding to the units digit of the channel number. For example, to select channel 23, the user hits digit key 2 then digit key 3. In response, display 40 displays 23

Figure 4G:
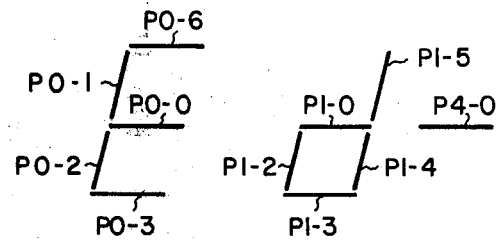
Figure 4H:
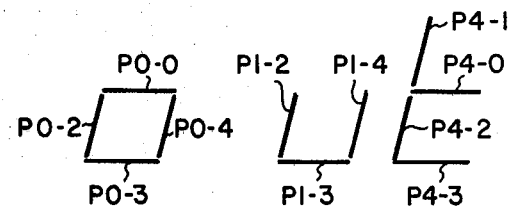
Figure 4I:
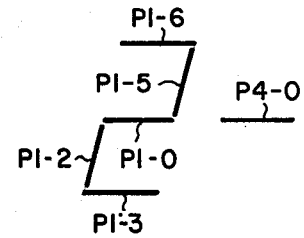
Figure 4J:
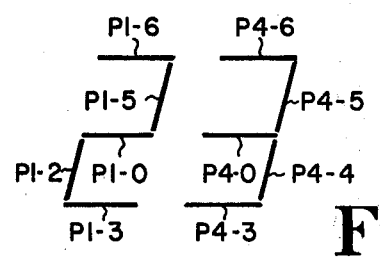
Figure 4K:
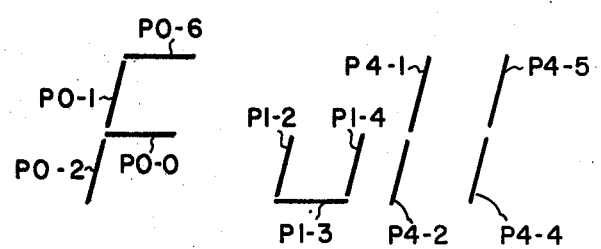

(FIG. 4j). It should be noted that for any channel number below 10, the user must first hit a 0 since the tens digit of these channel numbers is 0. Thus, for example, to select channel 9 the user hits digit key 0 and then digit key 9. If the user does not complete the channel number by only hitting a first digit key, the display will display the first digit followed by a dash (-), e.g., 2- (FIG. 4i). If the viewer selects an illegal channel number other than 00, e.g., 93, the receiver will not respond and the display remains as it was.

To turn the receiver off, the user selects illegal channel number 00. If the clock has been set, the display will display the present time (FIG. 4c). The asterisk in the upper right hand corner of the display indicates PM and its absence indicates AM. If the clock has not been set, the display will display —:— (FIG. 4a).

If the user wishes to see the present time when the receiver is on, he hits the 9 digit key. Since hitting digit key 9 without first hitting a digit key for a digit less than 8 corresponds to the selection of an illegal channel, the receiver will not respond except to display the present time. If the user wishes to again display the presently selected channel, he again hits digit key 9. It will be noted that the symbol T/C is printed next to the 9 digit key to identify its additional function of causing the exchange of the time and channel display.

When the receiver is on, the user may increase the volume by hitting the up (↑) key. To decrease the volume, the user hits the down (↓) key. The symbol VOL is printed next to the up and down keys to identify its volume changing function.

To initiate the clock setting, programming, editing or deleting modes, the user always starts by selecting the illegal channel number 00. This has two effects. First, it causes the tuner, signal processing and deflection portions of the receiver to be turned off. Since the keys have different functions in the clock setting, programming, editing and deleting modes than in the normal mode, turning the receiver off tends to reduce confusion to a user and reduces the possibility of entering erroneous information. In addition, since the modes in which information is entered or reviewed may be relatively time consuming (as will be seen later, as many as 22 selections may be scheduled for future viewing), turning the receiver proper off in these modes reduces energy consumption. Second, although the operation of a key always causes the same binary signals to be generated (as indicated in FIG. 3), it enables the keys of the keyboard to have a different function than they do in the normal mode described above. Since the keys have different functions in the different modes, information identifying the function of the keys of keyboard 32 in the clock setting, programming and editing modes are printed on the keyboard next to each key.

To set the clock after the user has turned off the receiver by hitting the 0 digit key twice in succession, he hits the volume up (↑) key which is also labelled START. In response, display 40 will display a dash (-) indicating that he may start to enter data. The user then hits 0 digit key which is identified by the letters CS (Clock Set) to initiate the clock setting mode. In response, display 40 displays CS—(FIG. 4b) verifying to the user that the receiver is indeed in the clock setting mode.

The user then hits the present day of the week (it is necessary to set the clock to the present day of the week for the scheduling feature) by hitting the appropriate digit key between 1 and 7. As is indicated in FIG. 2, each digit key between 1 and 7 is also labelled with a corresponding day of week. In response, the dash is replaced by the number in the display of the day of the week so that CSX, where X is the number of the day of the week, is displayed. If the viewer hits 0, 8 or 9 when CS— is displayed, the display will not change since there is no day of the week corresponding to the numbers 0, 8 or 9. Approximately 1 second after the display CSX, the display will automatically change to —:— (FIG. 4a). The user then sequentially hits the digit keys corresponding to the tens digit of the present hour, units digit of the present hour, tens digit of the present minute and units digit of the present minute. In response, the dashes of the —:— display are replaced in sequence by a respective digit.

When all of the dashes of the —:— have been replaced, the 4 digit number corresponding to the present time is displayed (FIG. 4c) and the asterisk (*) in the right hand corner of the display flashes prompting the user to select AM or PM. AM is selected by hitting the 3 digit key, which is also labelled AM, and PM is selected by hitting the 6 digit key, which is also labelled PM. If AM has been selected, the asterisk extinguishes and if PM has been selected, the asterisk remains displayed. To enter the present time information in RAM 130, the user now hits volume down (↓), which is also labelled END. To veryify that the present day and time of day information has been entered, the display is briefly extinguished and then returns. Since the clock setting procedure may take a few seconds, it may be advisable to set the present time slightly ahead and hit the END key when that time occurs.

Certain precautions in the clock setting operation have been provided for avoiding the entry of erroneous information. That is, no time can be entered which does not correspond to an actal time. For example, if the user hits any digit key other than the 0 or 1 digit key for the tens digit of the hour, no entry will be made and the display will correspondingly remain unchanged. Similarly, if the units digit of hours is selected to greater than 2 or the tens digit of minutes is selected to be greater than 6, no entry will be made and the display will not change.

To program the receiver to automatically tune to preselected channels at corresponding preselected future times during the scheduling mode, the user hits the 0 digit key twice in succession to turn off the receiver proper and then hits the volume up (↑) key. At this point a dash (—) is displayed as in the clock setting mode. To initiate the programming mode, the user then hits any digit key between 1 and 8 corresponding to the future day he wishes to schedule the receiver. It is noted that in addition to the 1 through 7 digit keys being identified by corresponding days of the week, the 8 digit key is identified by the symbol M-F. This is to allow a user to schedule the receiver so that it will be automatically tuned to preselected channels at the same preselected future times of day each weekday, i.e., a day between Monday and Friday. This is desirable since many daytime programs occur at the same time of day each day. It is noted that this feature purposely only applies to weekdays and not to every day of the week. This is so because it is not usual, at least in the United States, that the same programs occur on Saturday and Sunday that occur on weekdays. As a result, if this feature were to apply to Saturday and Sunday as well as weekdays, the receiver would undesirably be turned on and tuned in at the weekday times and to the weekday channels although there was no corresponding weekday program.

After a digit key between 1 and 8 is hit, the display displays PrX (FIG. 4e), where "X" is the number of the day (including 8 for Monday through Friday). This prompt symbol indicates to a user that the receiver is in the programming mode and that day X is to be scheduled.

Approximately 1 second after PrX is displayed, —:— is displayed prompting the viewer to enter a time of day. As in the clock setting mode, as the user sequentially hits 4 digit keys, the digits of the time selected replace the dashes. However, in the programming mode, the minutes entered by a user are rounded off to the nearest hour or half hour. That is, if the minutes entry is less than one quarter of an hour, the time is rounded off to the hour. If the minutes entry is greater than three quarters of an hour, the previously entered hour is increased to the next hour. If the minutes entry is between one quarter of an hour and three quarters of an hour, the time is rounded off to the previously entered hour plus one half hour. This is so because most programs occur on the hour and half hour. The user then enters either AM or PM as in the clock setting mode.

Approximately 1 second after the complete time is displayed, —C is displayed (FIG. 4f). This prompts the viewer to sequentially hit two digit keys corresponding to the channel as during normal channel selection. When the user has hit the two digit keys corresponding to the channel number, XXC is displayed, where the X's represent the two digits. Approximately 1 second thereafter, the symbol Pr— is displayed thereby prompting the user to begin scheduling the next day as described above. At this point, he may schedule another selection for the same day or a selection for another day or Monday through Friday.

It is noted that selections may be programmed out of time sequence as to day and time of day and the user therefore need not worry about entering information in the proper time sequence. If the user attempts to schedule more selections than there is room for in RAM 130, the display will display the word "Full" (FIG. 4k) thereby informing him that he must delete an existing selection before entering any new ones. When the user has made all the selections he cares to, he hits the down key. At this point, the present time of day is again displayed.

It is also noted that the receiver may be simply programmed to turn off at predetermined times by selecting channel number 00 for that time during the programming mode. Similarly, the receiver may be programmed to turn on at preselected times by selecting any proper channel number for that time during the programming mode.

To place the receiver in the editing mode, the user sequentially hits the 0 digit key twice in succession to turn the receiver proper off, hits the up key as in the clock setting and programming modes, and then hits the 9 digit key which is also identified by the word EDIT. In response, Ed— (FIG. 4g) is displayed indicating to the user that the receiver is in the editing mode and prompting him to select the future day he wishes to review. The user selects the day by hitting the appropriate digit key 1–7 or Monday through Friday by hitting digit key 8. Thereafter, the first time at which a selection has been made will be displayed and after approximately 1 second the channel number of the channel selected at that time will be displayed as XXC, where the X's represent the channel number. If the user holds the digit key corresponding to the future day he is reviewing down after a future time is displayed, the channel selected for that future time will not be displayed until approximately 1.5 seconds after he releases the key. After the channel number for a future selection is displayed, the user may examine the next selection in that day by again hitting the digit key of that day. When all the selections in a particular day have been reviewed, Ed— is again displayed prompting the user to review another day by hitting the digit key corresponding to that day. If there are no selections for a particular day, when the user hits the digit key for that day, Ed— remains displayed. To terminate the editing mode, the viewer hits the down key. Thereafter, the time of day will again be displayed.

If a user wishes to delete a particular selection, he initiates the edit mode as described above, selects the day in which the selection is made by hitting the appropriate digit key and steps down, by sequentially hitting the digit key corresponding to the day he has selected, to either the time or channel number of the selection he wishes to delete. When the time or channel number is displayed, he hits the up key which is also labelled CE (Clear Entry). Thereafter, the word "out" (FIG. 4h) will be displayed and after approximately 1.5 seconds, the next selection in the day will be displayed.

Now that the functional operation of the receiver shown in FIG. 1 has been described from the user point of view, its structure can more readily be understood.

As earlier noted, control portion 100 of microcomputer 34 controls the processing of binary signals stored in RAM 130 and the transfer of these binary signals between RAM 130 and digital tuner 14, volume control unit 22, on/off switching unit 28, display 40 and keyboard 32 through input/output ports 140 under the control of a set of instructions stored in ROM 120. Control portion 100 of microcomputer 34 includes a main control logic unit 101, arithmetic and logic unit (ALU) 105, accumulator (ACC) 107, a power on clear unit 103 and an interrupt control unit 109. Main control logic unit 101 decodes binary signals representing an operation code of the instruction to be executed coupled to it through data bus 200 from ROM 120 and generates the necessary binary control signals to cause the appropriate portions of microcomputer 34 to perform the instruction. A power on clear unit 103 causes the binary signals representing the first instruction stored in ROM 120 to be coupled to main control logic unit 101 and causes various other portions of microcomputer 34 to be initialized for proper future operation when power is applied to microcomputer 34. ALU 105 receives binary control signals from main control logic unit 101 and performs the required arithmetic or logic operation. ACC 107 is the principal register of microcomputer 34 for the manipulation of data represented by binary signals. ACC 107 serves as one input of binary signals for ALU 105. The binary signals representing the result of an arithmetic or logical operation in ALU 105 are stored in ACC 107.

Interrupt unit 109 is responsive to external interrupt pulses to generate binary signals representing the address of a predetermined external interrupt memory location of ROM 120. Thus, in response to an external interrupt pulse, main control unit 101 causes instructions, beginning with the instructions stored in the predetermined external interrupt location, to be executed.

In the receiver shown in FIG. 1, the external interrupt pulse is derived from the 60 Hz line voltage by means of an amplifier 44. Since amplifier 44 is not coupled to power plug 26 through on/off switching unit 28, external interrupt pulses are coupled to external interrupt unit 109 even when the main portion of the receiver included in chassis 12 is off. Interrupt unit 109 is also responsive to internal interrupt pulses to generate binary signals representing the address of a predetermined internal interrupt memory location of ROM 120. Thus, in response to an internal interrupt pulse, main control unit 101 causes instructions, beginning with the instruction stored in the predetermined internal interrupt memory location, to be executed. The internal interrupt pulses are provided by a timer 111 which comprises a counter which is programmable in accordance with instructions stored in ROM 120 to divide the frequency of a clock signal, generated by a clock oscillator 113, by controllable factors. Clock oscillator 113 also provides the timing pulse utilized by various portions of microcomputer 34. The frequency of oscillation, e.g., 4 MHz, of clock oscillator 113 is determined by an externally connected timing network shown as a crystal 46.

ROM 120 includes a predetermined number, e.g., 2048, of memory locations or "bytes". Each memory location contains a predetermined number, e.g., 8, of memory cells or "bits". Each memory cell of a memory location permanently stores a binary signal. The binary signals stored in a memory location of ROM 120 represent in combination an instruction to be executed by microcomputer 34. The memory locations of ROM 120 each have an address represented by binary signals generated by a ROM address register (ROMAR) unit 121. A data counter (DC) 122, associated with ROMAR 121, causes binary signals representing successive addresses to be generated.

RAM 130 includes a predetermined number, e.g., 64, of memory locations or "bytes" each of which contains a predetermined number of memory cells or "bits", e.g., 8. Each memory cell of a memory location temporarily stores a binary signal. Since RAM 130 stores binary signals temporarily, it may be referred to as a "scratch pad" memory. Each memory location of RAM 130 has an address. Under the control of main control logic unit 101, an indirect scratch pad address register (ISAR) 131 generates binary signals representing the addresses of the memory locations of RAM 130.

The organization of RAM 130 is shown in FIG. 4. Each of the 64 bytes of RAM 130 is identified by the hexidecimal code for the corresponding binary signals representing its address. Each of the 20 bytes, H′00–H′13 (the symbol H′ meaning hexidecimal representation), are also identified by a functional name corresponding to the function for which it is primarily intended. The remaining 44 bytes, H′14 through H′3F, are utilized for the storage of information pertaining to future selections (i.e., future times and channel numbers of channels to be tuned at those future times) and are so identified. For purposes which will be made clear, each bit of the memory locations is identified with a number between 1 and 8, 8 being the most significant bit and 1 being the least significant bit.

RAM location DAT is primarily utilized to store binary signals representing, in hexidecimal format, the key which was last operated.

For channel selection operations, both in the normal and scheduling modes, RAM location CHAN is utilized to store the binary signals representing the channel number presently being tuned. Only 7 binary signals representing the channel number are stored in CHAN to match the 7 bit format utilized in the RAM locations H′14 through H′3F and RAM location TEM2 where bit 8 is utilized to represent information pertaining to whether a future time is on the hour or half hour. Specifically, if the channel number is between 2 and 79, the 3 least significant bits of the binary signals representing the tens digit of the channel number is BCD (Binary Coded Decimal) format are stored in bits 7-5 of CHAN and the 4 binary signals representing the units digit of the channel number in BCD format are stored in bits 4-1 of CHAN. If the channel number is greater than channel 80, 3 "1's" (111) are stored in bits 7-5 of CHAN and if the units digit of the channel number is 0, binary signals representing H′A (1010) are stored in bits 4-1 of CHAN; if the units digit of the channel number is 1, binary signals representing H′B (1011) are stored in bits 4-1 of CHAN; if the units digit of the channel number is equal to 2, binary signals representing H′C (1100) are stored in bits 4-1 of CHAN; and if the units digit of the channel number is equal to 3, binary signals representing H′D (1101) are stored in bits 4-1 of CHAN.

RAM location VCNT is utilized to store the binary signals, representing in straight binary format, the present volume level.

For the clock function, bits 8-6 of RAM location HR are utilized to store the binary signals, in straight binary format, representing a decimal digit between 1 and 7 corresponding to the present day. Bit 5 of HR is utilized to store a "0" if the tens digit of the present hour is 0 and a "1" if the tens digit of the present hour is 1. Bits 4-1 of HR are utilized to store the binary signals representing, in BCD format, the units digit of the present hour. Bits 7-1 of RAM location MIN are utilized to store the binary signals representing, in straight binary format, the number of minutes elapsed since the last full half hour. Bit 8 of MIN is set equal to "0" on the hour and to "1" on the half hour. RAM location SEC is utilized to store binary signals representing, in straight binary format, the present number of seconds from the last minute. RAM location HZR is utilized to store the binary signals representing, in straight binary format, the number of cycles of 60 Hz line voltage which have occurred since the last second.

During the clock setting mode, binary signals representing the present day, hour and minute are temporarily stored in RAM locations TEM1 and TEM2 and rearranged to fit the format for the present day, hour and minute utilized in RAM locations HR and MIN before they are stored in HR and MIN.

During the programming mode when a selection is made, binary signals representing the future day and hour information are stored in RAM location TEM1 in the same format utilized in RAM location HR. Since the 8 digit key is the key associated with Monday through Friday selections and there are only 3 bits of TEM1 allocated for the storage of day information permitting only binary signals representing, in straight binary format, the digits between 0 and 7 to be stored, the selection of M-F causes binary signals representing, in straight binary format, the digit 0 to be stored in bits 8-6 of TEM1. If the future time is on the hour, a "0" is stored in bit 8 of TEM2 and if the selection is on the half hour a "1" is stored in bit 8 of TEM2. In addition, binary signals representing the channel number are stored in bits 7-1 of TEM2 in the same format utilized in RAM location CHAN.

When a selection has been completed in the programming mode, the binary signals stored in TEM1 and TEM2 are transferred, in the same format, to a pair of the last 44 locations of RAM 130.

The selections are entered in RAM locations H'14 through H'3F in increasing order of day and time of day, respectively. As a result, M-F selections (encoded as day 0) will be stored at the top of the selection list. So that individual day selections are given priority over M-F selections, during the scheduler mode, the selection list is searched from the bottom of the list to the top, i.e., from H'3F H'14, to locate a match between a present day and time of day and a future day and time of day.

RAM locations TT1M and TTIM (START) are utilized to store binary signals representing, in hexidecimal format, the predetermined times allowed for displaying a prompt symbol during the clock setting, programming, editing or deleting modes or for performing certain operations, such as waiting for a keyboard entry to be "debounced", i.e., become stabilized.

RAM location KB is utilized to store binary signals representing information pertaining to whether a key of keyboard 32 has been depressed and code indicating whether or not keyboard entries may be immediately acted upon. Bit 8 of KB, designated KD, is set to a "1" when a key is depressed. KD is set to a "0" when the key is released. Bits 3-1 of KB, designated CODE, store binary signals representing, in straight binary format, the decimal number 0 when a keyboard entry can be immediately acted on, the decimal number 2 when a keyboard entry cannot be immediately acted on because a debounce operation is taking place and cannot be interrupted by a new keyboard entry, or the decimal number 3 when a keyboard entry cannot be immediately acted on because a channel changing operation is taking place and cannot be interrupted by a new keyboard entry.

In RAM location FLAG, each of the 8 bits is utilized to store a binary signal indicating whether or not a certain event in the operation of the receiver has occurred. The following is a table identifying the occurrences which cause bits of FLAG to be set to a binary "1".

| BIT OF FLAG | OCCURRENCE |
| --- | --- |
| CBS | The clock has been set. |
| CHDS | A channel is being displayed. |
| ESS | The time of a future selection is being displayed during the edit mode. |
| EDT | The receiver is in the edit mode. |
| CS | The receiver is in the clock setting mode. |
| PR | The receiver is in the programming mode. |
| UP | The clock setting, programming, editing or deleting mode have been initiated by hitting the up key. |
| EOS | The clock setting mode has been completed. |

RAM locations JUMPH (also designated KU), JUMPL (also designated KL), DCU (also designated QU), DCL (also designated QL) are utilized to store binary signals representing the addresses of certain locations of ROM 120 during the clock setting and programming modes to indicate which instruction should be executed next. RAM location NEXT is utilized to store binary signals representing certain hexidecimal codes during the clock setting and programming modes to indicate which prompt symbol should be displayed next.

RAM locations TMP0 and TMP1 are utilized to temporarily store binary signals while they are rearranged to fit the format utilized in other RAM locations in which they are eventually to be stored.

Binary signals stored in RAM 130 and ACC 107 as a result of an arithmetic or logical operation controlled by ALU 105 are coupled to various portions of the receiver outside microcomputer 34 through bidirectional input/output ports 0, 1, 4 and 5, generally designated as 140. Each port has 8 terminals designated 0 through 7.

Each one of the 24 terminals of ports 0, 1 and 4 and terminal 7 of port 5, i.e., P5-7, is coupled to a respective element of display 40 as indicated in FIG. 4. Each element of display 40 is illuminated when a binary "1" is caused to be developed at a respective terminal of ports 0, 1, 4 or 5.

Terminals P4-0 are also coupled to channel number register 36 to couple binary signals representing, in BCD format, the tens and units digit of the channel number of a channel to be tuned, in sequence, to channel number register 36. Terminal P5-5 is coupled to channel number register 36 to couple a channel number strobe pulse to channel number register 36 to cause binary signals representing each digit of the channel number of the channel to be tuned to be entered in channel number register 36.

Terminal P5-5 is also coupled to on/off switching unit 28. On/off switching unit 28 includes a switching device and a low pass filter for generating a control signal for the switching device selected so that the conduction of the switching device is only changed in response to signals having relatively long durations and are not affected by the relatively short duration channel number strobe pulse. When the receiver is to be turned off, a "0" is caused to be developed at P5-5 and when the receiver is to be turned on, "1" is caused to be developed at P5-5.

The five binary signals generated by keyboard 32 are coupled to terminal P5-0 through P5-4. Binary signals coupled to terminals P5-0 through P5-3 from keyboard 32 represent, in the manner indicated in FIG. 3, the specific key operated. The binary signal coupled to terminal P5-4 from keyboard 32 is a keyboard strobe signal generated when any key of keyboard 32 has caused the generation of all the binary signals necessary to identify it.

Terminal P5-6 is coupled to filter 42. A pulse signal is caused to be developed at P5-6, the duration of which determines the level of the DC control signal developed by low pass filter 42 to control the volume level.

Operating voltage, VCC, for microcomputer 34 is derived by a control power supply unit 48. The 60 Hz input voltage to power supply unit 48 is not coupled to plug 26 through on/off switch 28 so that as long as line plug 26 is plugged in, operating voltage is supplied to microcomputer 34. The reset signal for power on clear unit 103 is generated by power supply unit 48 when VCC reaches a predetermined threshold. Operating voltage for drivers 38 and display 40 is also generated by control power supply unit 48 so that display 40 may be utilized to display the time during the normal mode and the various prompt symbols and data to be entered or already entered, during the clock setting, programming and editing modes when the receiver is off.

The following is a list indicating specific implementations of various portions of the receiver shown.

| | |
|---|---|
| Chassis 12 including digital tuner 14, channel number register 36, and volume control unit 22 and keyboard 32 | CTC-91 color television chassis manufactured by RCA Corporation and described in "RCA Television Service Data for the CTC-91 Series", File 1978 C-3 published by RCA Corporation, Indianapolis, Indiana 46201. |
| Digital tuner 14 | See also U.S. Patent 4,031,549. |
| Keyboard 32 | See also U.S. Patent 4,084,071. |
| Microcomputer 34 | MK3870 microcomputer manufactured by Mostek Corporation and described in "Mostek Single Chip Microcomputer MK3870" data book, published by Mostek Corporation, Carrolton, Texas. |
| Drivers 38 | SN7406 Integrated circuit manufactured by Signetics Corporation described in "Signetics Digital, Linear, MOS Data Book", 1974, published by Signetics Corporation. |
| Display 40 | 4-LT-32 fluorescent display manufactured by Futaba Corporation and described in a data book having number TD-1008C published by Futaba Corporation, Japan. |

The documents identified above are each hereby incorporated by reference.

With reference now to the flow charts shown in FIGS. 6-29, the manner in which binary signals are transferred between various memory locations of RAM 130 and on/off switching unit 28, keyboard 32, channel number register 36, display 40 and filter 42 to control the receiver during its various modes in accordance with instructions stored in ROM 120 will now be explained.

The following will facilitate an understanding of the flow charts shown in FIGS. 6-29.

| | |
|---|---|
| Oval | the start of a particular operational sequence |
| Rectangle | an instruction or set of instructions |
| Rectangle surrounding X=Y | the binary signals stored in Y are transferred to X |
| Diamond | a decision |
| Diamond surrounding X=Y, X>Y, or X<Y | a comparison of the binary signals representing X and Y to determine if X is equal to Y, X is greater than Y, or X is less than Y, respectively |
| H' | hexidecimal code |
| "1" and "0" | binary 1 and binary 0 |
| [X] | contents of RAM location X |
| X(Y) | the X portion of the Y memory location or register |

Figure 6:
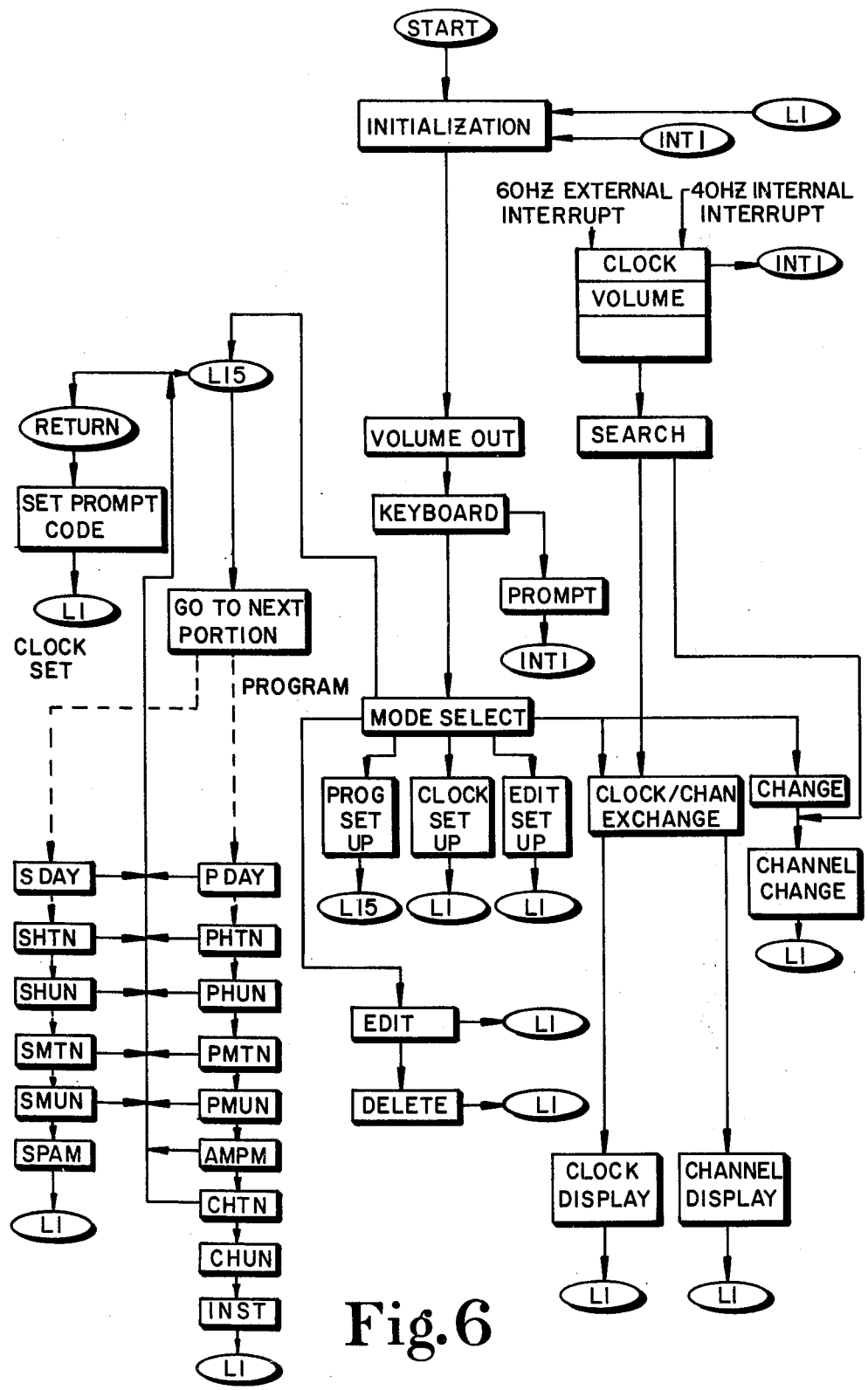
FIG. 6 is a simplified flow chart indicating the relationship of the various detailed flow charts of FIGS. 7–29.
Figure 7:
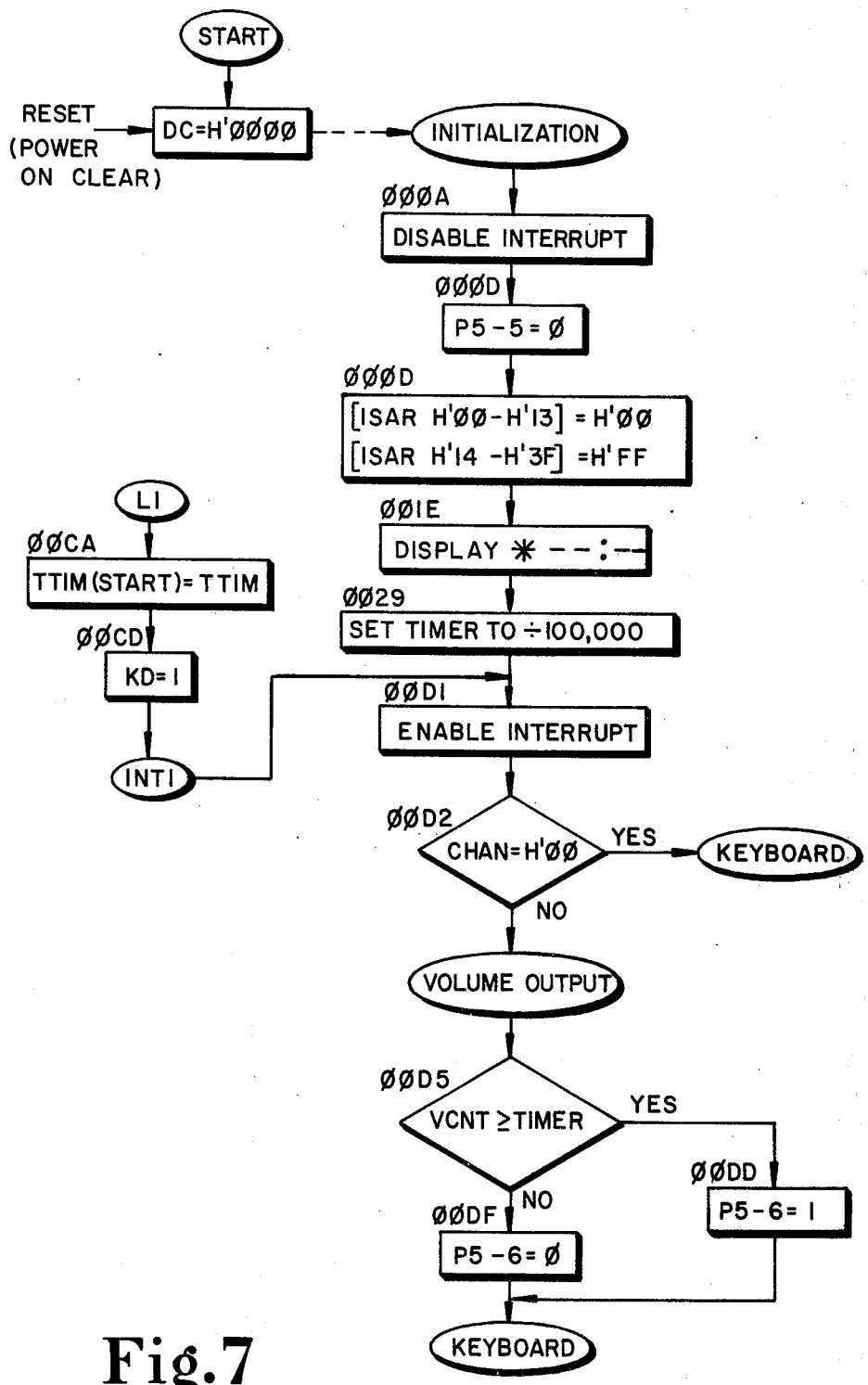
Figure 8:
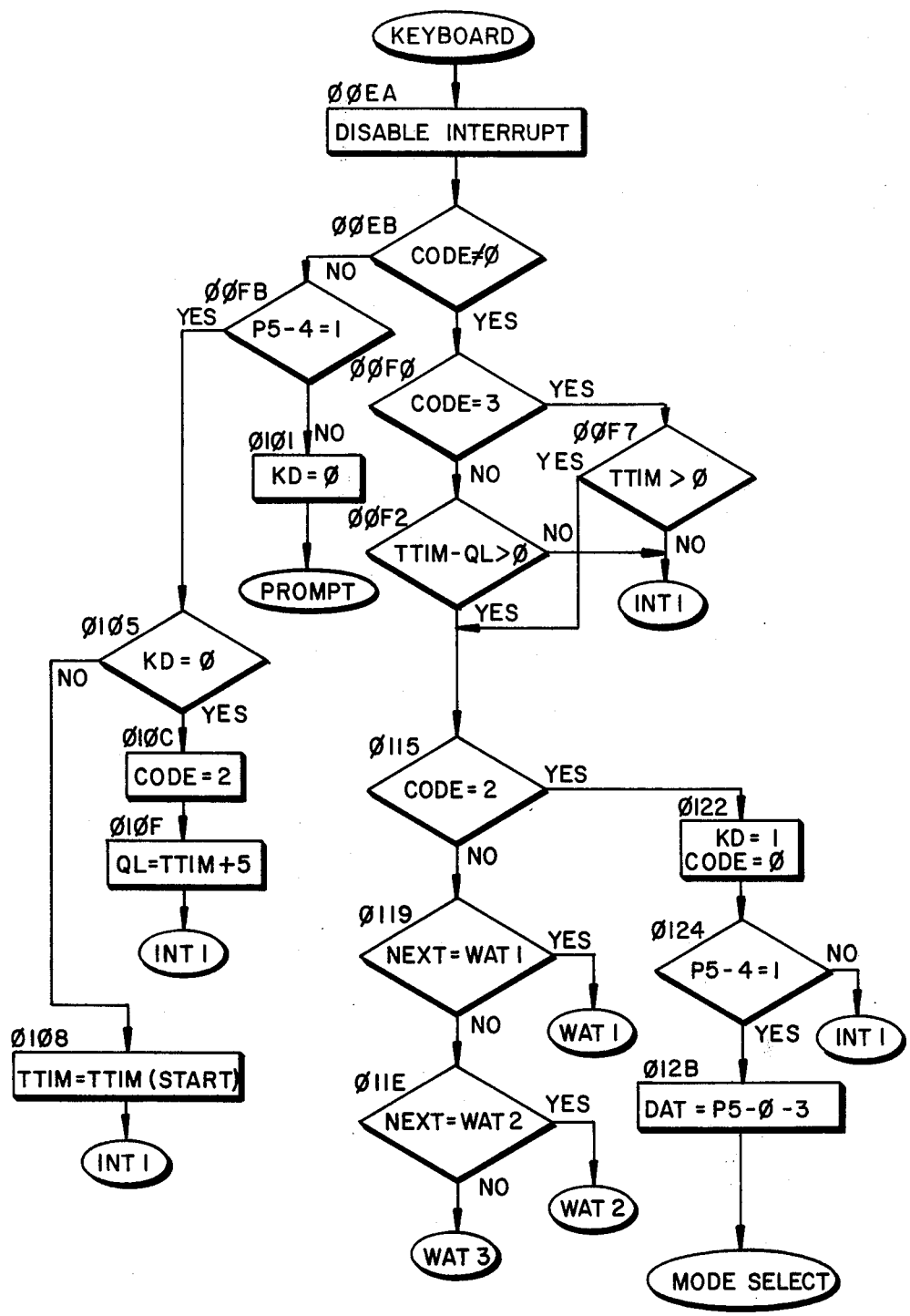

FIG. 6 indicates the relationship between the various flow charts shown in FIGS. 7-29. The description of each flow chart shown in FIGS. 7-29 is separately identified. In addition, a listing is included in the Appendix which indicates the instructions stored in ROM 120 for each portion of the flow charts when the present "scheduler" is implemented utilizing a Mostek 3870 microcomputer. The individual instructions are explained in the aforementioned "Mostek Single Chip Microcomputer MK3870" data book. Furthermore, each part of the flow charts shown in FIGS. 7-29 is identified by a hexidecimal number which corresponds to the first instruction in the listing for accomplishing that portion of the flow chart. The hexidecimal number identifed on the flow chart appears in the first column of the listing. INITIALIZATION As indicated in FIG. 7, after plug 26 is plugged in, a power on clear reset signal causes DC register 122 to be set to the address (H'0000) of the location of ROM 120 containing the first instruction. Thereafter, locations of RAM 130 and other portions of microcomputer 34 are initialized to known conditions (000A, 000D). In addition, the receiver proper is turned off (000B), display 40 is caused to display *—:— (001E) to indicate that the clock has not been set, timer 111 is set to divide the frequency of the clock signal by 100,000 (0029) so that the internal interrupt signal has a frequency of 40 Hz for the purpose of the CLOCK sequence to be described below. KEYBOARD In essence, the KEYBOARD sequence determines whether the operation of a key of keyboard 32 should be responded to or whether it should not be responded to because some other operation requiring a predetermined time before completion is occurring. At the start of the KEYBOARD sequence (00EA), interrupt unit 109 is disabled from responding to an external or internal interrupt pulse so that the contents of RAM location TTIM, which are normally changed during a CLOCK sequence, are not changed while certain evaluations are made. Thereafter, an evaluation (00EB) is made to determine whether or not the binary signals stored in the CODE portion of RAM register FLAG represent 0, indicating that the present operation may be interrupted in response to a keyboard entry.

If the binary signals stored in CODE do represent 0, the keyboard entry will be responded to and line P5-4 is examined (00FB) to determine if a keyboard strobe signal has been generated. If a keyboard strobe signal has not been generated, bit KD of KEYBOARD is set equal to a "0" (0101) to indicate that no key has been hit, and a PROMPT sequence is initiated to determine which, if any, prompt symbol should be displayed. If a keyboard strobe signal has been generated, the KD bit of RAM location KB is examined (0105) to determine if the key is still depressed (KD=1) or if it has been released (KD=0). If the key has been released, binary signals representing a time, e.g., 30 milliseconds, required for a keyboard entry to stabilize, i.e., be "debounced", are stored in RAM location QL and binary signals representing 2, i.e., the code for the debouncing operation, are stored in CODE (010C and 010F). If the key has not yet been released, since the time delays for prompt symbols do not start until a key is released, the time for prompt symbols is extended (0108). It is noted that since during the debouncing operation the contents of RAM location TTIM may be being updated for the purpose of keeping track of the time remaining for displaying a prompt display, RAM location QL is utilized in conjunction with TTIM to control the time delay for the debouncing operation.

If the binary signals in CODE do not represent 0, it indicates that either the keyboard entry is being debounced or the channel is being changed. In either case, no other keyboard entries will be responded to until the time for these routines, as represented by the binary signals stored in RAM locations TTIM or QL, has expired. Therefore, evaluations are made (00F0, 00F2, 00F7) to determine if the times required for the debouncing or channel changing operation have expired. If neither time has expired, aroutine INT1 (to be described below) is initiated to await the expiration of the required time. If the times required for both operations have expired and the binary signals in CODE represent a 2 (0115), indicating that the debounce operation had been initiated, the KD and CODE bits of RAM location KEYBOARD are set up for the next keyboard entry (0122), a final check is made to determine if the keyboard strobe signal has been generated, i.e., whether P5-4 is at a "1" (0124), and the binary signals representing the specific key hit are stored in RAM location DAT (012B) so that they may be examined to determine the mode of operation during a MODE SELECT sequence. If the time has expired and binary signals in CODE represent 3, indicating that a channel change is being made, the proper portion of a CHANNEL CHANGE sequence is initiated (0119 and 011E).

L1 AND INT1

The L1 and INT1 sequences, indicated in FIG. 7, are initiated during various other sequences and in turn cause the KEYBOARD sequence to be initiated. Thus, the keyboard is repeatedly examined to determine if there has been an entry. During the L1 sequence, the binary signals representing the predetermined time delay allowed for a prompt symbol to be displayed, a keyboard entry to stabilize or a portion of the CHANNEL CHANGE sequence to be performed, initially stored in TTIM, are transferred to TTIM (START) (00CA) so that the contents of TTIM (START) may be used to extend the time remaining for debouncing a keyboard entry if a user continues to hold down a key as previously described (with reference to step 0108 of the KEYBOARD sequence). In addition, in the L1 sequence of operation, the bit KD of RAM location KEYBOARD is also set to a "1" (00CD) to indicate that the operation associated with a key previously hit has not been completed. The L1 sequence of operation is followed by the INT1 sequence of operation in which interrupt enable unit 109 is enabled to respond to interrupt signals (00D1) and a determination is made whether the receiver proper is on or off (00D2) prior to initiating a VOLUME OUTPUT sequence.

MODE SELECT

Figure 9:
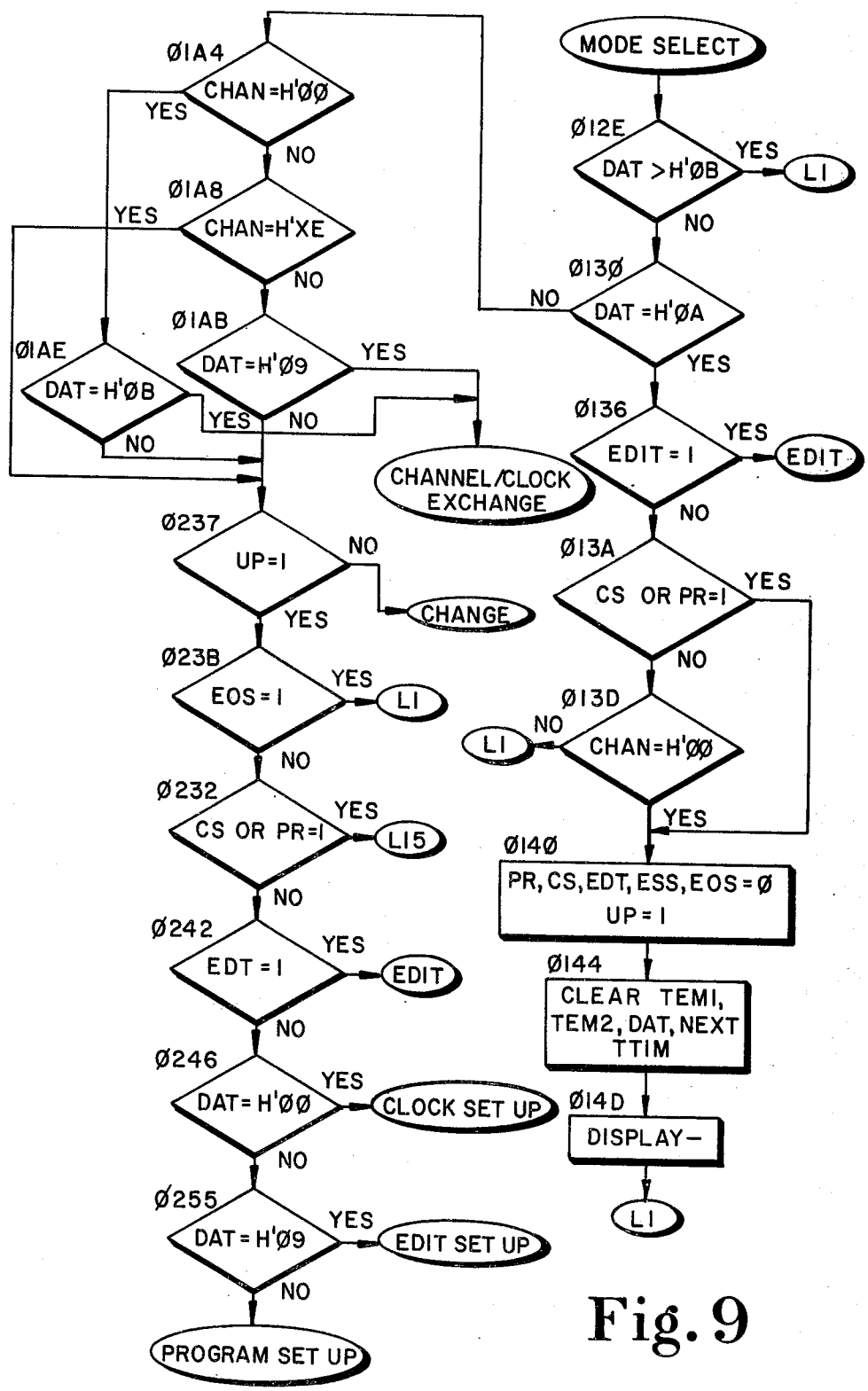

During the MODE SELECT sequence, indicated in FIG. 9, binary signals stored in DAT representing the operation of the various keys of keyboard 32 are examined to determine the operating mode of the receiver.

Initially, a determination is made whether the binary signals stored in DAT represent a hexidecimal number greater than H'φB (012E). This may occur when the user has improperly hit two keys simultaneously. If the user has hit two keys imultaneously, L1 is initiated to await a proper keyboard entry.

If the user has not depressed two keys simultaneously, the binary signals stored in DAT are examined to determine whether the up key has been hit (0130). If the up key has been hit, a determination is made whether the EDT bit of RAM location FLAG has been set to a "1" (0136). If EDT is set to a "1", it indicates that the editing mode has already been initiated and the user has hit the up key to delete a selection. Accordingly, an EDIT sequence is initiated which, in turn, results, in the initiation of a DELETE sequence. If the up key has been hit, but EDT is not set to "1" the binary signals stored in RAM location FLAG are examined to determine if the bits CS or PR have been set to "1" (0134). If CS or PR have been set to 37 1", it indicates that one of the clock setting or programming modes have already been started and the user has hit the up key again to change an incomplete entry before it is stored in RAM 130. If CS or PR have not been set to "1" and if the receiver is off (013D), it indicates that the user wishes to start either the clock setting, programming or editing modes. In either case, certain RAM locations are cleared and a dash is displayed (0144 and 014D) in preparation for the next keyboard entry. Thereafter the L1 sequence is initiated to await the next entry. The L1 sequence is also initiated if the up key was hit and the receiver was on (013D). In the latter case, the volume level will be caused to increase, but the mode of operation will not be changed.

If the binary signals that were stored in DAT do not correspond to the up key, they must necessarily correspond to a digit key or the down key. A sequence of tests (0237, 0230, 0232, 0242, 0246, 0255) is performed to determine which of the clock setting, programming or editing modes have already been started or are to be started or whether the channel is to be changed if the receiver is off (01A4) and the user has not hit the down key (01AE); or if the receiver is on (01A4) and the user has thus far only made a "half entry", i.e., has thus far only hit a digit key corresponding to the tens digit of a channel number (01A8); or if the receiver is on (01A4) and the user has thus far not hit any digit key (01A8) and has not hit a digit key other than digit key 9 (01AB) to select a new channel. The UP, EOS, CS, PR and EDT bits of FLAG are examined to determine if the clock setting, programming or editing modes have already been started. The UP bit of FLAG is tested first. If UP has not been set to a "1", indicating that the user has not initiated the clock setting, programming or editing mode by hitting the up key when the receiver was off, a CHANGE routine is initiated as a preliminary to executing a channel change. Thereafter, the remaining ones of the EOS, CS, PR and EDT bits are then tested. The binary signals stored in DAT corresponding to the last key hit are then examined to determine if any one of the clock setting, programming or editing modes is to be initiated.

During the MODE SELECT sequence, if the receiver is off (01A4) and the down key has been hit (01AE), a CHANNEL/CLOCK EXCHANGE sequence is initiated to enter the present time information into RAM 130. If the receiver is on (01A4) and the user has in the past made a "full entry" of a channel number to select a channel (01A8) and the key he has hit is the 9 digit key, the CHANNEL/CLOCK EXCHANGE sequence is initiated to exchange the channel and time display.

CHANNEL/CLOCK EXCHANGE

Figure 10:
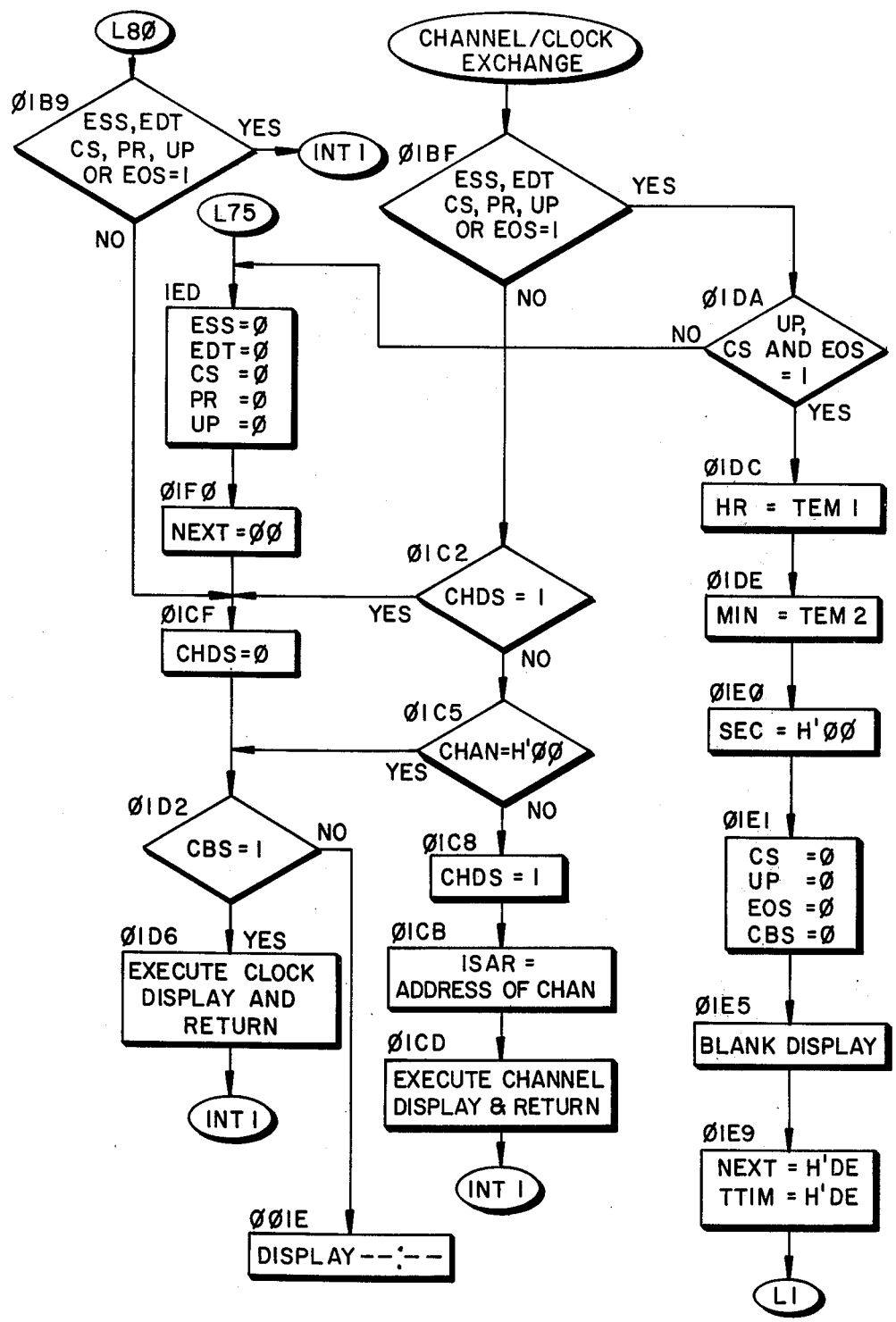

The CHANNEL/CLOCK EXCHANGE sequence, indicated in FIG. 10, has the primary function of controlling when the channel number of a presently tuned channel or the present time is displayed.

At the beginning of the sequence, the ESS, EDT, CS, PR, UP and EOS bits of FLAG are examined (01BF) to determine if one of the clock setting, programming or editing scheduling modes has been initiated. If one of these bits is a "1" and CS and EOS are not both set to "1" (01DA) indicating that the user has terminated one of the clock setting, programming or editing modes before completing the sequence by hitting the up key, the present time is displayed if the clock has been set, or *—:—is displayed if the clock has not been set (01ED, 01F0, 01CF, 01D2, 01D6, 001E). If one of the ESS, EDT, CS, PR, UP and EOS bits of FLAG is set to a "1" and both of CS and EOS are also set to a "1", indicating that the clock setting mode has been completed, binary signals representing the present time, temporarily stored in TEM1 and TEM2, are transferred to RAM locations HR and MIN, respectively, binary signals representing 0 seconds (H'00) are coupled to SEC, and various bits of FLAG are set, e.g., CBS is set to a "1", to indicate the present operating status (01DC, 01DE, 01E0, 01E1). Thereafter, the display is blanked (01E5) and binary signals representing H'DE are stored in RAM locations NEXT and TTIM so that in accordance with a PROMPT routine the present time will again be displayed after approximately 1 second.

If none of the bits ESS, EDT, CS, UP or EOS have been set to a "1", indicating that none of the clock setting, programming or editing modes have been initiated, a number of tests are performed to determine whether the channel is being displayed (01C2), the receiver is off (01C5) or whether the clock has been set (01D2) in order to display the present time if the receiver proper is off and the clock has been set, display *—:— if the receiver proper is off and the clock has not been set, or exchange the display if the set is on. Before a channel number is displayed by initiating a CHDS sequence to cause channel information to be displayed, the address of RAM location CHAN is stored in ISAR 131 (01CB). Similarly, before the present time information is displayed by initiating the CHDS sequence, the address of RAM location MIN is stored in ISAR 131 (01D6).

Figure 11:
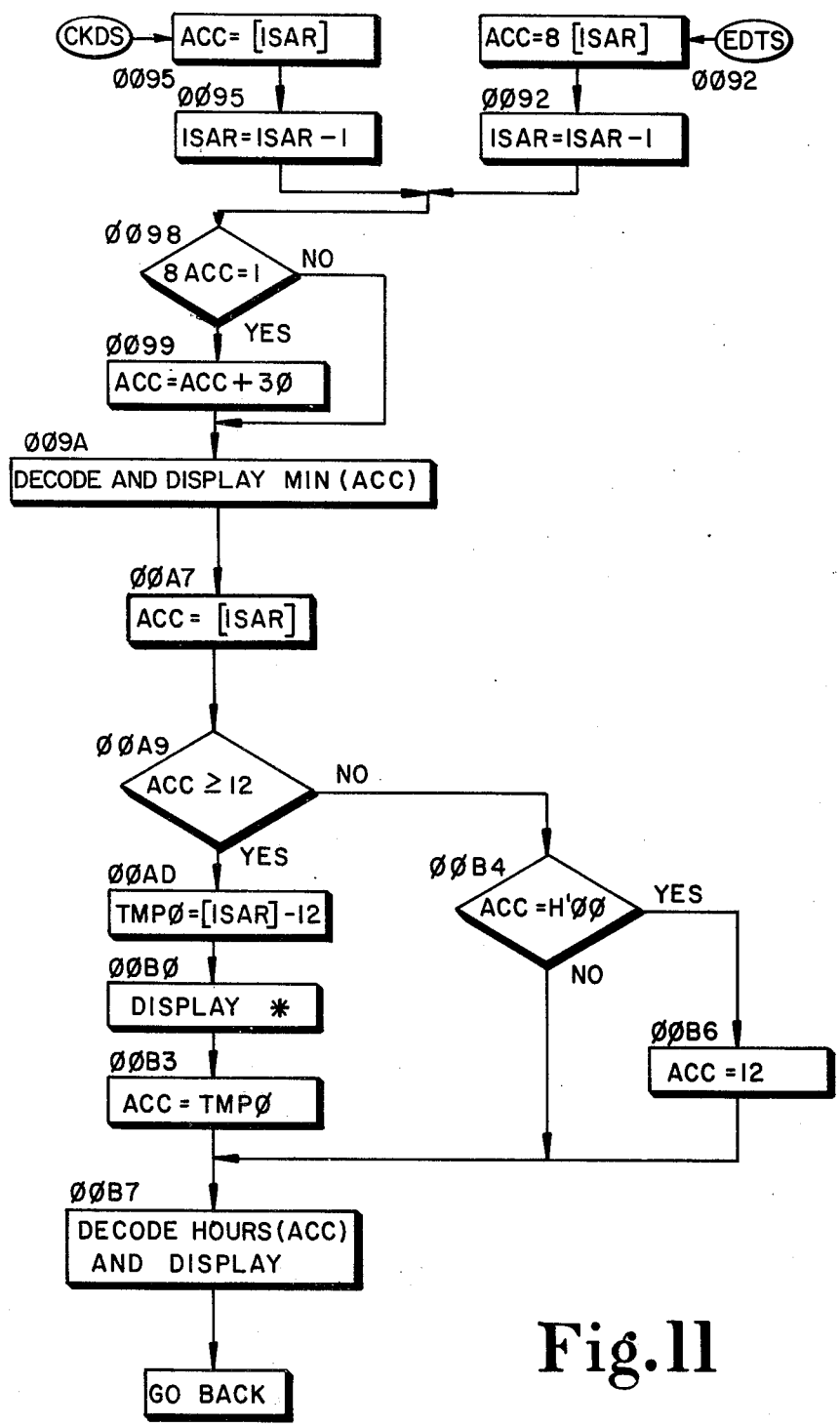
Figure 12:
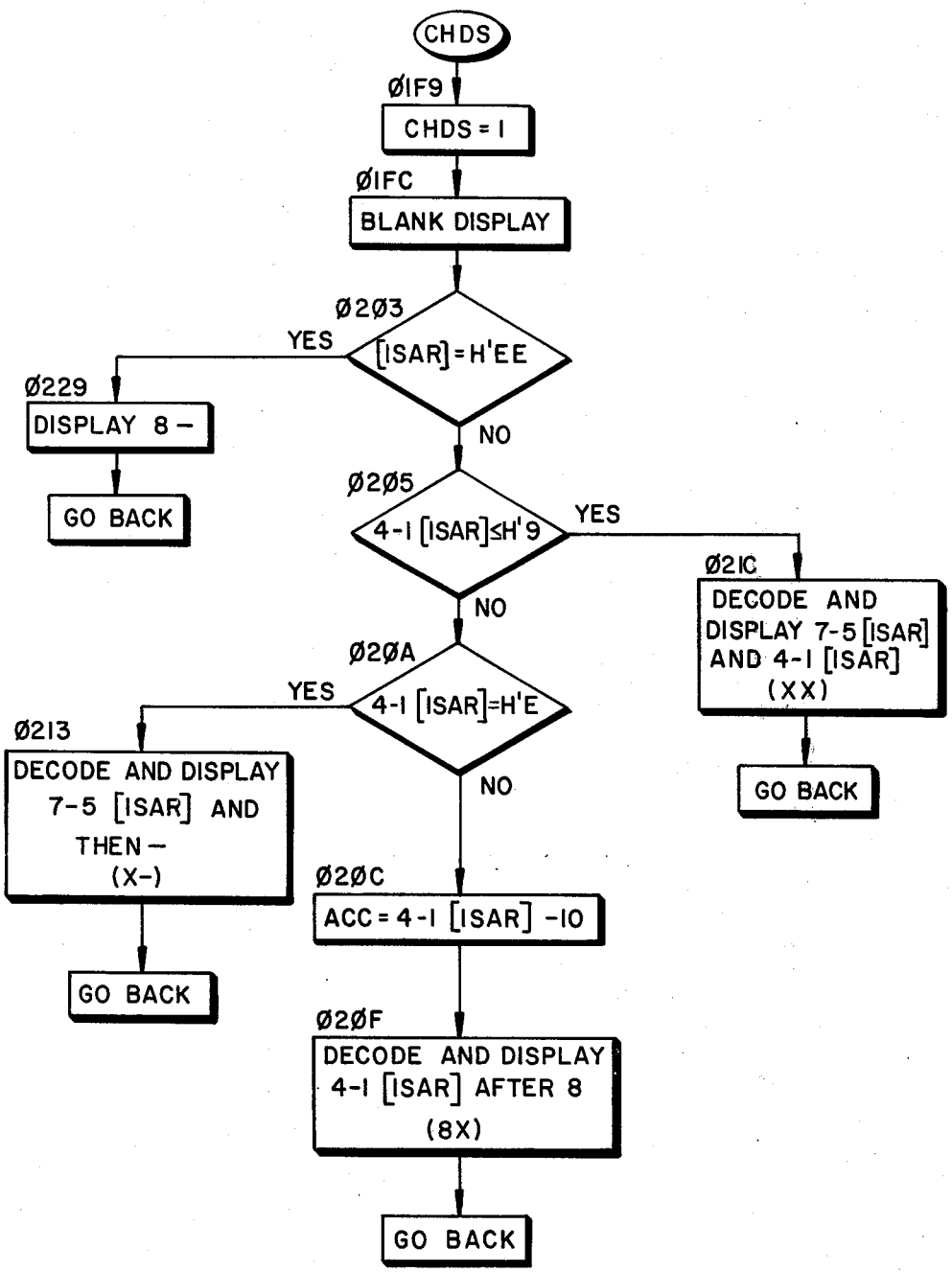

The CHANNEL/CLOCK EXCHANGE routine is also initiated at the end of a SEARCH routine through a sequence designated L80 to update the display of the present time. Here, before the clock is displayed, the contents of FLAG are examined (01B9) to determine if one of the clock setting, programming or editing modes have been initiated. If so, the INT1 routine is initiated to await the next keyboard entry. CKDS AND EDTS The CKDS and EDTS sequences for displaying the present time of day information in the normal mode are indicated in FIG. 11. The CKDS sequence is initiated during the CHANNEL/CLOCK EXCHANGE sequence. The EDTS sequence is initiated during an EDIT sequence of the editing mode in which the times and channel numbers of selections are reviewed. Prior to the termination of the CHANNEL/CLOCK EXCHANGE and EDIT sequences, the address of the RAM location containing minute information (MIN in the case of CHANNEL/CLOCK EXCHANGE and one of RAM locations H'14–H'3F containing ½ HR and channel information in the case of EDIT) is stored in ISAR 131. Thereafter, during CKDS and EDTS, the ½ HR bit of the then addressed RAM location is examined to decode and display the minutes information in decimal format (0092, 0095, 0098, 0099, 009A). During EDTS, since only ½ hour information is stored for selections (the remaining bits being utilized to store seven binary signals representing the associated channel number), only bit 8 of the then addressed RAM location is processed to display minutes of the selection. Thereafter, the contents of the next RAM location are examined to decode and display the hours information in a 12 hour decimal format (00A7, 00A9, 00AD, 00B0, 00B3, 00B4, 00B6, 00B7). CHDS The sequence CHDS, for displaying a channel number, is indicated in FIG. 12. This routine is initiated during several other routines. During these routines, before the CHDS routine is initiated, binary signals are stored in ISAR to indicate the RAM location containing the binary signals which are to be processed to decode the display the channel number. During a CHANGE and the CHANNEL/CLOCK EXCHANGE sequences, the contents of ISAR 131 are set equal to the address of CHAN. During EDIT and SEARCH sequences, the contents of ISAR 131 are set equal to the address of one of the RAM locations H'14 through H'3F containing channel number information then being processed.

At the beginning of the CHDS routine, the CHDS bit of FLAG is set to a "1" to indicate that the CHDS routine is in progress and the display is blanked or cleared of previous information (01F9, 01FC). Thereafter, "half entry" tests are conducted to determine if only the tens digit of the channel number has been entered (0203, 0205, 020A). If the contents of CHAN represent H'EE, it indicates that a "half entry" in which 8 is the tens digit has already been made. If the contents of CHAN represent H'XE, where X is any hexidecimal number, it indicates that any other "half entry" has already been made. If the entry is a "half entry" and the tens digit is an 8, 8— is displayed (0203, 0229). Otherwise, the tens digit is decoded and displayed (020A, 0213). If the entry was not a "half entry" the seven binary signals representing the two digits of the channel number in the previously described format are decoded and the two digits of the channel number are displayed (0205, 020C, 020F, 021C).

CHANGE

Figure 13:
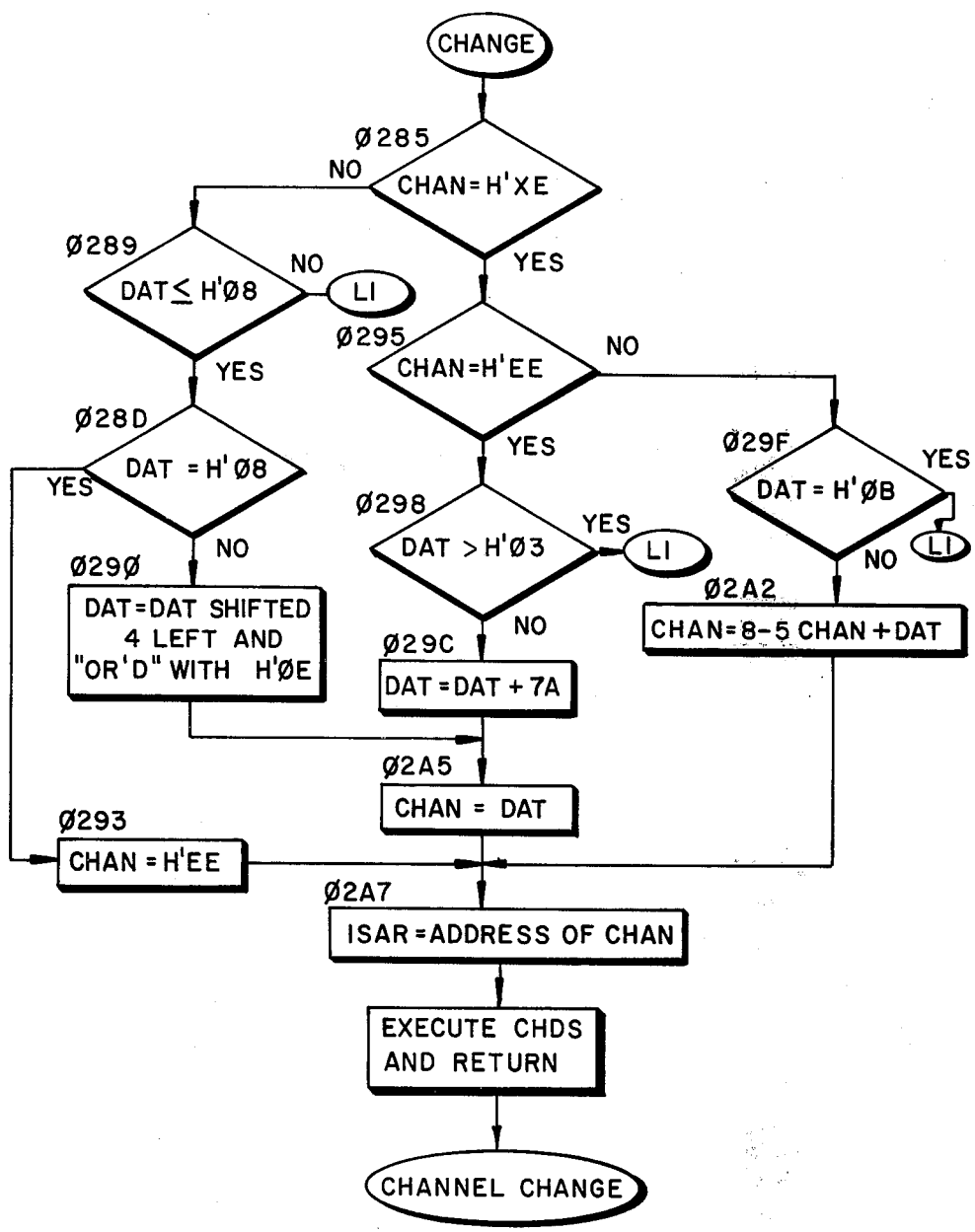

The function of the CHANGE sequence, indicated in FIG. 13, is to encode and transfer binary signals stored in DAT generated in response to the operation of digit keys of keyboard 32 to CHAN.

Since the digits of the channel number are sequentially entered, a "half entry" test is performed to determine whether the present number in CHAN is the tens or units digit of the channel number (0285). If the tens digit is being entered, it is encoded so as to indicate a "half entry" in which the tens digit is less than 8 (028D, 0290) or in which the tens digit is 8 (028D, 0293). If the first number being received is not less than or equal to 8, the L1 routine is initiated to wait for the entry of a proper digit (0289). If the units digit is being entered, the tens digit previously entered and the units digit now entered are encoded in the 7-bit format previously described and the results are stored in CHAN (0285, 0295, 0298, 029C, 029F, 02A2, 02A5). Finally, before a CHANNEL CHANGE routine is initiated to actually change the channel or turn off the receiver, the contents of ISAR are set equal to the address of CHAN so that the new channel number may be displayed during the CHDS sequence as previously described.

CHANNEL CHANGE

Figure 14:
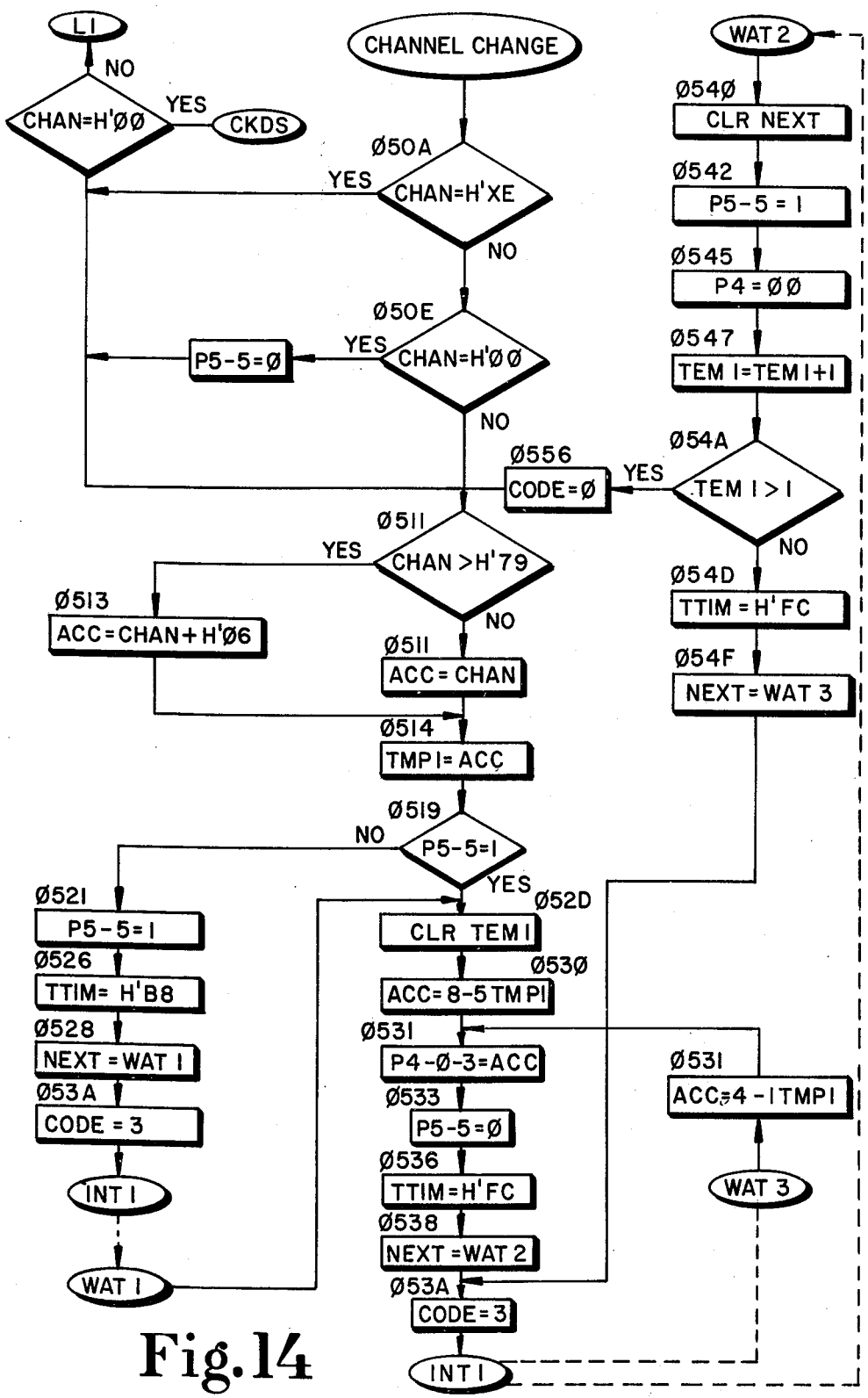

The CHCH sequence, indicated in FIG. 14, for changing a channel or turning the receiver on and off, is initiated when binary signals representing a new channel number, including 00 to turn off the receiver, are stored in CHAN during the CHANGE sequence in response to either a manual channel selection by means of keyboard 32 or in response to the location of a RAM location between H'14 and H'3F containing the same time information as the present time during a SEARCH sequence.

Initially, CHAN is examined to determine if only the tens digit of the channel number has been entered (050A) and, if so, L1 is initiated to await the entry of the units digit. Thereafter, if binary signals representing channel number 00 have been stored in CHAN (050E), the receiver is turned off by causing a "0" to be coupled through terminal P5-5 to on/off power switching unit 28 (0516). Thereafter, CKDS routine is initiated to display the present time (02AA).

If CHAN contains a binary signal representing a channel number other than 00, the 7 binary signals representing the channel number stored in CHAN are decoded to form 8 binary signals representing the channel number and the results are stored in TMP1 (0511, 0513, 0514). At this point, if the receiver is off (0519), the receiver is turned on by causing a "1" to be developed at terminal P5-5. Thereafter, a delay of 0.1 second is initiated by storing binary signals representing H'B8 in RAM location TTIM (0521, 0526, 0528, 053A). After the 0.1 second delay, the KEYBOARD sequence initiates a WAT1 sequence in which the binary signals stored in TMP1 representing the tens digit of the channel number are coupled through terminals P4-0 through P4-3 to channel number register 36 and then a WAT2 sequence in which a channel number strobe signal is coupled through terminal P5-5 to channel number register 36 after a 10 millisecond delay (0530, 0531, 0533, 0536, 0538, 0540, 0542) to enter binary signals representing the tens digit of the channel number in channel number register 36. Thereafter, the same two sequences are repeated to enter binary signals representing the units digit of the channel number. Since the same two sequences are utilized for each digit of the channel number, the contents of RAM location TEM1 are utilized to indicate whether the units digit of the channel number has already been entered in channel number register 36 (052D, 0547, 054A). Since port 4 is coupled to the left-most digit of display 40 as well as channel number register 36, after the channel number is entered in channel number register 36, binary signals P4-0-7 are all set equal to "0" (0545) to blank the left-most digit of display 40. After the units binary signals representing the units digit have been entered in channel number register 36, L1 is initiated to await the next operation.

CLOCK SET UP

Figure 15:
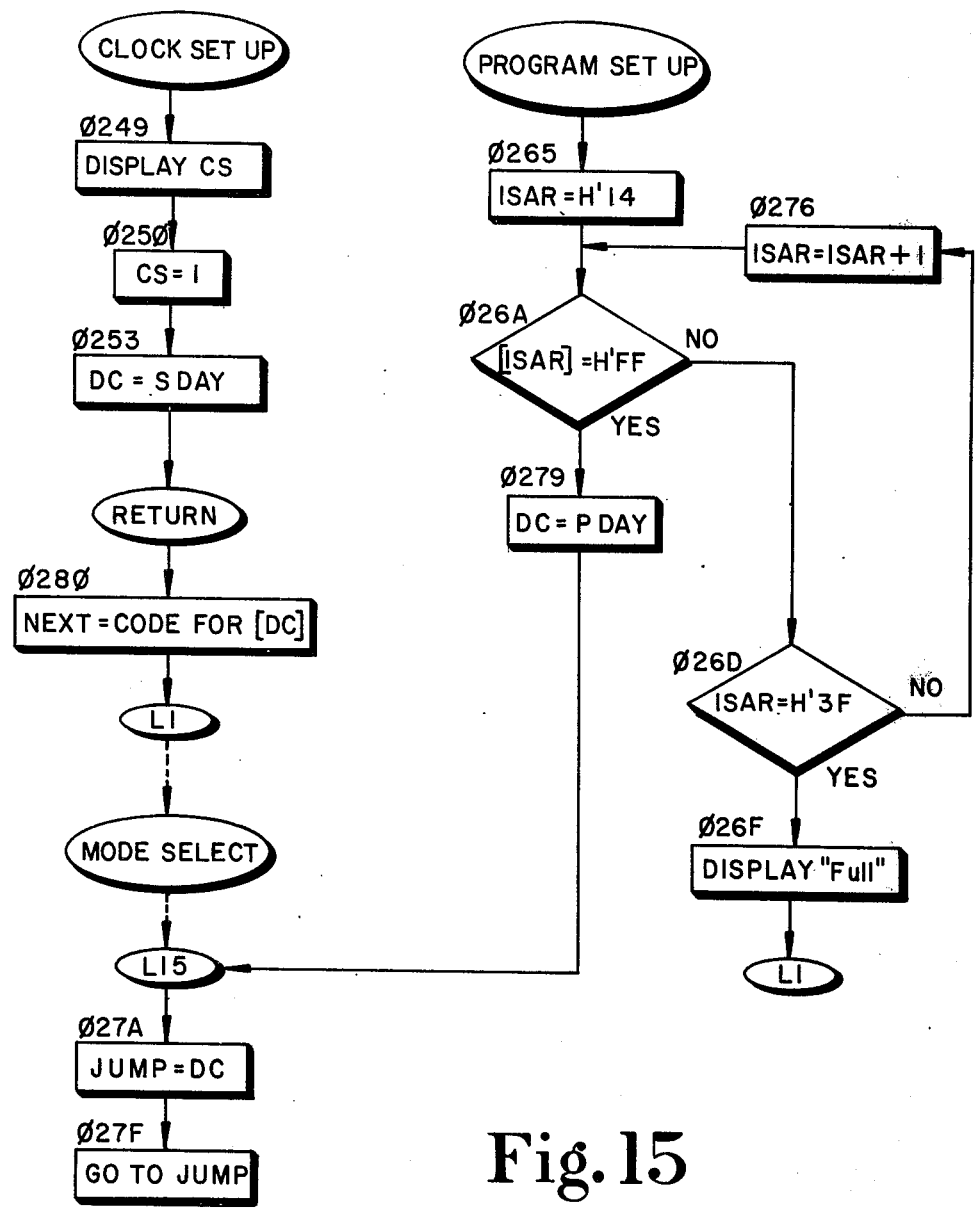

If the up key has been hit (0237) and then the 0 digit key is hit (0246), the MODE SELECT sequence initiates a CLOCK SET UP sequence, indicated in FIG. 15. The CLOCK SET UP sequence causes binary signals representing the prompt symbol CS to be coupled to display 40 through ports 0 and 1. Since the dash in the right-most position of display 40 has already been caused to be displayed during the MODE SELECT sequence (014D), the symbol CS— is formed. Thereafter, bit CS of FLAG is set to a "1" to indicate that the CLOCK SET UP mode has been initiated (0250) and binary signals representing the address of the first instruction in the first portion of the CLOCK SET UP sequence, SDAY, to be stored in DC 122 (0253). Thereafter, a RETURN sequence, also indicated in FIG. 15, is initiated to cause binary signals representing a code related to the address stored in DC 122 to be stored in RAM location NEXT (0280). The contents of RAM location NEXT are examined throughout the clock setting and programming modes during the PROMPT sequence in order to determine which prompt symbol, if any, is to be displayed. After the RETURN sequence, L1 is initiated. During the following MODE SELECT sequence, since CS is now set to a "1" (0232), a sequence L15, also indicated in FIG. 15, is initiated which causes the ROM location having its address stored in DC, e.g., in this case the address of the first instruction in the first portion of the CLOCK SET routine, SDAY, to be initiated (027A). Routine L15 is utilized in the same manner during the CLOCK SET and PROGRAM sequences to initiate the sequence for the various portions of these routines in order, e.g., to cause the units digit of the hour to be entered after the tens digit of the hour, to cause the tens digit of the minute to be entered after the units digit of the present hour, etc.

PROGRAM SET UP

If the up key has been hit (0237) and then any digit key is hit except the 9 digit key (0255), the MODE SELECT sequence initiates a PROGRAM SET UP sequence. Since the purpose of the programming mode is to enter information concerning future selections into a pair of RAM locations between H'14 and H'3F, the contents of each of the RAM locations H'14 through H'3F are compared to H'FF, H'FF representing an absence of stored information (026A, 026D, 0276). If there is no empty RAM location between H'14 and H'3F, the word "Full" is displayed (026F). Otherwise, binary signals representing the address of the ROM location containing the first instruction of the PROGRAM sequence, PDAY, are coupled to DC 122 (0279). Thereafter, by means of the L15 sequence, the various portions of PROGRAM are initiated in order. In addition, the RETURN sequence, in conjunction with the PROMPT sequence, causes the corresponding prompt symbols to be displayed.

CLOCK SET

Figure 16:
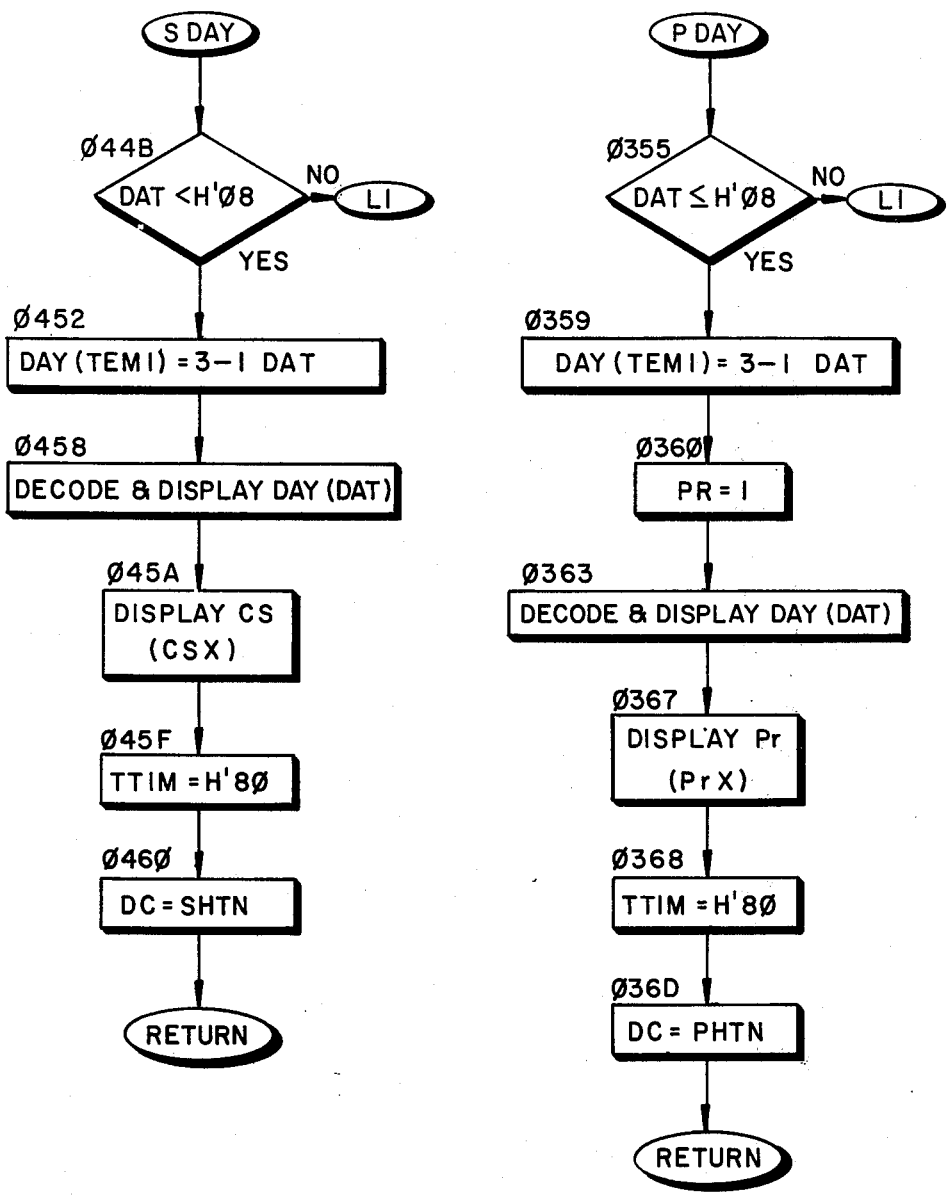
Figure 18:
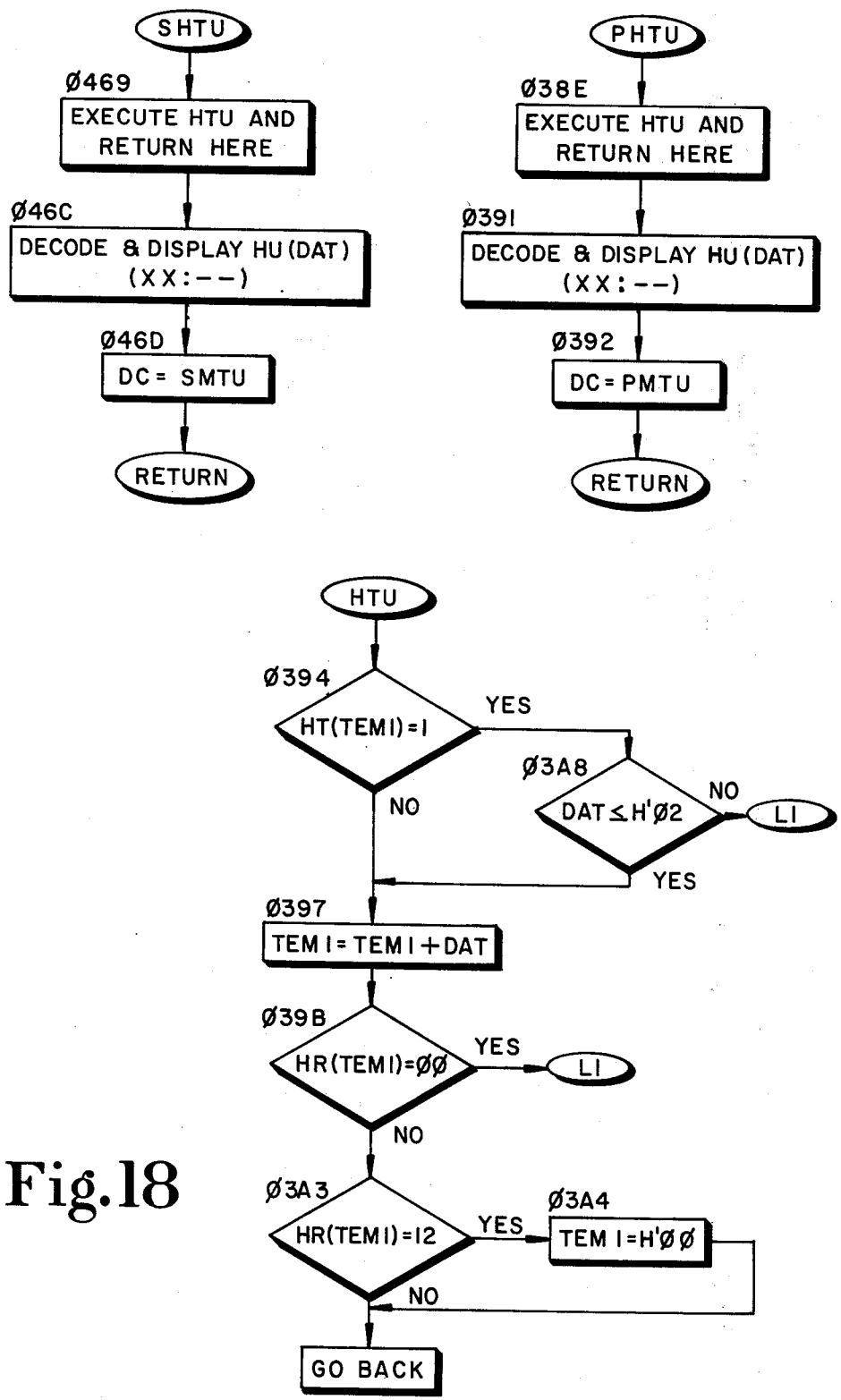
Figure 19:
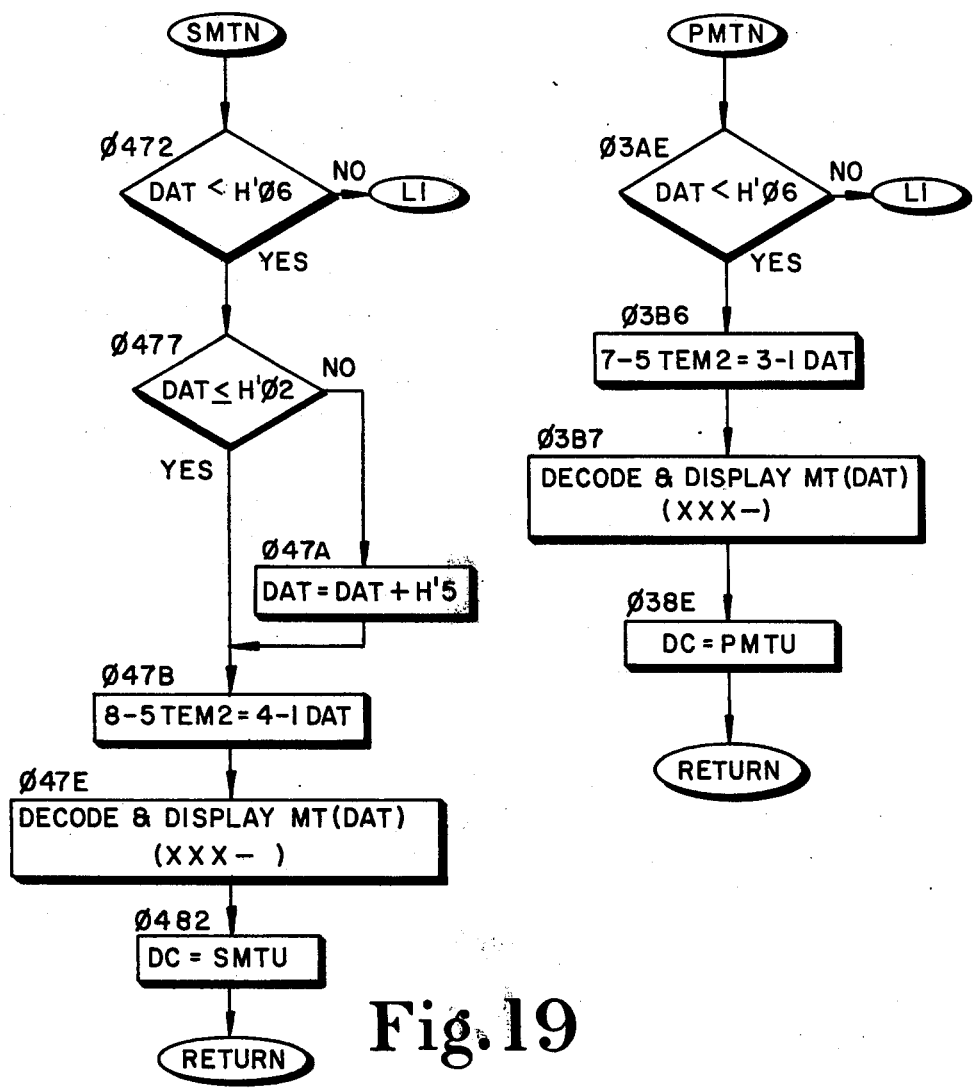
Figure 20:
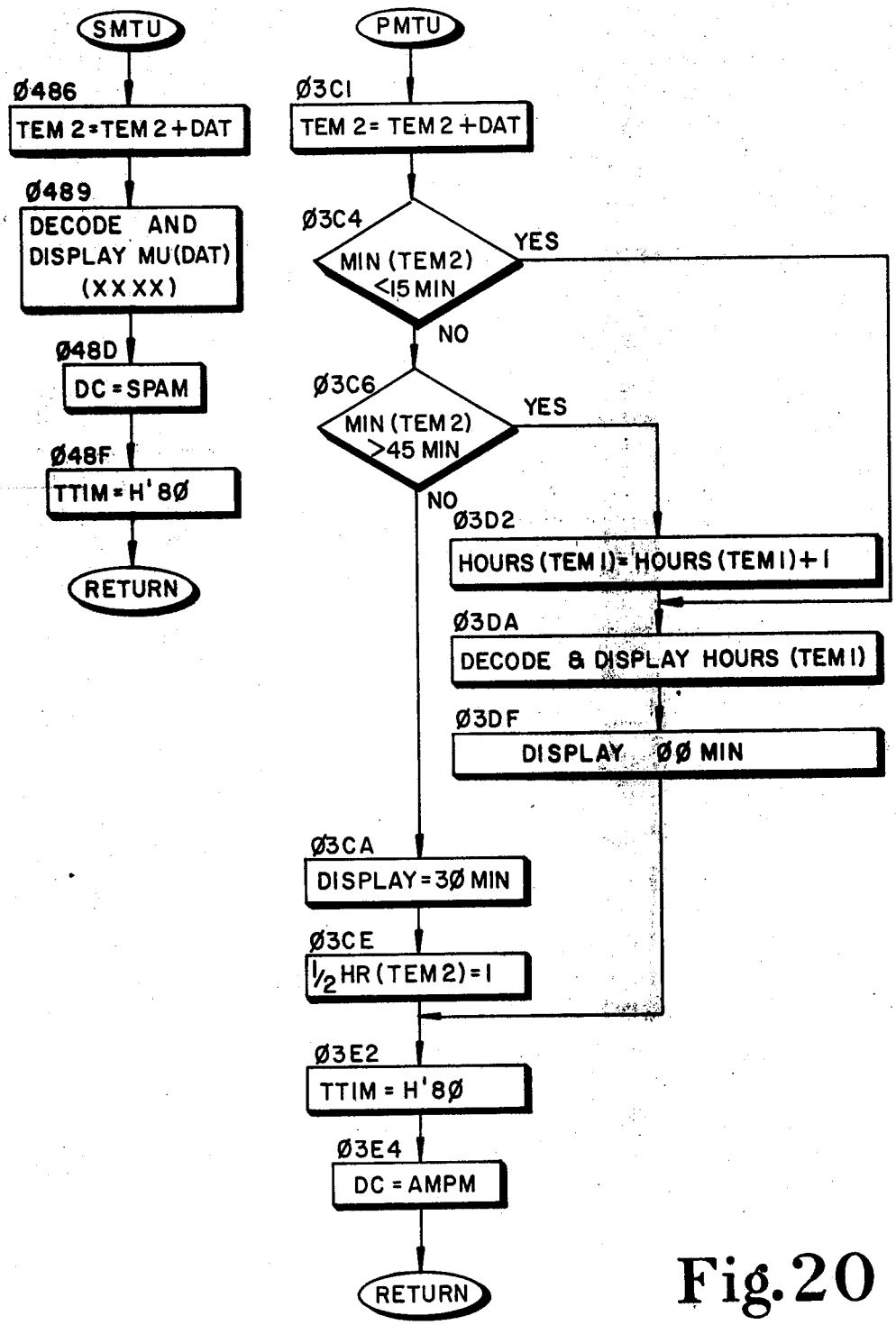
Figure 21:
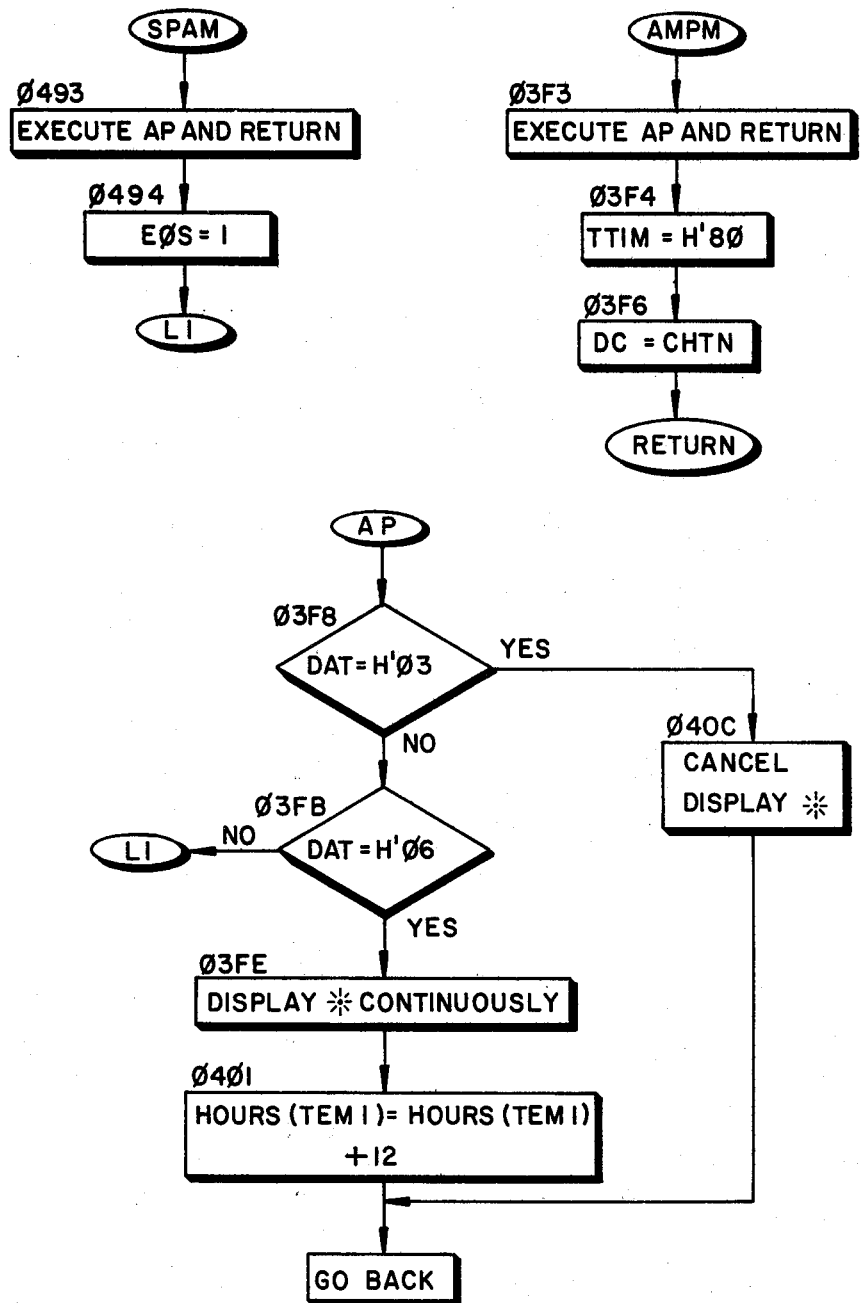

The CLOCK SET sequence consists of a series of sequences, SDAY, SHTN, SHTU, SMTN, SMTU, SPAM for setting the digit for the present day, the tens digit of the present hour, the units digit of the present hour, the tens digit of the present minute, the units digit of the present minute and AM or PM information, respectively. These sequences are linked together in the proper order by L15 as previously explained. Since the time setting portion of the PROGRAM sequence is in many ways similar to the CLOCK SET sequence, portions of the PROGRAM sequence corresponding to portions of the CLOCK SET sequence are indicated side by side in the same FIGURE. The various portions of the CLOCK SET and time setting portions of the PROGRAM sequences are indicated in FIGS. 16-21 as follows:

| SDAY, PDAY | FIG. 16 |
| SHTN, PHTN | FIG. 17 |
| SHTU, PHTU | FIG. 18 |
| SMTN, PMTN | FIG. 19 |
| SMTU, PMTU | FIG. 20 |
| SPAM, AMPM | FIG. 21 |

During the various portions of the CLOCK SET sequence, binary signals representing the present day and hour are stored in TEM1 and binary signals representing whether the present time is on the hour or half hour and the number of minutes past the hour or half hour, respectively, are stored in TEM2. During respective portions of the PROGRAM sequence, binary signals representing the day and hour of a selection are stored in TEM1 and binary signals representing whether the future selection is on the half hour is stored in TEM2. It should be noted that since selections may only occur on the hour or half hour, during PMTN and PMTU, only half hour information is stored in bit 8 of TEM2, the remaining 7 bits being utilized to store 7 binary signals representing the channel number of the selection. During the various portions of the CLOCK SET and PROGRAMMING sequences, the keyboard entries, stored in DAT, are examined to determine whether or not they are proper. For example, during the SHTU and PHTU portions of the CLOCK SET and PROGRAM sequences, respectively, a determination is made whether an hour greater than 12 has been selected. If an improper selection has been made, L1 is initiated to await a proper entry. At the conclusion of each portion of the CLOCK SET and PROGRAM sequences, binary signals representing the first instruction of the next portion are stored in DC for the reasons set forth above and binary signals representing the delay for the associated prompt symbol are stored in RAM location TTIM. At the conclusion of the entire CLOCK SET sequence, bit EOS of FLAG is set to 1 so that during the following MODE SELECT sequence, if the down key has been hit, the contents of TEM1 and TEM2 are transferred to HRS and MIN, respectively.

PROGRAM

Figure 22:
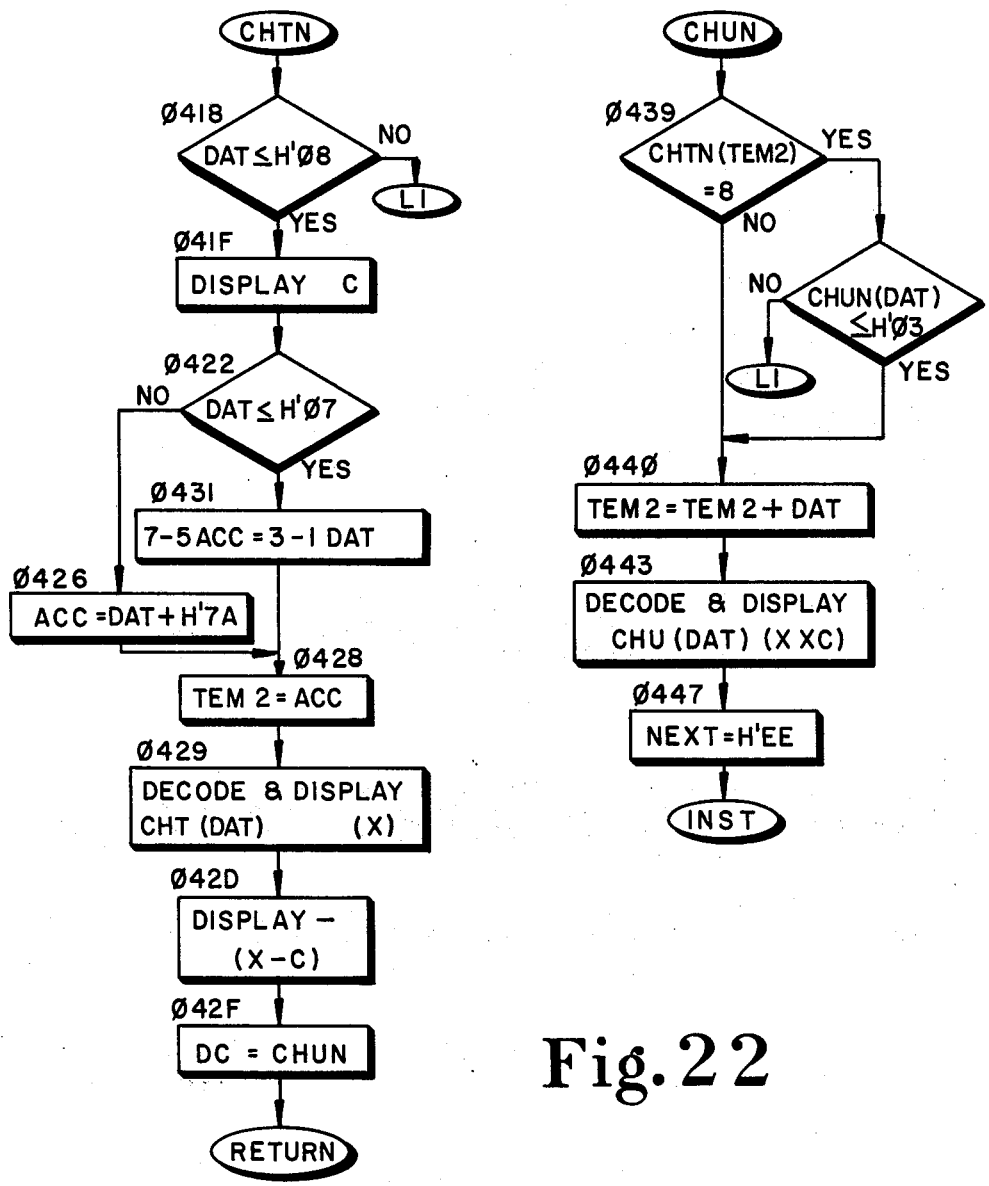

The entry of future time information during the PROGRAM sequence has already been described with reference to the CLOCK SET mode. The CHTN and CHTU portions, respectively, of the PROGRAM sequence for encoding the tens and units digit of the channel number of a selection and storing the resulting 7 binary signals in bits 7-1 of TEM2 are indicated in FIG. 22. After the completion of the CHTU sequence, an INST sequence is initiated.

INST

Figure 23:
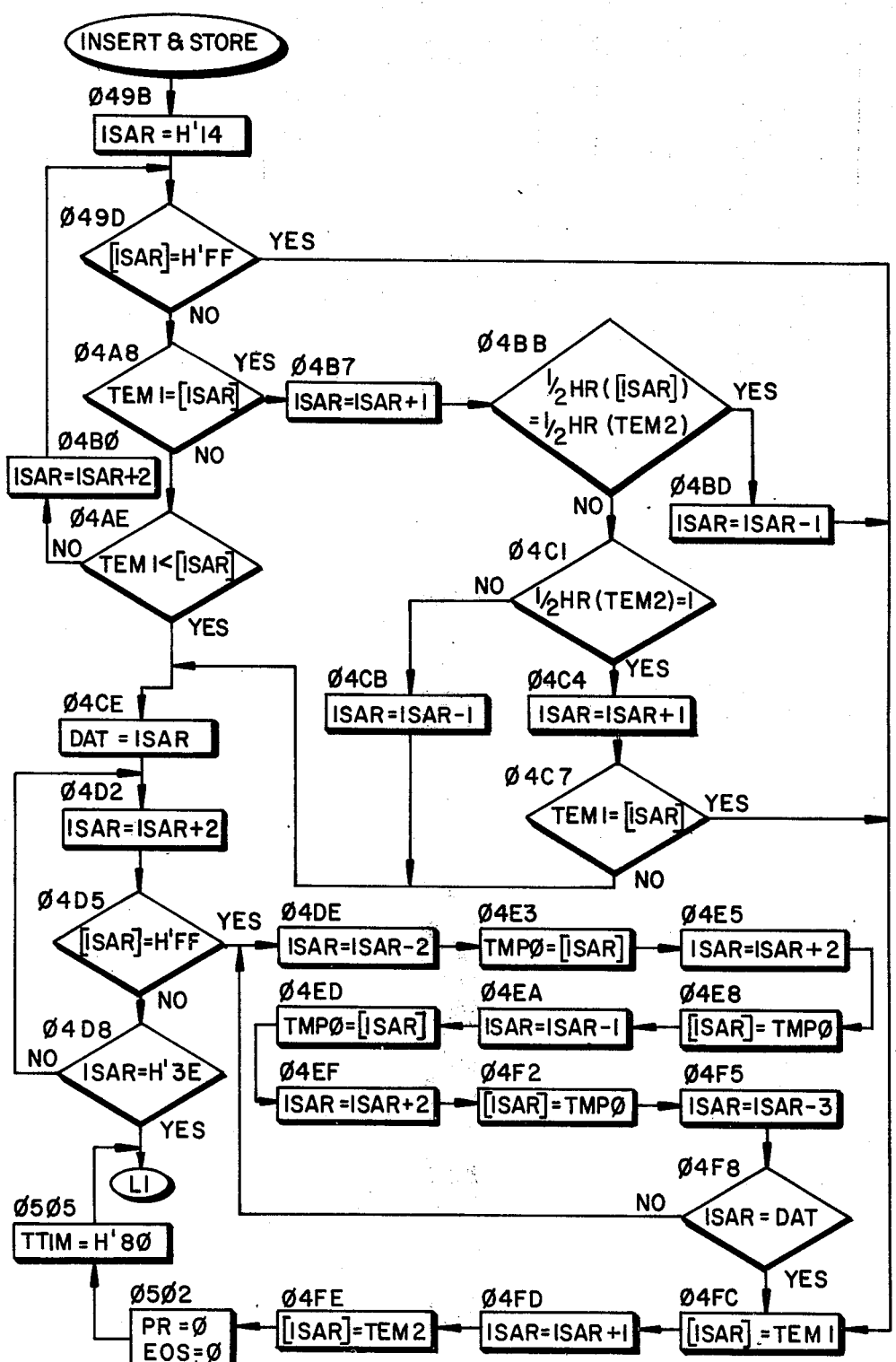

The function of the INST (INsert and STore) sequence, indicated in FIG. 23, is to store the binary signals stored in TEM1 after the completion of the PROGRAM sequence representing the day and hour of the future selection and the binary signals stored in TEM2 representing the ½ hour and a channel number of the future selection into two respective RAM locations (the combination hereinafter being referred to as a slot) between H'14 and H'3F. This is done in a manner such that Monday through Friday (day 8 but encoded as day 0) selections, Sunday (day 1) selections, Monday (day 2) selections, Tuesday (day 3) selections, Wednesday (day 4) selections, Thursday (day 5) selections, Friday (day 6) selections, Saturday (day 7) selections are stored in RAM locations H'14 through H'3F in the order named with relatively early times of day higher in the list (i.e., toward H'14) than relatively later times of the same day. Since this order is to be maintained, INST sequence operates so that even if a user makes an entry out or proper time sequence, the entry will be inserted in the selection list between H'14 and H'3F in the proper place and the remainder of the list will be shifted accordingly.

The INST routine starts with a series of tests which determine whether the binary signals stored in RAM location H'14 represent H'FF, thereby indicating it is empty (049B, 049D), represent a day and hour which is the same as the day and hour represented by the binary signals stored in TEM1 (04A8), or represent a day and hour earlier than the day and hour represented by the binary signals stored in TEM1 (04AE). If none of these tests are successful, the contents of ISAR 131 are sequentially increased by 2 (04B0), because day and hour information is stored in every other RAM location between H'14 and H'3F starting with H'14, and the tests are repeated until one of the above-described tests is successful.

If an empty RAM location is found, the contents of TEM1 are stored in the presently addressed RAM location (04FC). Thereafter, the contents of ISAR 131 are increased by 1 (04FD), because ½ hour and channel information is stored in every other RAM location between H'14 and H'3F starting with H'15, and the contents of TEM2 are stored in the then addressed RAM location (04FE).

If a RAM location is found in which the binary signals represent the same day and hour represented by the binary signals stored in TEM1, the contents of ISAR 131 are increased by 1 (04B7) and the ½ HR bit of the then addressed location is examined to see if it matches the ½ HR bit of TEM2 (04BB). If there is a match, the contents of ISAR 131 are decreased by 1 (04BD) and the contents of TEM1 and TEM2 are stored in the then addressed RAM location and the next RAM location, respectively (04FC, 04FE).

If a ½ hour match is not found, a test is performed to determine whether the ½ HR bit stored in TEM2 is a "0", indicating a selection on the hour, or a "1", indicating a selection on the half hour (04C1). If the ½ HR bit stored in TEM2 is a "0", the new selection is at a time earlier than that stored in the presently addressed RAM location and therefore the new selection must be inserted in the slot before the slot associated with the presently addressed RAM location. To accomplish this, the binary signals representing the previously addressed RAM location containing day and hour information are stored in DAT (04CB, 04CE) so that the position of the slot is saved. Thereafter, the first empty slot is located (04D2, 04D5, 04DB) and the information presently stored in the list is moved down one slot at a time from the empty slot until the slot associated with the address previously saved in DAT is located (04DE, 04E3, 04E5, 04E8, 04EA, 04ED, 04EF, 04F2, 04F5, 04F8). At this point, the contents of TEM1 and TEM2 are stored in the slot associated with the address previously saved in DAT (04FC, 04FE).

If the new selection is on the half hour, an examination is made of the next RAM location (which contains day and time of day information of the next selection) to determine if the binary signals stored therein represent the same day and hour as the day and hour represented by the binary signals stored in TEM1 (04C4, 04C7). If this is so, it indicates that a slot has been found which contains the same day, hour and half hour information as that stored in TEM1 and TEM2 and the contents of this slot is replaced with the contents of TEM1 and TEM2 (04FC, 04FD, 04FE). Otherwise, the slot associated with the presently addressed RAM location contains binary signals representing a day and/or hour later than the day and/or hour represented by the binary signals stored in TEM1. Therefore, the position of the slot is saved, the list is moved down slot by slot to the first empty location and the contents of TEM1 and TEM2 are entered into the slot having the saved address as indicated above. This result also occurs if it was initially determined (04AE) that the new entry was earlier than the time information pertaining to the day and hour stored in a presently addressed RAM location.

Before the INST sequence is terminated, the PR and EOS bits of FLAG are set to a "0" (0502) and binary signals representing a delay of approximately 1 second are stored in TTIM so that the next prompt symbol (Pr—) is displayed approximately 1 second after the last entry, i.e., units digit of the channel number.

EDIT SET UP

If the user hits the 9 digit key after hitting the up key when the receiver was off, the MODE SELECT sequence initiates the EDIT SET UP mode (0255). During the EDIT SET UP mode, indicated in FIG. 24, the EDT bit of FLAG is set to a "1" (0259) to indicate the user has initiated the editing mode. In addition, binary signals representing H'43 are stored in TEM2 (025C), H'43 being a code indicating that the first selection of a particular day is to be examined. Finally, the prompt symbol Ed— is displayed (025E) to indicate to a user that he should hit the digit key corresponding to the day he wishes examined. Thereafter, during the subsequent MODE SELECT sequence, since EDT is now set to a "1", the EDT sequence is initiated (0242).

EDIT

During EDIT, indicated in FIG. 2, if the digit key hit is not 0 or 9 (neither 0 or 9 correspond to a day), the contents of TEM2 are stored in ISAR 131 (02AF, 02B3, 02B6). As will be seen, TEM2 is utilized as a temporary storage location for the address of the RAM location between H'14 and H'3F being examined. A test is conducted to determine if ISAR contains binary signals representing H'43 (02B7). If the editing mode has just been initiated, TEM2 will contain binary signals representing H'43 (since they were stored there during EDIT SET UP) indicating that the first selection in the particular day to be reviewed is to be examined. If ISAR contains binary signals not representing H'43, it indicates that another selection in the same day is to be reviewed. Assuming that TEM2 contains binary signals representing H'43, the contents of DAT representing the number of the day to be reviewed are stored in TEM1 (02BD). Thereafter, RAM locations H'14 through H'3F are searched from the top to find the first RAM location with the signals representing the same day as that represented by the binary signals stored in TEM1 (02C0, 02D6, 02DB, 02DE, 02EF). If no match is found, EDIT SET UP is initiated and thereby Ed— is again displayed. If a match is found, the future time is displayed by initiating the EDTS sequence of CKDS utilized to display time (02E2, 02E5), ESS is set to a "1" (02E7) so that the channel number of the selection for which the match was found will be displayed next, and binary signals representing approximately a 1 second delay are stored in TTIM (02EA) so that the future time will be displayed for approximately 1 second before the corresponding channel number is displayed. Finally, the binary signals representing the RAM location of the selection just reviewed are stored in TEM2 (02EB) for the purpose of displaying the channel number of the selection.

Figure 24:
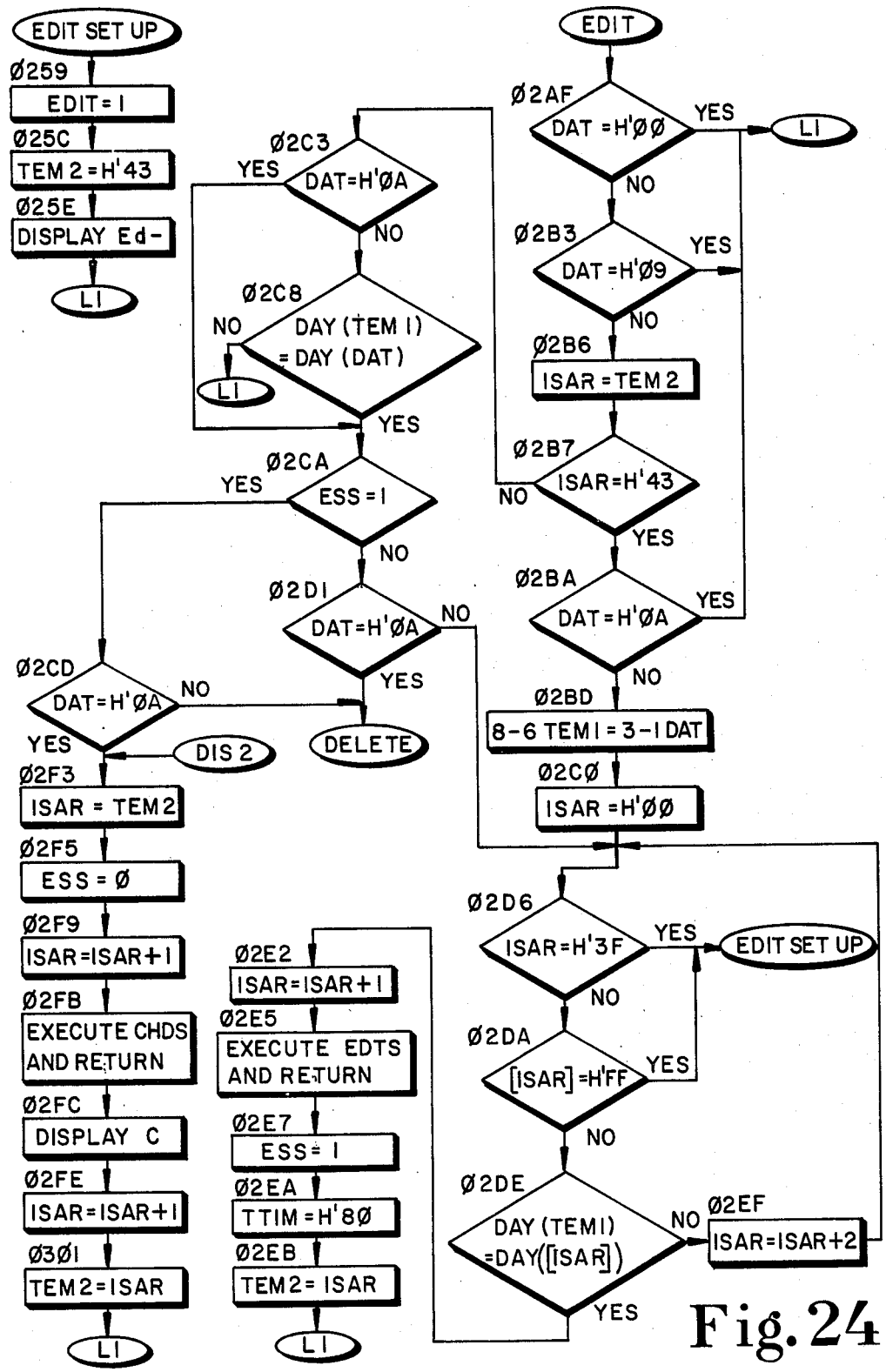

During the next MODE SELECT sequence, since ESS of FLAG was set to a "1", a DIS2 sequence, also indicated in FIG. 24, is initiated. During DIS2, the channel number of the selection just located will be displayed by initiating the CHDS sequence for displaying channel numbers, ESS is set to "0" so that the next display will be of time, and the symbol C is also displayed to indicate the channel number of the selection is being displayed (02F3, 02F5, 02F9, 02FB). At the end of DIS2, the RAM location in which the future time of the next selection of the same day is stored in TEM2 (02FE, 0301).

If the user now hits the digit key for the same day, during the MODE SELECT sequence, since EDT is set to a "1" (from the previous EDIT SET UP sequence) and since TEM2 will not contain binary signals representing H'43, indicating that another selection in the same day is to be reviewed, unless the volume up key has been hit to delete an entry (02C3, 02C8, 02CA, 02CD, 02D1), the same sequences for displaying the future time and corresponding channel number described above with respect to the previous selection in the same day are utilized to display the future time and corresponding channel number of the next selection in the same day.

DELETE

Figure 25:
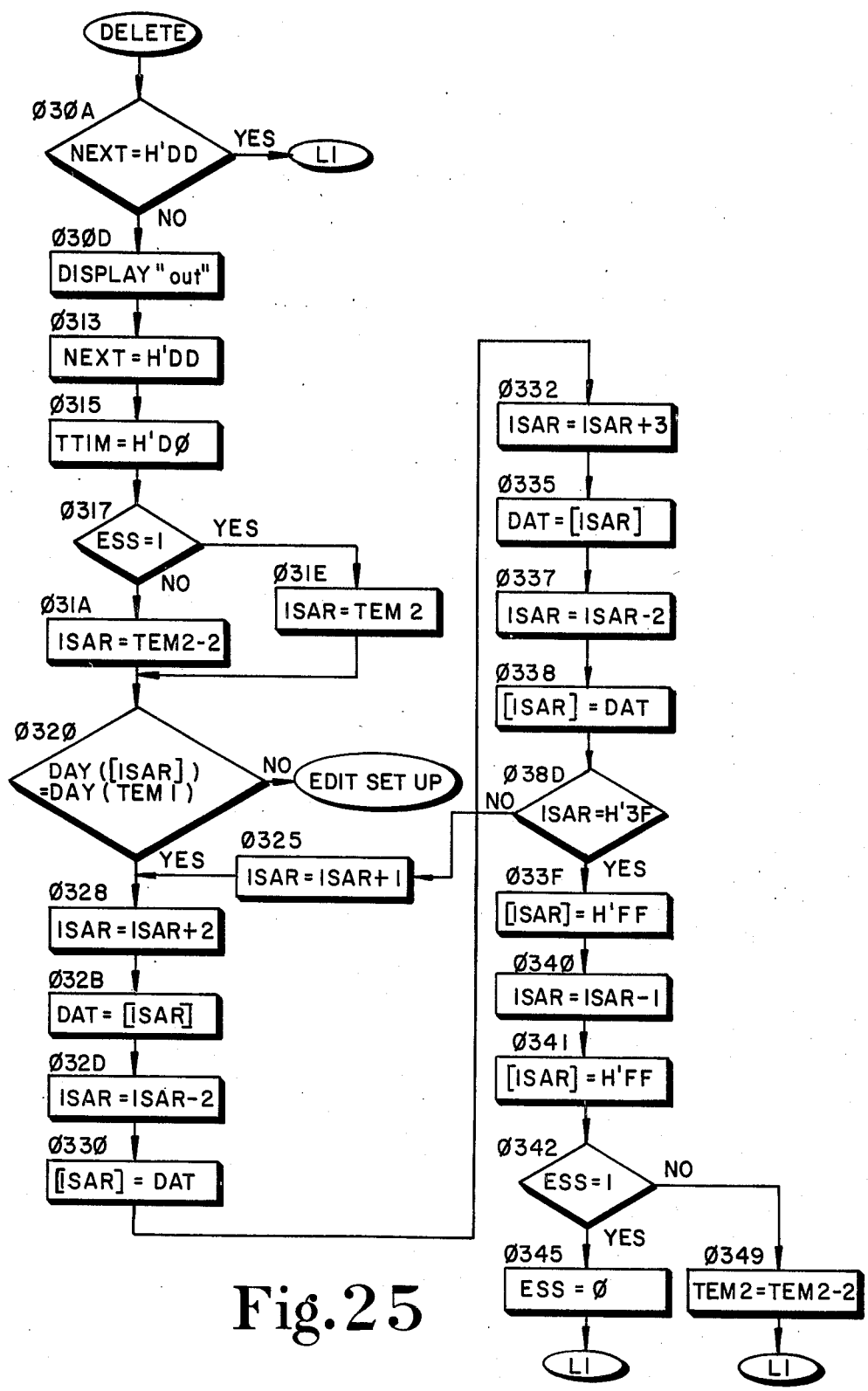

If during the MODE SELECT sequence the up key has been hit and the EDT bit of FLAG has been set to a "1", the latter indicating that the EDIT sequence is already in progress, EDIT is reinitiated (0136). Since, at this point, binary signals representing a RAM address between H'14 and H'3F corresponding to the selection to be deleted were stored in TEM2 during the previous EDIT sequence, the test (02B7) to determine whether binary signals representing H'43 have been stored in ISAR will fail. Thereafter, as a result of a sequence of tests (02C3, 02C8, 02CA, 02D1), a DELETE sequence, indicated in FIG. 25, is initiated.

At the beginning of the DELETE sequence, a test is made to determine if binary signals representing a code H'DD have been stored in NEXT (030A). At this point, the code H'DD indicates that a selection has been deleted and the next selection after that in the same day is to be displayed or is being displayed. Accordingly, if the contents of NEXT represent H'DD, L1 is initiated to cause, by way of the PROMPT sequence, the display of the next selection in the same day, as will be described below, or to await the next keyboard entry. If NEXT does not contain H'DD, the prompt symbol "out" is displayed (030D), binary signals representing H'DD are stored in NEXT (0313) and binary signals representing a time delay of approximately 1.5 seconds are stored in TTIM (0315). This serves to establish the delay for displaying the "out" prompt symbol and before which a subsequent deletion can be made and thereby inhibits a user from accidentally making a deletion by mistake by operating too quickly. Thereafter, the binary signals representing the address of the RAM location corresponding to the time of the selection to be deleted are stored in TEM2 (0317, 031A, 031E) since the deletion command may have occurred while the channel number was being displayed and a final check is made to make sure that the RAM location containing the time of the selection to be deleted has been properly located (0320). After that, the selections in RAM locations H'14 through H'3F are moved up two at a time (0328, 032B, 032D, 0330) so that the deletion in the selection list is made without having any empty slots. At this point, each selection has been moved up from its previous slot. However, because selections are written over the ones they replace, the last selection in the list appears twice. Therefore, the last selection in the list is erased by storing binary signals representing H'FF in its two corresponding RAM locations (033F, 0340, 0341). Finally, the ESS bit of FLAG or ISAR 131 is set so that the time information for the next selection after the deleted one are displayed (0342, 0345, 0349).

PROMPT

Figure 26:
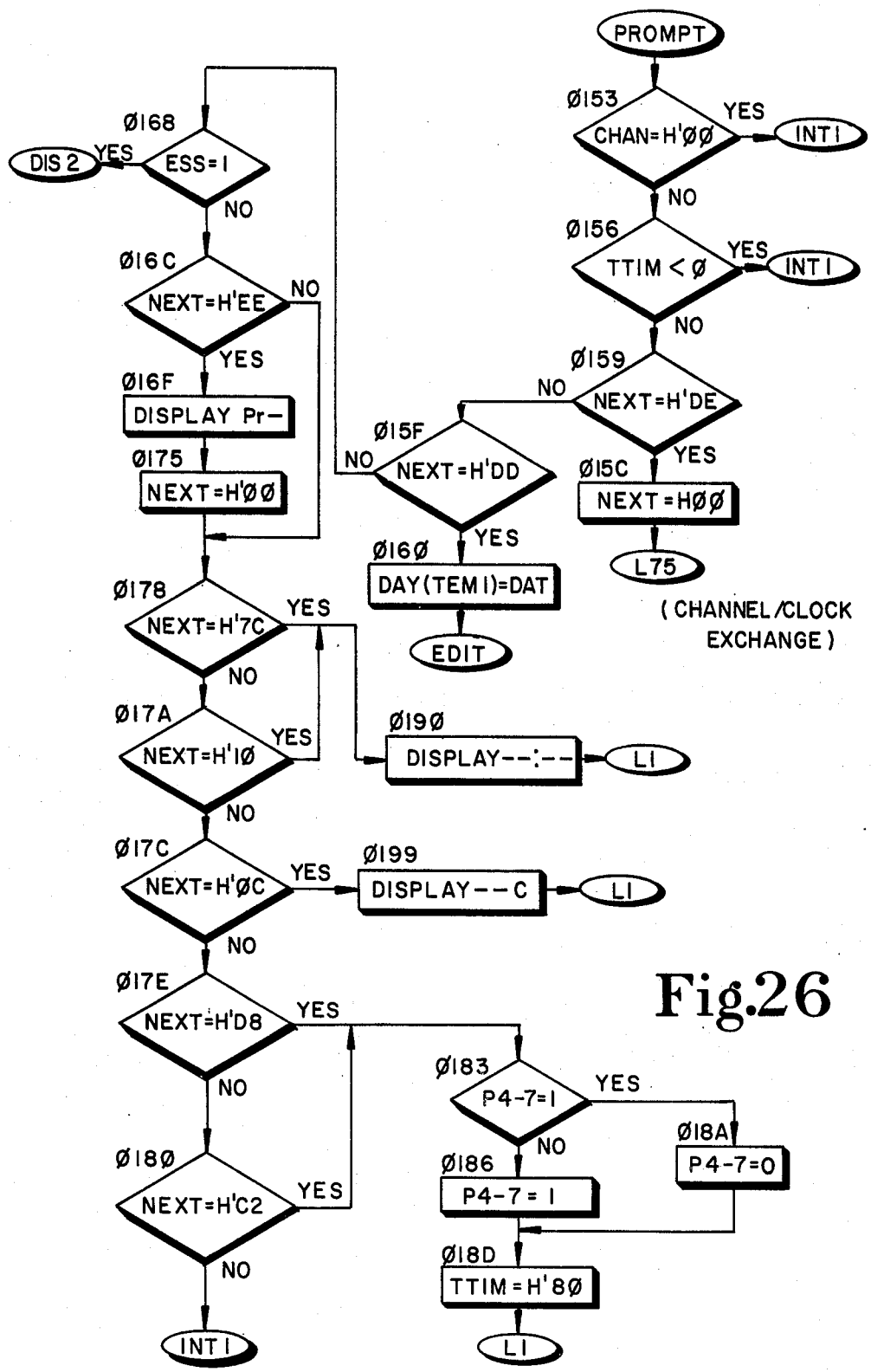

The PROMPT sequence, indicated in FIG. 26, is primarily utilized in conjunction with the RETURN sequence to determine which prompt symbol, if any, is to be displayed. It is recalled that during the CLOCK SET and PROGRAM sequences, binary signals representing the address of the ROM location containing the first instruction of the next sequence are stored in DC 122. During the following RETURN sequence, binary signals representing a code associated with the contents of DC 122 representing the next sequence of CLOCK SET or PROGRAM are stored in RAM location NEXT. In addition, during other sequences, such as EDIT, binary signals representing other codes are also stored in NEXT. The various codes stored in NEXT and their meanings are indicated below:

| CODE | MEANING |
|------|---------|
| H'7C | SHTN is the next sequence. |
| H'10 | PHTN is the next sequence. |
| H'C2 | SPAM is the next sequence. |
| H'D8 | AMPM is the next sequence. |
| H'DE | The last digit of the present time has been entered. |
| H'EE | The last entry for a particular selection has been entered during PROGRAM. |
| H'DD | A selection has been deleted during DELETE and the next selection in the same day is to be displayed. |
| H'00 | No prompt symbol is to be displayed next. |

During PROMPT, contents of NEXT are examined to determine which prompt signal is to be displayed next.

During PROMPT the contents of CHAN are evaluated to determine if the receiver is off (0153) since prompt symbols are not utilized when the receiver is on. Thereafter the contents of TTIM are examined to determine if the delay for the last prompt symbol has expired (0156) and if not the INT1 is initiated to await this occurrence. If the time required for the previous prompt symbol has expired, the contents of NEXT are examined to determine which code they represent.

If the contents of NEXT represent H'DE (0189), binary signals representing H'00 are stored in NEXT and CHANNEL/CLOCK EXCHANGE sequence is initiated (at L75) to display the clock. If the code is H'DD (015F), indicating that the user wishes to examine the next selection in the day he is presently reviewing, the contents of TEM1, which contain binary signals representing the previously entered day, are stored in DAT (0160). This causes the next selection after a deleted selection in the day being reviewed to be displayed during EDIT.

During PROMPT, RAM location FLAG is also examined to determine if the bit ESS has been set to "1" (0168). If it has, it indicates that the future time of the selection being presently reviewed has been displayed and since the delay for the prompt symbol has expired (0156), the channel number of the selection being presently reviewed is caused to be displayed during EDIT.

During the remaining portion of PROMPT, a series of tests (0166, 0175, 0178, 017A, 017C, 017E, 0180, 0183) are performed to determine which prompt symbol to display. Of particular interest is the manner in which the asterisk (*) is made to flash on and off. If NEXT contains binary signals representing either H'DE or H'C2 (017E, 0180), the input/output terminal associated with the asterisk display, P4-7, is examined to determine if it is a "1" (0183). If it is not, it is set to "1" (0186). If it is, it is set to a "0" (018A). Thereafter, binary signals representing a delay of approximately 1 second are stored in TTIM (018D) and L1 is initiated to await the expiration of this delay. Thereafter, during the subsequent PROMPT sequence, the state of the binary signal at terminal P4-7 is again reversed.

CLOCK

Figure 27A:
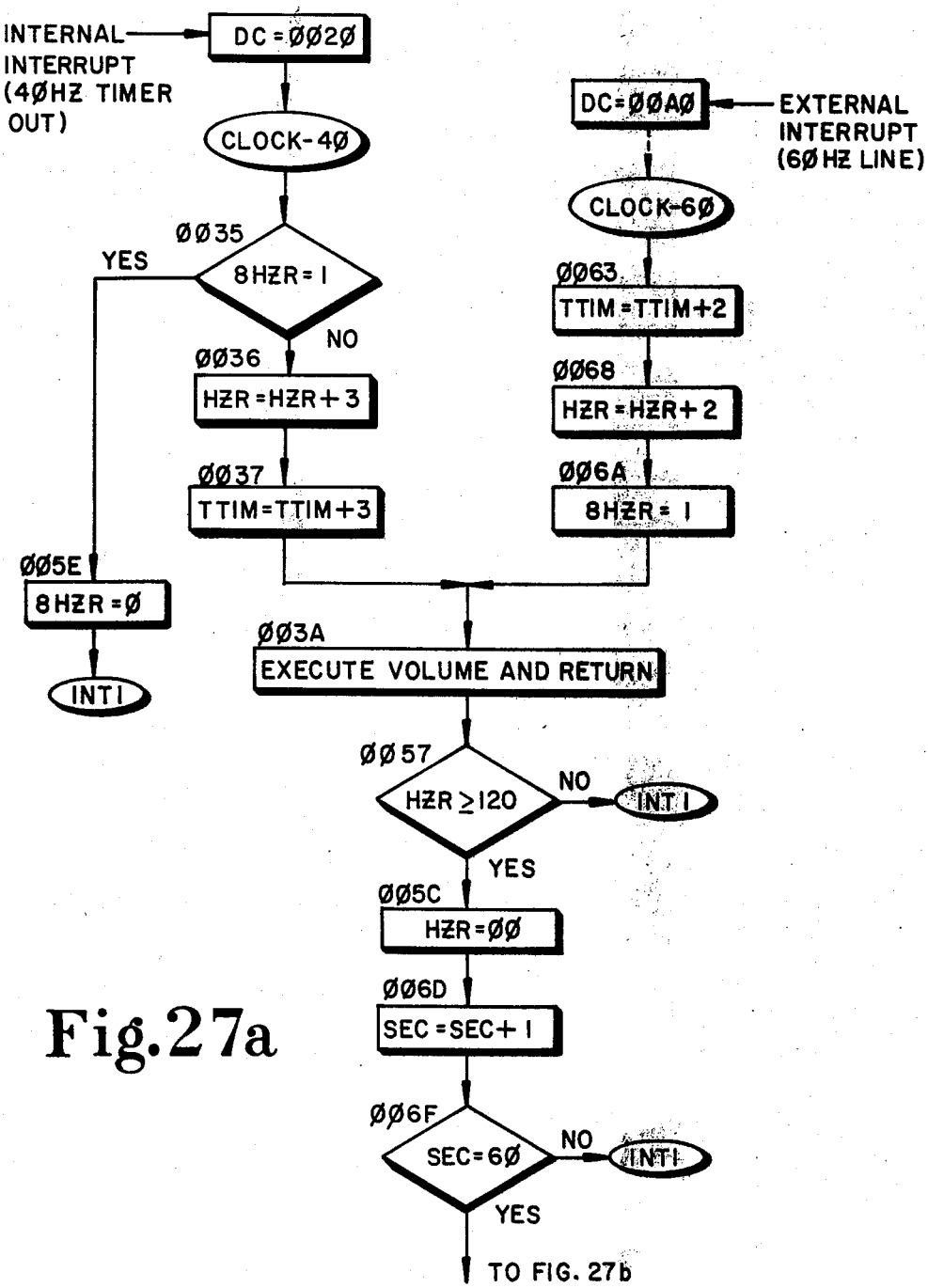
Figure 27B:
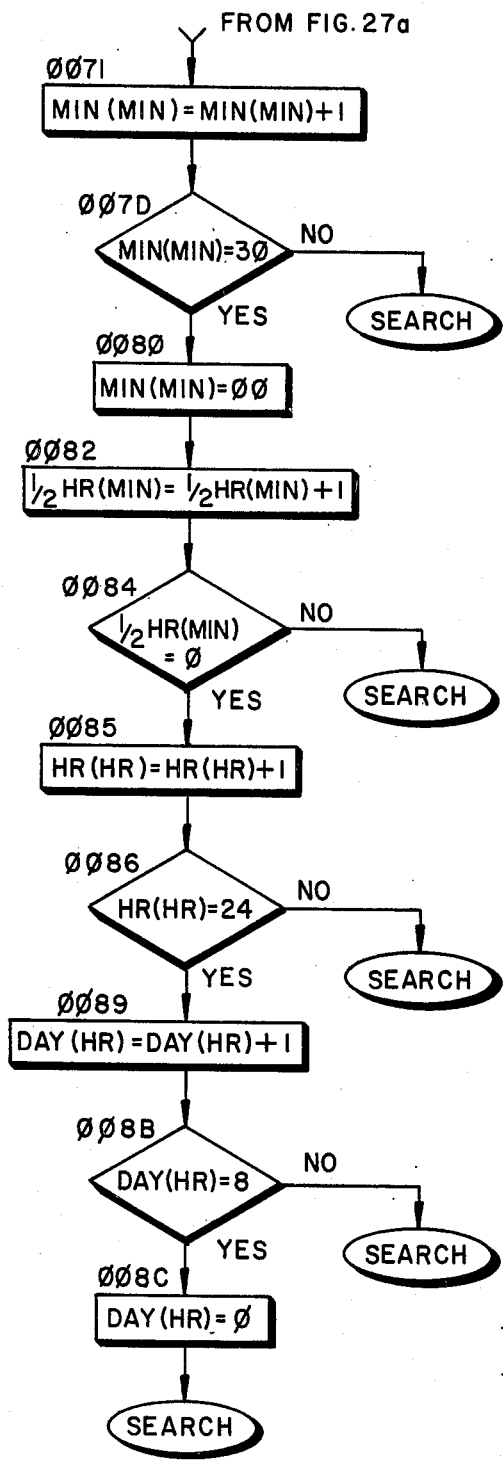

The CLOCK sequence, indicated in FIGS. 27a and 27b, updates the contents of RAM locations HZR, SEC, MIN, HR and TTIM.

Unlike the other sequences previously discussed, the CLOCK routine is not initiated by any other routine. Rather, it is initiated in response to each external interrupt pulse generated by amplifier 44 in response to each cycle of the 60 Hz line voltage or, in the absence of the 60 Hz line voltage, in response to each internal interrupt pulse generated at a frequency of 40 Hz by the timer 111 in response to the 4 MHz clock output signal of clock 113. When the 60 Hz line voltage is present, in response to each cycle of the 60 Hz line voltage, the contents of DC 122 are set to ROM address 00A0 and as a result the contents stored in RAM locations TTIM and HZR are each increased by 2 (0066, 0068). Thereafter, bit 8 of HZR is set to a "1". If there is a short term power failure, the 60 Hz external interrupt signal will not be generated and bit 8 of HZR will not be set to a "1". However, as long as the power failure does not last for a time longer than the time required for the filter capacitors (not shown) of the control power supply 48 to be discharged, the 40 Hz internal interrupt signal will continue to be generated and, as a result, each cycle of the 40 Hz internal interrupt signal causes the contents of DC 122 to be set to ROM address 0020. Accordingly, since bit 8 of HZR is not set to a "1", the contents of HZR and TTIM are caused to be increased by 3 (0035, 0036, 0037). Of course, when the 60 Hz external interrupt signal is present, and the bit 8 of HZR is set to 1, the contents of HZR and TTIM are not increased by 3 (0035). It will be noted that if control power supply 48 is a battery or the like, the 40 Hz internal interrupt signal will serve to update the contents of TTIM and HZR even if plug 26 is unplugged or 60 Hz line voltage is absent for a relatively long time.

After either 60 cycles of the external interrupt signal or after 40 cycles of the internal interrupt signal, the contents of HZR will represent 120, i.e., 1 second. At this point (0057), the contents of SEC are increased by 1 (005C, 006D). Similarly, the contents of MIN and HOUR are updated at the proper time intervals, e.g., when there are 60 seconds (006F), 30 minutes (007D), 1 hour (0084) and 7 days (008B). The SEARCH sequence is initiated at minute intervals.

VOLUME

Figure 28:
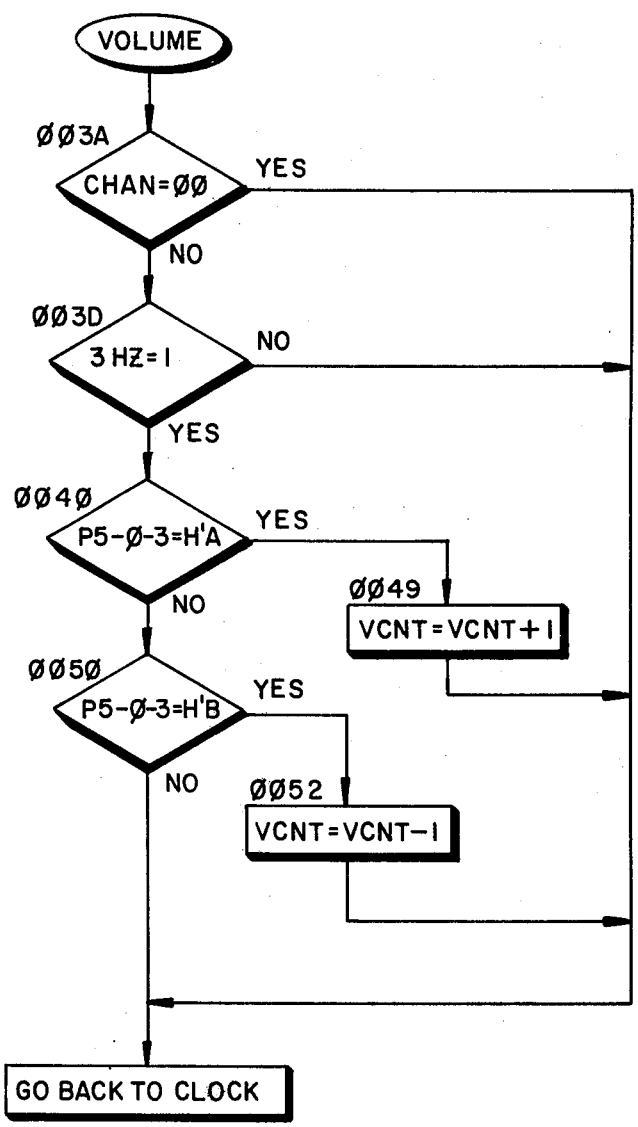
Figure 29:
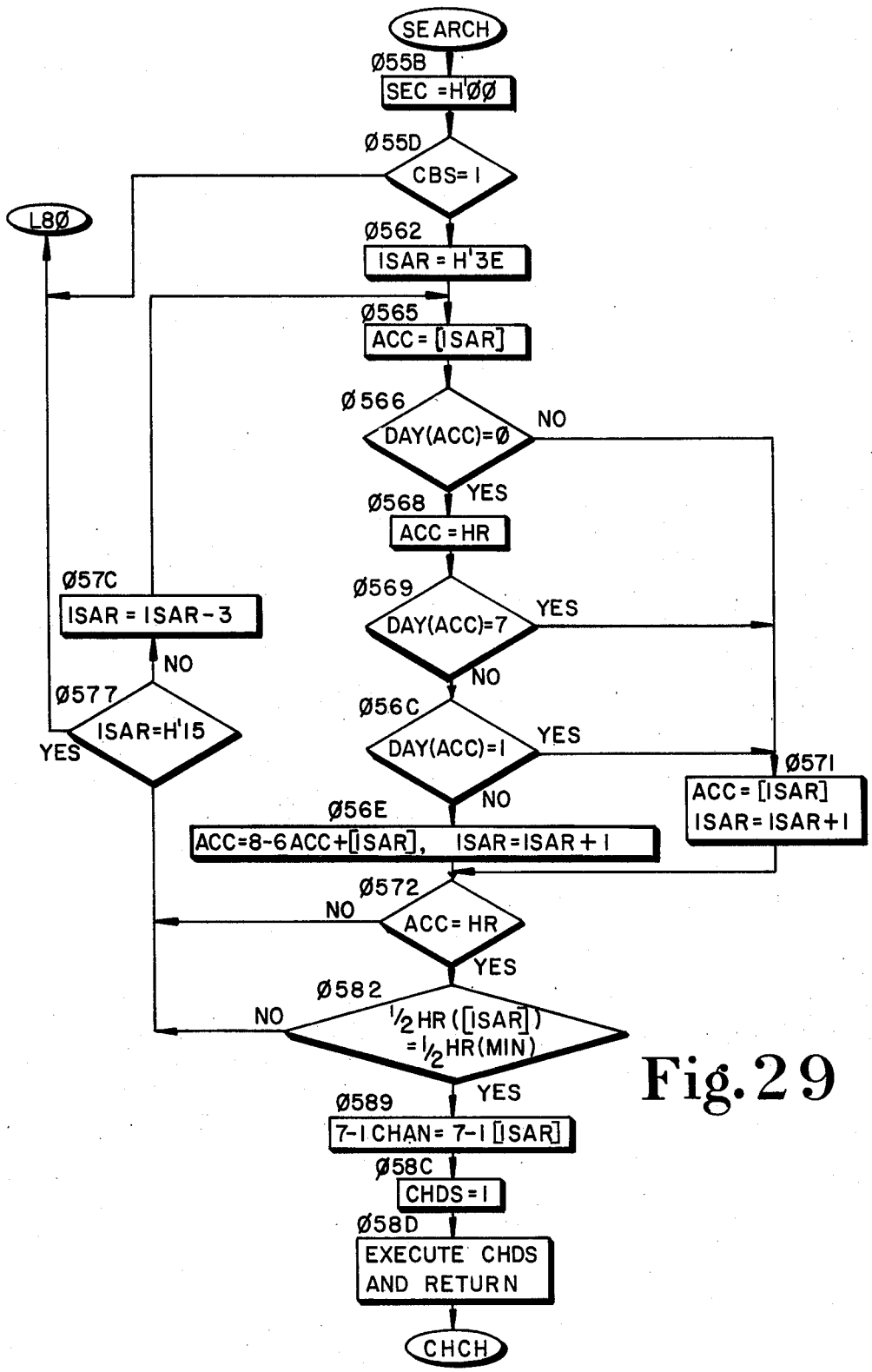

The VOLUME sequence, indicated in FIG. 28, is initiated during the CLOCK sequence when the contents of SEC represent 120 (0057). During the VOLUME sequence, if the receiver is on (003A), the binary signals stored in RAM location VCNT are increased by 1 if the user has hit the up key (0040, 0049) and decreased by 1 if the user has hit the down key (0050, 0052). So that the volume is changed at a 30 Hz rate, contents of VCNT are only changed when bit 3 of HZR is a "1" (003D) since this bit changes to a "1" at a frequency of 30 Hz.

VOLUME OUT

During the VOLUME OUT sequence, indicated in FIG. 7, the contents of VCNT are compared to the contents of timer 111. If the contents of VCNT represent a number greater than the contents represented by the contents of timer 111, a "1" is caused to be developed at terminal P5-6 (00D5, 00DD). Otherwise, a "0" is caused to be developed at P5-6 (00DD). As a result, the signal P5-6 has a pulse width which represents the volume level.

SEARCH

During the SEARCH sequence, the selections in the list between RAM locations H'14 and H'3F are examined to determine if there is a selection which has the same day and time of day as the present time. If so, binary signals representing the corresponding channel number are coupled to CHAN.

Since the SEARCH sequence is initiated each minute on the minute, at the beginning of the SEARCH sequence the contents of SEC are set to represent 0 seconds (055B). If the clock has not been set, which would make the SEARCH sequence meaningless, the CKDS sequence is initiated (via L80) so that the symbol *—:—is displayed to indicate to a user that the clock has not been set (055D). Thereafter, each location of the selection list corresponding to day and hour information starting with location H'3E at the bottom of the list is examined until a match of day and hour and half hour is found or until the list has been completely searched (0562, 0565, 0566, 0568, 0569, 056C, 056E, 0571, 0572, 0577, 057C, 0582).

Specifically, if the day of a selection is day 0, i.e., the selection is a Monday through Friday selection, and the present day is not Saturday or Sunday, the binary signals representing the present day and the binary signals representing the hour of the selection being examined are stored in ACC 107 (0565, 0566, 0568, 0569, 056C, 056E) and otherwise, the binary signals representing the day and hour of the selection are stored in ACC 107 (0571). This distinction is made because there is no present day 0 although there may be a day 0, i.e., M-F, selection and, therefore, if the day of the selection is day 0 and the present day is not Saturday or Sunday, indicating that the selection being examined is a M-F selection and the present day is a week day, only the future hour information of the selection needs to be compared to the present hour information. Thereafter, in either case, the contents of the accumulator are compared to the contents of HR (containing the present day and hour information).

If a match is found between the present day and hour and the day and hour of a selection, the future half hour information of the selection, stored in the next RAM location, is compared with the present half hour information stored in MIN (0582) until a match is found or the list is exhausted. If a complete match between the present time and the time of a selection is located, the binary signals representing the channel number of the selection are coupled to CHAN (0589), the channel number is displayed (058C, 058D) and the CHANNEL CHANGE sequence is initiated. It will be noted that since Monday through Friday selections are all located toward the top of the list before all individual day selections, and the list is searched from the bottom, individual day selections with the same day and time of day will be located first and will therefore take precedence over Monday through Friday selections.

APPENDIX

```
0000  0000  2B                  NOP
0001                            ORG     H'0000'
0002                    VCNT    EQU     H'13'
0003                    HZR     EQU     H'12'
0004                    TTIM    EQU     H'02'
0005                    SEC     EQU     H'08'
0006                    HR      EQU     H'0A'
0007                    MIN     EQU     H'0B'
0008                    TMFO    EQU     H'01'
0009                    ****  INITIALIZE 0-19 TO 0 AND 20 TO 63 TO FF
000A  0000  1A                  DI
000B  0001  20 60               LI      H'60'
000C  0003  B5                  OUTS    5
000D  0004  70                  CLR
000E  0005  0B                  LR      IS,A
000F  0006  70          PZO     CLR
0010  0007  90 03               BR      PUT
0011  0009  20 FF       FFF     LI      H'FF'
0012  000B  5C          PUT     LR      S,A
0013  000C  0A                  LR      A,IS
0014  000D  24 C1               AI      H'C1'
0015  000F  0B                  LR      IS,A
0016  0010  84 0C               BZ      DATZ
0017  0012  25 D3               CI      D'211'
0018  0014  94 04               BNZ     PT
0019  0016  71                  LIS     1
001A  0017  90 F3               BR      PUT
001B  0019  81 EC       PT      BP      PZO
001C  001B  90 ED               BR      FFF
001D                    *****
```

```
001E 001D 71          DATZ    LIS     H'01'
001F 001E 90 03               BR      BEB1
0020                          ORG     H'20'
0021 0020 90 16               BR      HZ40
0022 0022 B0          BEB1    OUTS    0
0023 0023 20 81               LI      H'81'
0024 0025 B1                  OUTS    1
0025 0026 B4                  OUTS    4
0026 0027 A5                  INS     5
0027 0028 22 80               OI      H'80'
0028 002A B5                  OUTS    5
0029 002B 20 EB       TOP     LI H'EB'
002A 002D B6                  OUTS 6
002B 002E 20 FA               LI D'250'
002C 0030 B7                  OUTS 7
002D 0031 70          CKST    CLR
002E 0032 58          ISEC    LR      SEC,A
002F 0033 1B          TRTN    EI
0030 0034 29 01 1E            JMP     INT1
0031 0037 20 12       HZ40    LI HZR
0032 0039 0B                  LR IS,A
0033 003A 73                  LIS H'03'
0034 003B CC                  AS S
0035 003C 91 3D               BM HZZ
0036 003E 5C                  LR S,A
0037 003F 73                  LIS 3
0038 0040 C2                  AS TTIM
0039 0041 52                  LR TTIM,A
003A 0042 70          VOL     CLR
003B 0043 C6                  AS CHAN
003C 0044 84 25               BZ VUDX
003D 0046 4C                  LR A,S
003E 0047 21 04               NI H'4'
003F 0049 84 20               BZ VUDX
0040 004B A5                  INS 5
0041 004C 21 E0               NI H'E0'
0042 004E B5                  OUTS 5
0043 004F A5                  INS 5
0044 0050 21 1F               NI H'1F'
0045 0052 25 1A               CI H'1A'
0046 0054 94 0D               BNZ DTST
0047 0056 71                  LIS 1
0048 0057 51          VUDT    LR TMPO,A
0049 0058 20 13               LI VCNT
004A 005A 0B                  LR IS,A
004B 005B 41                  LR A,TMPO
004C 005C CC                  AS S
004D 005D 84 0C               BZ VUDX
004E 005F 5C          VSV     LR S,A
004F 0060 90 09               BR VUDX
0050 0062 25 1B       DTST    CI H'1B'
0051 0064 94 05               BNZ VUDX
0052 0066 20 FF               LI H'FF'
0053 0068 90 EE               BR VUDT
0054 006A 20 12       VUDX    LI HZR
0055 006C 0B                  LR IS,A
0056 006D 4C                  LR A,S
0057 006E 21 7F       HZCM    NI H'7F'
0058 0070 25 77               CI D'119'
0059 0072 81 0B               BP HZEX
005A 0074 4C                  LR A,S
005B 0075 21 80               NI H'80'
005C 0077 5C                  LR S,A
005D 0078 90 15               BR      CSEC
005E 007A 4C          HZZ     LR A,S
005F 007B 21 7F               NI H'7F'
0060 007D 5C                  LR S,A
0061 007E 70          HZEX    CLR
0062 007F 90 B3               BR TRTN
0063 0081 20 12       HZ60    LI HZR
```

```
0064 0083 0B            LR    IS,A
0065 0084 72            LIS   2
0066 0085 C2            AS    TTIM
0067 0086 52            LR    TTIM,A
0068 0087 72            LIS   H'2'
0069 0088 CC            AS    S
006A 0089 22 80         OI    H'80'
006B 008B 5C            LR    S,A
006C 008C 90 B5         BR    VOL
006D 008E 71      CSEC  LIS   H'1'
006E 008F C8            AS    SEC
006F 0090 25 3C         CI    D'60'
0070 0092 94 9F         BNZ   ISEC
0071 0094 20 07   CCNT  LI    H'07'
0072 0096 DB            ASD   MIN
0073 0097 90 0A         BR    SKOP
0074 0099 0A      NURL  LR    A,IS
0075 009A 24 FF         AI    H'FF'
0076 009C 0B            LR    IS,A
0077 009D 29 04 7B      JMP   L111
0078                    ORG   H'A0'
0079 00A0 90 E0         BR    HZ60
007A 00A2 24 60   SKOP  AI    H'60'
007B 00A4 5B            LR    MIN,A
007C 00A5 21 3F         NI    H'3F'
007D 00A7 25 30         CI    H'30'
007E 00A9 94 16         BNZ   EXIT
007F 00AB 4B            LR    A,MIN
0080 00AC 24 50         AI    H'50'
0081 00AE 5B            LR    MIN,A
0082 00AF 4A            LR    A,HR
0083 00B0 19            LNK
0084 00B1 5A            LR    HR,A
0085 00B2 21 1F         NI    H'1F'
0086 00B4 25 18         CI    D'24'
0087 00B6 94 09         BNZ   EXIT
0088 00B8 78            LIS   H'8'
0089 00B9 CA            AS    HR
008A 00BA 5A            LR    HR,A
008B 00BB 94 04         BNZ   EXIT
008C 00BD 20 20         LI    H'20'
008D 00BF 5A            LR    HR,A
008E 00C0 29 07 B8 EXIT JMP   SRCH
008F 00C3 CE      TMDP  AS    D
0090 00C4 21 80         NI    H'80'
0091 00C6 90 09         BR    TMK
0092 00C8 CE      EDTS  AS    D
0093 00C9 21 80         NI    H'80'
0094 00CB 90 04         BR    TMK
0095 00CD 70      CKDS  CLR
0096 00CE B0            OUTS  0
0097 00CF CE      GMIN  AS    D
0098 00D0 81 03   TMK   BP    MK
0099 00D2 24 B0         AI    H'B0'
009A 00D4 51      MK    LR    TMPO,A
009B 00D5 14            SR    4
009C 00D6 2A 01 08      DCI   DDL
009D 00D9 8E            ADC
009E 00DA 16            LM
009F 00DB 22 80         OI    H'80'
00A0 00DD B1            OUTS  1
00A1 00DE 41            LR    A,TMPO
00A2 00DF 21 0F         NI    H'0F'
00A3 00E1 2A 01 08      DCI   DDL
00A4 00E4 8E            ADC
00A5 00E5 16            LM
00A6 00E6 B4            OUTS  4
00A7 00E7 70            CLR
00A8 00E8 4C            LR    A,S
00A9 00E9 21 1F         NI    H'1F'
00AA 00EB 25 0C         CI    D'12'
```

```
00AB 00ED 84 05            BZ    SFM
00AC 00EF 81 0A            BP    TZ
00AD 00F1 24 F4            AI    D'-12'
00AE 00F3 51        SFM    LR    TMP0,A
00AF 00F4 70               CLR
00B0 00F5 A4               INS   4
00B1 00F6 22 80            OI    H'80'
00B2 00F8 B4               OUTS  4
00B3 00F9 41               LR    A,TMP0
00B4 00FA 25 00     TZ     CI    H'00'
00B5 00FC 94 03            BNZ   TENC
00B6 00FE 20 0C            LI    D'12'
00B7 0100 2A 01 08 TENC    DCI   DDL
00B8 0103 8E               ADC
00B9 0104 16               LM
00BA 0105 B0               OUTS  0
00BB 0106 70               CLR
00BC 0107 1C               POP
00BD 0108 7E        DDL    DC    H'7E'
00BE 0109 30               DC    H'30'
00BF 010A 6D               DC    H'6D'
00C0 010B 79               DC    H'79'
00C1 010C 33               DC    H'33'
00C2 010D 5B               DC    H'5B'
00C3 010E 5F               DC    H'5F'
00C4 010F 70               DC    H'70'
00C5 0110 7F               DC    H'7F'
00C6 0111 7B               DC    H'7B'
00C7 0112 FE               DC    H'FE'
00C8 0113 B0               DC    H'B0'
00C9 0114 ED               DC    H'ED'
00CA 0115 20 11     L1     LI    H'11'
00CB 0117 0B               LR    IS,A
00CC 0118 42               LR    A,TTIM
00CD 0119 5E               LR    D,A
00CE 011A 20 80            LI    H'80'
00CF 011C FC               NS    S
00D0 011D 5C               LR    S,A
00D1 011E 1B        INT1   EI
00D2 011F 70               CLR
00D3 0120 C6               AS    CHAN
00D4 0121 84 13            BZ    VEXIT+1
00D5 0123 20 13            LI    VCNT
00D6 0125 0B               LR    IS,A
00D7 0126 A7               INS   7
00D8 0127 18               COM
00D9 0128 1F               INC
00DA 0129 CC               AS    S
00DB 012A 92 06            BNC   VZERO
00DC 012C A5               INS   5
00DD 012D 21 BF            NI    H'BF'
00DE 012F 90 04            BR    VEXIT
00DF 0131 A5        VZERO  INS   5
00E0 0132 22 40            OI    H'40'
00E1 0134 B5        VEXIT  OUTS  5
00E2 0135 2B               NOP
00E3                FLAG   EQU   H'0'
00E4                NEXT   EQU   H'09'
00E5                TTIM   EQU   H'02'
00E6                TEM1   EQU   H'03'
00E7                TEM2   EQU   H'04'
00E8                DAT    EQU   H'05'
00E9                CHAN   EQU   H'06'
00EA 0136 1A               DI
00EB 0137 20 10            LI    H'10'
00EC 0139 0B               LR    IS,A
00ED 013A 4C        BOXI   LR    A,S
00EE 013B 21 7F            NI    H'7F'
00EF 013D 84 12            BZ    READ
00F0 013F 25 03            CI    H'03'
00F1 0141 84 08            BZ    OOPS
```

```
00F2 0143 03            LR    A,QL
00F3 0144 18            COM
00F4 0145 C2            AS    TTIM
00F5 0146 81 28         BP    NON1
00F6 0148 90 D5         BR    INT1
00F7 014A 70    OOPS    CLR
00F8 014B C2            AS    TTIM
00F9 014C 81 22         BP    NON1
00FA 014E 90 CF         BR    INT1
00FB 0150 A5    READ    INS   5
00FC 0151 21 E0         NI    H'E0'
00FD 0153 B5            OUTS  5
00FE 0154 A5            INS   5
00FF 0155 21 10         NI    H'10'
0100 0157 94 07         BNZ   KDTS
0101 0159 20 7F         LI    H'7F'
0102 015B FC            NS    S
0103 015C 5C            LR    S,A
0104 015D 90 7C         BR    L3
0105 015F 70    KDTS    CLR
0106 0160 CC            AS    S
0107 0161 81 06         BP    DB
0108 0163 4D            LR    A,I
0109 0164 4E            LR    A,D
010A 0165 52            LR    TTIM,A
010B 0166 90 B7         BR    INT1
010C 0168 72    DB      LIS   H'02'
010D 0169 5C            LR    S,A
010E 016A 75            LIS   H'05'
010F 016B C2            AS    TTIM
0110 016C 07            LR    QL,A
0111 016D 90 B0         BR    INT1
0112 016F 4C    NON1    LR    A,S
0113 0170 21 02         NI    H'02'
0114 0172 84 67         BZ    L3
0115 0174 4C            LR    A,S
0116 0175 21 03         NI    H'03'
0117 0177 25 02         CI    H'02'
0118 0179 84 14         BZ    DBNC
0119 017B 70            CLR
011A 017C C9            AS    NEXT
011B 017D 25 77         CI    WAT1.
011C 017F 94 04         BNZ   WAK1
011D 0181 29 07 77      JMP   WAT1
011E 0184 25 94  WAK1   CI    WAT2.
011F 0186 94 04         BNZ   WAK2
0120 0188 29 07 94      JMP   WAT2
0121 018B 29 07 AB WAK2 JMP   WAT3
0122 018E 20 80  DBNC   LI    H'80'
0123 0190 5C            LR    S,A
0124 0191 A5            INS   5
0125 0192 21 E0         NI    H'E0'
0126 0194 B5            OUTS  5
0127 0195 A5            INS   5
0128 0196 55            LR    DAT,A
0129 0197 21 10         NI    H'10'
012A 0199 84 3D         BZ    JNT1
012B 019B 7F            LIS   H'0F'
012C 019C F5            NS    DAT
012D 019D 55            LR    DAT,A
012E 019E 25 0B         CI    H'0B'
012F 01A0 91 33         BM    JJ11
0130 01A2 25 0A         CI    H'0A'
0131 01A4 84 04         BZ    BIN
0132 01A6 29 02 57      JMP   L6
0133 01A9 40    BIN     LR    A,FLAG
0134 01AA 21 02         NI    H'02'
0135 01AC 84 09         BZ    BIPP
0136 01AE 40            LR    A,FLAG
0137 01AF 21 10         NI    H'10'
0138 01B1 84 04         BZ    BIPP
```

```
0139 01B3 29 03 F7              JMP     EDIT
013A 01B6 40         BIPP       LR      A,FLAG
013B 01B7 21 3F                 NI      H'3F'
013C 01B9 94 06                 BNZ     L10
013D 01BB 46                    LR      A,CHAN
013E 01BC 21 FF                 NI      H'FF'
013F 01BE 94 15                 BNZ     JJ11
0140 01C0 40         L10        LR      A,FLAG
0141 01C1 22 02                 OI      H'02'
0142 01C3 21 C2                 NI      H'C2'
0143 01C5 50                    LR      FLAG,A
0144 01C6 A5         L13        INS     5
0145 01C7 21 7F                 NI      H'7F'
0146 01C9 B5                    OUTS    5
0147 01CA 70                    LIS     0
0148 01CB 53                    LR      TEM1,A
0149 01CC 54                    LR      TEM2,A
014A 01CD 55                    LR      DAT,A
014B 01CE 59                    LR      NEXT,A
014C 01CF 52                    LR      TTIM,A
014D 01D0 B0                    OUTS    0
014E 01D1 B1                    OUTS    1
014F 01D2 71                    LIS     H'01'
0150 01D3 B4                    OUTS    4
0151 01D4 29 01 15  JJ11        JMP     L1
0152 01D7 29 01 1E  JNT1        JMP     INT1
0153 01DA 70        L3          CLR
0154 01DB C6                    AS      CHAN
0155 01DC 94 FA                 BNZ     JNT1
0156 01DE 70                    CLR
0157 01DF C2                    AS      TTIM
0158 01E0 91 F6                 BM      JNT1
0159 01E2 49                    LR      A,NEXT
015A 01E3 25 DE                 CI      H'DE'
015B 01E5 94 06                 BNZ     NO
015C 01E7 70                    CLR
015D 01E8 59                    LR      NEXT,A
015E 01E9 29 02 C8              JMP     L75
015F 01EC 25 DD     NO          CI      H'DD'
0160 01EE 94 0B                 BNZ     L130
0161 01F0 43                    LR      A,TEM1
0162 01F1 12                    SR      1
0163 01F2 14                    SR      4
0164 01F3 94 02                 BNZ     DELM
0165 01F5 78                    LIS     H'08'
0166 01F6 55        DELM        LR      DAT,A
0167 01F7 29 03 F7              JMP     EDIT
0168 01FA 40        L130        LR      A,FLAG
0169 01FB 21 20                 NI      H'20'
016A 01FD 84 04                 BZ      L99
016B 01FF 29 04 5D              JMP     DIS2
016C 0202 49        L99         LR      A,NEXT
016D 0203 25 EE                 CI      H'EE'
016E 0205 94 0B                 BNZ     SOOT
016F 0207 20 67                 LI      H'67'
0170 0209 B0                    OUTS    0
0171 020A 75                    LIS     H'05'
0172 020B B1                    OUTS    1
0173 020C 71                    LIS     H'01'
0174 020D B4                    OUTS    4
0175 020E 70                    CLR
0176 020F 59                    LR      NEXT,A
0177 0210 49                    LR      A,NEXT
0178 0211 25 7C     SOOT        CI      SHTN.M
0179 0213 84 29                 BZ      L4
017A 0215 25 10                 CI      PHTN.M
017B 0217 84 25                 BZ      L4
017C 0219 25 0C                 CI      CHTN.M
```

```
017D 021B 84 2D            BZ     L5
017E 021D 25 D8            CI     AMPM.
017F 021F 84 08            BZ     L47
0180 0221 25 C2            CI     SPAM.
0181 0223 84 04            BZ     L47
0182 0225 29 01 1E  COP    JMP    INT1
0183 0228 A4        L47    INS    4
0184 0229 21 80            NI     H'80'
0185 022B 94 07            BNZ    L45
0186 022D A4               INS    4
0187 022E 24 80            AI     H'80'
0188 0230 B4               OUTS   4
0189 0231 90 05            BR     L46
018A 0233 A4        L45    INS    4
018B 0234 21 7F            NI     H'7F'
018C 0236 B4               OUTS   4
018D 0237 20 80    L46     LI     H'80'
018E 0239 52               LR     TTIM,A
018F 023A 29 01 15 BON     JMP    L1
0190 023D 71       L4      LIS    1
0191 023E B0               OUTS   0
0192 023F 20 81            LI     H'81'
0193 0241 B1               OUTS   1
0194 0242 B4               OUTS   4
0195 0243 A5               INS    5
0196 0244 22 80            OI     H'80'
0197 0246 B5               OUTS   5
0198 0247 90 F2            BR     BON
0199 0249 20 4E    L5      LI     H'4E'
019A 024B B4               OUTS   4
019B 024C A5               INS    5
019C 024D 21 7F            NI     H'7F'
019D 024F B5               OUTS   5
019E 0250 71               LIS    H'1'
019F 0251 B0               OUTS   0
01A0 0252 B1               OUTS   1
01A1 0253 70               CLR
01A2 0254 59               LR     NEXT,A
01A3 0255 90 E4            BR     BON
01A4 0257 70      L6       CLR
01A5 0258 C6               AS     CHAN
01A6 0259 84 0E            BZ     SKEE
01A7 025B 21 0F            NI     H'0F'
01A8 025D 25 0E            CI     H'0E'
01A9 025F 84 0D            BZ     KEP
01AA 0261 45               LR     A,DAT
01AB 0262 25 09            CI     H'09'
01AC 0264 84 0B            BZ     SKPO
01AD 0266 90 06            BR     KEP
01AE 0268 45     SKEE      LR     A,DAT
01AF 0269 25 0B            CI     H'0B'
01B0 026B 84 04            BZ     SKPO
01B1 026D 29 03 32 KEP     JMP    L50
01B2 0270 A5     SKPO      INS    5
01B3 0271 21 7F            NI     H'7F'
01B4 0273 B5               OUTS   5
01B5             *CLOCK AND CHANNEL DISPLAY EXCHANGE ROUTINE
01B6 0274 70               CLR
01B7 0275 59               LR     NEXT,A
01B8 0276 90 0B            BR     L49
01B9 0278 40       L80     LR     A,FLAG
01BA 0279 21 7F            NI     H'7F'
01BB 027B 84 24            BZ     L81
01BC 027D 7B       TOOH    LIS    MIN
01BD 027E 0B               LR     IS,A
01BE 027F 29 00 33 DIDE    JMP    TRTN
01BF 0282 40       L49     LR     A,FLAG
01C0 0283 21 3F            NI     H'3F'
01C1 0285 94 29            BNZ    L76
01C2 0287 40               LR     A,FLAG
01C3 0288 21 40            NI     H'40'
```

```
01C4 028A 94 11              BNZ      L78
01C5 028C 46                 LR       A,CHAN
01C6 028D 21 FF              NI       H'FF'
01C7 028F 84 10              BZ       L81
01C8 0291 40                 LR       A,FLAG
01C9 0292 22 40              OI       H'40'
01CA 0294 50                 LR       FLAG,A
01CB 0295 76                 LIS      H'06'
01CC 0296 0B                 LR       IS,A
01CD 0297 28 02 D9           PI       CHDS
01CE 029A 90 E4              BR       DIDE
01CF 029C 40        L78      LR       A,FLAG
01D0 029D 21 BF              NI       H'BF'
01D1 029F 50                 LR       FLAG,A
01D2 02A0 40        L81      LR       A,FLAG
01D3 02A1 21 80              NI       H'80'
01D4 02A3 94 04              BNZ      DDDE
01D5 02A5 29 00 1D           JMP      DATZ
01D6 02A8 7B        DDDE     LIS      MIN
01D7 02A9 0B                 LR       IS,A
01D8 02AA 28 00 CD           PI       CKDS
01D9 02AD 90 D1              BR       DIDE
01DA 02AF 23 0B     L76      XI       H'0B'
01DB 02B1 94 16              BNZ      L75
01DC 02B3 43                 LR       A,TEM1
01DD 02B4 5A                 LR       HR,A
01DE 02B5 44                 LR       A,TEM2
01DF 02B6 5B                 LR       MIN,A
01E0 02B7 70                 CLR
01E1 02B8 58                 LR       SEC,A
01E2 02B9 40                 LR       A,FLAG
01E3 02BA 21 C0              NI       H'C0'
01E4 02BC 50                 LR       FLAG,A
01E5 02BD 70                 CLR
01E6 02BE B1                 OUTS     1
01E7 02BF B0                 OUTS     0
01E8 02C0 B4                 OUTS     4
01E9 02C1 20 DE              LI       H'DE'
01EA 02C3 59                 LR       NEXT,A
01EB 02C4 52                 LR       TTIM,A
01EC 02C5 29 01 15           JMP      L1
01ED 02C8 40        L75      LR       A,FLAG
01EE 02C9 21 C1              NI       H'C1'
01EF 02CB 50                 LR       FLAG,A
01F0 02CC 70                 CLR
01F1 02CD 59                 LR       NEXT,A
01F2 02CE C6                 AS       CHAN
01F3 02CF 84 CC              BZ       L78
01F4 02D1 76                 LIS      H'06'
01F5 02D2 0B                 LR       IS,A
01F6 02D3 28 02 D9           PI       CHDS
01F7 02D6 29 03 20 KIR1      JMP      CHCC
01F8                *RESTORE CHANNEL TO DISPLAY
01F9 02D9 40        CHDS     LR       A,FLAG
01FA 02DA 22 40              OI       H'40'
01FB 02DC 50                 LR       FLAG,A
01FC 02DD 70                 LIS      0
01FD 02DE B4                 OUTS     4
01FE 02DF A5                 INS      5
01FF 02E0 21 7F              NI       H'7F'
0200 02E2 B5                 OUTS     5
0201 02E3 2A 01 08           DCI      DDL
0202 02E6 4C                 LR       A,S
0203 02E7 25 EE              CI       H'EE'
0204 02E9 84 30              BZ       L131
0205 02EB 21 0F              NI       H'0F'
0206 02ED 24 F6              AI       H'F6'
0207 02EF 92 1A              BNC      L133
0208 02F1 7F                 LIS      H'0F'
0209 02F2 FC                 NS       S
020A 02F3 25 0E              CI       H'0E'
```

```
020B 02F5 84 0A              BZ      L135
020C 02F7 24 F6              AI      D'-10'
020D 02F9 8E                 ADC
020E 02FA 16                 LM
020F 02FB B1                 OUTS    1
0210 02FC 20 7F              LI      H'7F'
0211 02FE B0                 OUTS    0
0212 02FF 1C                 POP
0213 0300 71        L135     LIS     H'01'
0214 0301 B1                 OUTS    1
0215 0302 4C                 LR      A,S
0216 0303 21 70              NI      H'70'
0217 0305 14                 SR      4
0218 0306 8E                 ADC
0219 0307 16                 LM
021A 0308 B0                 OUTS    0
021B 0309 1C                 POP
021C 030A 4C        L133     LR      A,S
021D 030B 21 70              NI      H'70'
021E 030D 14                 SR      4
021F 030E 8E                 ADC
0220 030F 16                 LM
0221 0310 B0                 OUTS    0
0222 0311 2A 01 08           DCI     DDL
0223 0314 7F                 LIS     H'0F'
0224 0315 FC                 NS      S
0225 0316 8E                 ADC
0226 0317 16                 LM
0227 0318 B1                 OUTS    1
0228 0319 1C                 POP
0229 031A 20 7F     L131     LI      H'7F'
022A 031C B0                 OUTS    0
022B 031D 71                 LIS     H'01'
022C 031E B1                 OUTS    1
022D 031F 1C                 POP
022E 0320 40        CHCC     LR      A,FLAG
022F 0321 21 01              NI      H'01'
0230 0323 94 04              BNZ     L51
0231 0325 29 01 15           JMP     L1
0232 0328 40        L51      LR      A,FLAG
0233 0329 21 C0              NI      H'C0'
0234 032B 50                 LR      FLAG,A
0235 032C 29 06 CF           JMP     INST
0236 032F 29 01 15           JMP     L1
0237 0332 40        L50      LR      A,FLAG
0238 0333 21 02              NI      H'02'
0239 0335 94 04              BNZ     PERT
U
023A 0337 29 00 00           JMP     L14
023B 033A 40        PERT     LR      A,FLAG
023C 033B 21 01              NI      H'01'
023D 033D 84 04              BZ      L52
023E 033F 29 01 15           JMP     L1
023F 0342 40        L52      LR      A,FLAG
0240 0343 21 0C              NI      H'0C'
RU
0241 0345 94 BA              BNZ     L15
0242 0347 40                 LR      A,FLAG
0243 0348 21 10              NI      H'10'
0244 034A 84 04              BZ      ECC
0245 034C 29 03 F7           JMP     EDIT
0246 034F 45        ECC      LR      A,DAT
0247 0350 21 FF              NI      H'FF'
0248 0352 94 13              BNZ     L57
0249               *CLOCK SET-SET UP*
024A 0354 20 01              LI      H'01'
024B 0356 B4                 OUTS    4
024C 0357 20 4E              LI      H'4E'
024D 0359 B0                 OUTS    0
024E 035A 20 5B              LI      H'5B'
```

```
024F 035C B1              OUTS   1
0250 035D 40              LR     A,FLAG
0251 035E 24 08           AI     H'08'
0252 0360 50              LR     FLAG,A
0253 0361 2A 06 56        DCI    SDAY
0254 0364 90 42           BR     GGET
0255 0366 45        L57   LR     A,DAT
0256 0367 25 09           CI     H'09'
0257 0369 94 12           BNZ    L58
0258                *EDIT SET SET UP*
0259 036B 40        DEDT  LR     A,FLAG
025A 036C 22 10           OI     H'10'
025B 036E 50              LR     FLAG,A
025C 036F 20 43           LI     H'43'
025D 0371 54              LR     TEM2,A
025E 0372 20 4F           LI     H'4F'
025F 0374 B0              OUTS   0
0260 0375 20 3D           LI     H'3D'
0261 0377 B1              OUTS   1
0262 0378 71              LIS    H'01'
0263 0379 29 04 75        JMP    BOBA
0264                *PROGRAM SET UP*
0265 037C 28 03 81 L58    PI     MEMT
0266 037F 90 1E           BR     DODA
0267 0381 20 14    MEMT   LI     H'14'
0268 0383 0B      L139    LR     IS,A
0269 0384 4C              LR     A,S
026A 0385 25 FF           CI     H'FF'
026B 0387 84 15           BZ     L148
026C 0389 0A              LR     A,IS
026D 038A 25 3F           CI     H'3F'
026E 038C 94 0C           BNZ    L138
026F 038E 20 47           LI     H'47'
0270 0390 B0              OUTS   0
0271 0391 20 1C           LI     H'1C'
0272 0393 B1              OUTS   1
0273 0394 20 36           LI     H'36'
0274 0396 B4              OUTS   4
0275 0397 90 12           BR     DIS1
0276 0399 24 01   L138    AI     H'01'
0277 039B 90 E7           BR     L139
0278 039D 1C     L148     POP
0279 039E 2A 04 E6 DODA   DCI    PDAY
027A 03A1 0E       L15    LR     Q,DC
027B 03A2 03              LR     A,QL
027C 03A3 05              LR     KL,A
027D 03A4 02              LR     A,QU
027E 03A5 04              LR     KU,A
027F 03A6 0C              PK
0280 03A7 0E      GGET    LR     Q,DC
0281 03A8 03              LR     A,QL
0282 03A9 59              LR     NEXT,A
0283 03AA 29 01 15 DIS1   JMP    L1
0284 03AD 2B      L14     NOP
0285 03AE 46      CNG     LR     A,CHAN
0286 03AF 21 0F           NI     H'0F'
0287 03B1 25 0E           CI     H'0E'
0288 03B3 84 16           BZ     L140
0289 03B5 45              LR     A,DAT
028A 03B6 24 F7           AI     H'F7'
028B 03B8 92 03           BNC    L146
028C 03BA 90 EF           BR     DIS1
028D 03BC 45     L146     LR     A,DAT
028E 03BD 25 08           CI     H'08'
028F 03BF 84 06           BZ     L145
0290 03C1 15              SL     4
0291 03C2 24 0E           AI     H'0E'
0292 03C4 90 1F           BR     L143
0293 03C6 20 EE  L145     LI     H'EE'
0294 03C8 90 1B           BR     L143
0295 03CA 46     L140     LR     A,CHAN
```

```
0296 03CB 25 EE              CI    H'EE'
M
0297 03CD 94 0D              BNZ   L141
0298 03CF 45                 LR    A,DAT
0299 03D0 24 FC              AI    H'FC'
029A 03D2 92 03              BNC   L147
029B 03D4 90 D5              BR    DIS1
029C 03D6 45         L147    LR    A,DAT
029D 03D7 24 7A              AI    H'7A'
029E 03D9 90 0A              BR    L143
029F 03DB 45         L141    LR    A,DAT
02A0 03DC 25 0B              CI    H'0B'
02A1 03DE 84 CB              BZ    DIS1
D
02A2 03E0 46         L141    LR    A,CHAN
02A3 03E1 21 70              NI    H'70'
02A4 03E3 C5                 AS    DAT
02A5 03E4 56         L143    LR    CHAN,A
02A6 03E5 20 06              LI    H'06'
02A7 03E7 0B                 LR    IS,A
02A8 03E8 28 02 D9           PI    CHDS
02A9 03EB 29 07 43           JMP   CHCH
02AA 03EE 70         CJMK    CLR
02AB 03EF C6                 AS    CHAN
02AC 03F0 94 04              BNZ   TRIB
02AD 03F2 29 02 9C           JMP   L78
02AE 03F5 90 B4      TRIB    BR    DIS1
02AF 03F7 70         EDIT    CLR
02B0 03F8 E5                 XS    DAT
02B1                 *THIS IS THE EDIT ROUTINE*******
02B2 03F9 84 FB              BZ    TRIB
02B3 03FB 79                 LIS   H'09'
02B4 03FC E5                 XS    DAT
02B5 03FD 84 30              BZ    TROD
02B6 03FF 44                 LR    A,TEM2
02B7 0400 0B                 LR    IS,A
02B8 0401 25 43              CI    H'43'
02B9 0403 94 0E              BNZ   AJ1
02BA 0405 45                 LR    A,DAT
02BB 0406 25 0A              CI    H'0A'
02BC 0408 84 25              BZ    TROD
02BD 040A 13                 SL    1
02BE 040B 15                 SL    4
02BF 040C 53                 LR    TEM1,A
02C0 040D 20 14              LI    H'14'
02C1 040F 0B                 LR    IS,A
02C2 0410 90 1F              BR    L88
02C3 0412 45         AJ1     LR    A,DAT
02C4 0413 25 0A              CI    H'0A'
02C5 0415 84 06              BZ    AJ2
02C6 0417 13                 SL    1
02C7 0418 15                 SL    4
02C8 0419 E3                 XS    TEM1
02C9 041A 94 13              BNZ   TROD
02CA 041C 40         AJ2     LR    A,FLAG
02CB 041D 21 20              NI    H'20'
02CC 041F 84 07              BZ    AJ4
02CD 0421 7A                 LIS   H'0A'
02CE 0422 E5                 XS    DAT
02CF 0423 94 39              BNZ   DIS2
02D0 0425 90 55      SOS     BR    L111
02D1 0427 45         AJ4     LR    A,DAT
02D2 0428 25 0A              CI    H'0A'
02D3 042A 84 50              BZ    L111
02D4 042C 90 03              BR    L88
02D5 042E 90 C6      TROD    BR    TRIB
02D6 0430 0A         L88     LR    A,IS
02D7 0431 23 00              XI    H'00'
02D8 0433 94 03              BNZ   L86
02D9 0435 90 06              BR    TRIP
02DA 0437 4C         L86     LR    A,S
```

```
02DB 0438 25 FF            CI      H'FF'
02DC 043A 94 04            BNZ     DIT
02DD 043C 29 03 6B TRIP    JMP     DEDT
02DE 043F 4C       DIT     LR      A,S
02DF 0440 21 E0            NI      H'E0'
02E0 0442 E3               XS      TEM1
RU
02E1 0443 94 BC            BNZ     BEER
02E2 0445 0A               LR      A,IS
02E3 0446 24 01            AI      H'01'
02E4 0448 0B               LR      IS,A
02E5 0449 28 00 C8         PI      EDTS
02E6                       *RETURN*RETURN*
02E7 044C 40               LR      A,FLAG
02E8 044D 22 20            OI      H'20'
02E9 044F 50               LR      FLAG,A
02EA 0450 20 80            LI      H'80'
02EB 0452 52               LR      TTIM,A
02EC 0453 0A               LR      A,IS
02ED 0454 54               LR      TEM2,A
02EE 0455 90 21    ANY     BR      TRID
02EF 0457 0A      BEER     LR      A,IS
02F0 0458 24 02            AI      H'02'
02F1 045A 0B               LR      IS,A
02F2 045B 90 D4            BR      L88
02F3 045D 44      DIS2     LR      A,TEM2
02F4 045E 0B               LR      IS,A
02F5 045F 40               LR      A,FLAG
02F6 0460 21 DF            NI      H'DF'
02F7 0462 50               LR      FLAG,A
02F8 0463 0A               LR      A,IS
02F9 0464 24 01            AI      H'01'
02FA 0466 0B               LR      IS,A
02FB 0467 28 02 D9         PI      CHDS
02FC 046A 20 4E            LI      H'4E'
02FD 046C B4               OUTS    4
02FE 046D 0A               LR      A,IS
02FF 046E 24 01            AI      H'01'
0300 0470 0B               LR      IS,A
0301 0471 54               LR      TEM2,A
0302 0472 90 BB            BR      TROD
0303 0474 2B               NOP
0304                       *DELETE*DELETE*DELETE********
0305 0475 71      BOBA     LIS     H'01'
0306 0476 B4               OUTS    4
0307 0477 70      TRID     CLR
0308 0478 59               LR      NEXT,A
0309 0479 90 B4            BR      TROD
030A 047B 20 DD   L111     LI      H'DD'
030B 047D E9               XS      NEXT
030C 047E 84 AF            BZ      TROD
030D 0480 20 1D   L115     LI      H'1D'
030E 0482 B0               OUTS    0
030F 0483 20 1C            LI      H'1C'
0310 0485 B1               OUTS    1
0311 0486 7F               LIS     H'0F'
0312 0487 B4               OUTS    4
0313 0488 20 DD            LI      H'DD'
0314 048A 59               LR      NEXT,A
0315 048B 20 D0            LI      H'D0'
0316 048D 52               LR      TTIM,A
0317 048E 40      DEL1     LR      A,FLAG
0318 048F 21 20            NI      H'20'
0319 0491 94 07            BNZ     DEL2
031A 0493 44               LR      A,TEM2
031B 0494 24 FE            AI      H'FE'
031C 0496 0B               LR      IS,A
031D 0497 90 03            BR      DEL4
031E 0499 44      DEL2     LR      A,TEM2
031F 049A 0B               LR      IS,A
0320 049B 4C      DEL4     LR      A,S
```

```
0321 049C 21 E0              NI    H'E0'
0322 049E E3                 XS    TEM1
0323 049F 84 08              BZ    PACK
0324 04A1 29 03 6B DELB      JMP   DEDT
0325 04A4 0A       DEL5      LR    A,IS
0326 04A5 24 01              AI    H'01'
0327 04A7 0B                 LR    IS,A
0328 04A8 0A       PACK      LR    A,IS
0329 04A9 24 02              AI    H'02'
032A 04AB 0B                 LR    IS,A
032B 04AC 4C                 LR    A,S
032C 04AD 55                 LR    DAT,A
032D 04AE 0A                 LR    A,IS
032E 04AF 24 FE              AI    H'FE'
032F 04B1 0B                 LR    IS,A
0330 04B2 45                 LR    A,DAT
0331 04B3 5C                 LR    S,A
0332 04B4 0A                 LR    A,IS
0333 04B5 24 03              AI    H'03'
0334 04B7 0B                 LR    IS,A
0335 04B8 4C                 LR    A,S
0336 04B9 55                 LR    DAT,A
0337 04BA 0A                 LR    A,IS
0338 04BB 24 FE              AI    H'FE'
0339 04BD 0B                 LR    IS,A
033A 04BE 45                 LR    A,DAT
033B 04BF 5C                 LR    S,A
033C 04C0 0A                 LR    A,IS
033D 04C1 25 3F    DEL6      CI    H'3F'
033E 04C3 94 E0              BNZ   DEL5
033F 04C5 20 FF              LI    H'FF'
0340 04C7 5E                 LR    D,A
0341 04C8 5C                 LR    S,A
0342 04C9 40       BACK      LR    A,FLAG
0343 04CA 21 20              NI    H'20'
RU
0344 04CC 84 33              BZ    DEL9
0345 04CE 40                 LR    A,FLAG
0346 04CF 21 DF              NI    H'DF'
0347 04D1 50                 LR    FLAG,A
0348 04D2 29 01 15 DELA      JMP   L1
0349 04D5 44       DEL9      LR    A,TEM2
034A 04D6 24 FE              AI    H'FE'
034B 04D8 54                 LR    TEM2,A
034C 04D9 90 F8              BR    DELA
034D 04DB 2B                 NOP
034E 04DC 2A 01 08 DECO      DCI   DDL
034F 04DF 45                 LR    A,DAT
0350 04E0 21 0F              NI    H'0F'
0351 04E2 8E                 ADC
0352 04E3 16                 LM
0353 04E4 55                 LR    DAT,A
0354 04E5 1C                 POP
0355 04E6 45       PDAY      LR    A,DAT
0356 04E7 24 F7              AI    H'F7'
0357 04E9 92 04              BNC   PIT
0358 04EB 29 01 15 SS00      JMP   L1
0359 04EE 45       PIT       LR    A,DAT
035A 04EF 21 FF              NI    H'FF'
035B 04F1 84 F9              BZ    SS00
035C 04F3 15                 SL    4
035D 04F4 13                 SL    1
035E 04F5 21 E0              NI    H'E0'
035F 04F7 53                 LR    TEM1,A
0360 04F8 40                 LR    A,FLAG
0361 04F9 24 04              AI    H'04'
0362 04FB 50                 LR    FLAG,A
0363 04FC 28 04 DC           PI    DECO
0364              *RETURN*RETURN*
0365 04FF 45                 LR    A,DAT
0366 0500 B4                 OUTS  4
```

```
0367 0501 20 67            LI      H'67'
0368 0503 B0               OUTS    0
0369 0504 20 05            LI      H'05'
036A 0506 B1               OUTS    1
036B 0507 20 80            LI      H'80'
036C 0509 52               LR      TTIM,A
036D 050A 2A 05 10         DCI     PHTN
036E 050D 29 03 A7         JMP     GGET
036F                       *AT THIS POINT TEM1=DAY-----
0370                       *
0371 0510 28 05 19  PHTN   PI      HTN
0372 0513 2A 05 3C         DCI     PHTU
0373 0516 29 03 A7         JMP     GGET
0374 0519 45        HTN    LR      A,DAT
0375 051A 25 01            CI      H'1'
0376 051C 94 09            BNZ     L16
0377 051E 20 81            LI      H'81'
0378 0520 B0               OUTS    0
0379 0521 7A               LIS     H'0A'
037A 0522 C3               AS      TEM1
037B 0523 53               LR      TEM1,A
037C 0524 90 0F            BR      L18
037D 0526 21 FF     L16    NI      H'FF'
037E 0528 84 04            BZ      DORP
037F 052A 29 01 15         JMP     L1
0380 052D A5        DORP   INS     5
0381 052E 21 7F            NI      H'7F'
0382 0530 B5               OUTS    5
0383 0531 A0               INS     0
0384 0532 71               LIS     H'01'
0385 0533 B0               OUTS    0
0386 0534 20 81     L18    LI      H'81'
0387 0536 B1               OUTS    1
0388 0537 B4               OUTS    4
0389 0538 20 60            LI      H'60'
038A 053A B5               OUTS    5
038B 053B 1C               POP
038C                       *TEM1 NOW CONTAINS UP TO DAY-1010
038D                       *
038E 053C 28 05 4A  PHTU   PI      HTU
038F 053F 28 04 DC         PI      DECO
0390 0542 45               LR      A,DAT
0391 0543 B0               OUTS    0
0392 0544 2A 05 71         DCI     PMTN
0393 0547 29 03 A7         JMP     GGET
0394 054A 43        HTU    LR      A,TEM1
0395 054B 21 08            NI      H'08'
0396 054D 94 1B            BNZ     L39
0397 054F 45        L38    LR      A,DAT
0398 0550 C3               AS      TEM1
0399 0551 53               LR      TEM1,A
039A 0552 21 1F            NI      H'1F'
039B 0554 94 04            BNZ     TOT
039C 0556 29 01 15         JMP     L1
039D 0559 43        TOT    LR      A,TEM1
039E 055A 21 0F            NI      H'0F'
039F 055C 55               LR      DAT,A
03A0 055D 43               LR      A,TEM1
03A1 055E 21 1F            NI      H'1F'
03A2 0560 25 0C            CI      H'0C'
03A3 0562 94 05            BNZ     URS
03A4 0564 43               LR      A,TEM1
03A5 0565 21 E0            NI      H'E0'
03A6 0567 53               LR      TEM1,A
03A7 0568 1C        URS    POP
03A8 0569 45        L39    LR      A,DAT
03A9 056A 24 FD            AI      D'-03'
03AA 056C 91 E2            BM      L38
03AB 056E 29 03 A7         JMP     GGET
03AC                       *TEM1 NOW CONTAINS UP TO DAY-1100
03AD                       *
```

```
03AE 0571 45           PMTN   LR    A,DAT
03AF 0572 24 FA               AI    D'-6'
03B0 0574 91 06               BM    L28
03B1 0576 29 01 15            JMP   L1
03B2 0579 90 05               BR    L20
03B3 057B 45           L28    LR    A,DAT
03B4 057C 21 0F               NI    H'0F'
03B5 057E 15                  SL    4
03B6 057F 54           L20    LR    TEM2,A
03B7 0580 28 04 DC            PI    DECO
03B8                   *RETURN*RETURN*
03B9 0583 45                  LR    A,DAT
03BA 0584 A1                  INS   1
03BB 0585 21 FE               NI    H'FE'
03BC 0587 C5                  AS    DAT
03BD 0588 B1                  OUTS  1
03BE 0589 2A 05 8F            DCI   PMTU
03BF 058C 29 03 A7            JMP   GGET
03C0                   *
03C1 058F 45           PMTU   LR    A,DAT
03C2 0590 C4                  AS    TEM2
03C3 0591 54                  LR    TEM2,A
03C4 0592 24 EB               AI    H'EB'
03C5 0594 92 28               BNC   L22
03C6 0596 44                  LR    A,TEM2
03C7 0597 24 BB               AI    H'BB'
03C8 0599 92 03               BNC   CAR
03C9 059B 90 0D               BR    L21
03CA 059D 20 79        CAR    LI    H'79'
03CB 059F B1                  OUTS  1
03CC 05A0 20 7E               LI    H'7E'
03CD 05A2 B4                  OUTS  4
03CE 05A3 44                  LR    A,TEM2
03CF 05A4 20 80               LI    H'80'
03D0 05A6 54                  LR    TEM2,A
03D1 05A7 90 19               BR    L27
03D2 05A9 43           L21    LR    A,TEM1
03D3 05AA 21 1F               NI    H'1F'
03D4 05AC 24 F4               AI    D'-12'
03D5 05AE 91 1F               BM    L23
03D6 05B0 43                  LR    A,TEM1
03D7 05B1 21 E0               NI    H'E0'
03D8 05B3 24 01               AI    H'01'
03D9 05B5 53                  LR    TEM1,A
03DA 05B6 A0                  INS   0
03DB 05B7 20 30               LI    H'30'
03DC 05B9 B0                  OUTS  0
03DD 05BA 90 02               BR    L22
03DE 05BC B0           L41    OUTS  0
03DF 05BD 20 7E        L22    LI    H'7E'
03E0 05BF B1                  OUTS  1
03E1 05C0 B4                  OUTS  4
03E2 05C1 20 80        L27    LI    H'80'
03E3 05C3 52                  LR    TTIM,A
03E4 05C4 2A 05 D8            DCI   AMPM
03E5 05C7 44                  LR    A,TEM2
03E6 05C8 21 80               NI    H'80'
03E7 05CA 54                  LR    TEM2,A
03E8 05CB 29 03 A7     TUBA   JMP   GGET
03E9 05CE 71           L23    LIS   H'01'
03EA 05CF C3                  AS    TEM1
03EB 05D0 53                  LR    TEM1,A
03EC 05D1 55                  LR    DAT,A
03ED 05D2 28 04 DC            PI    DECO
03EE                   *RETURN*RETURN*
03EF 05D5 45                  LR    A,DAT
03F0 05D6 90 E5               BR    L41
03F1                   *
03F2                   *
03F3 05D8 28 05 E3     AMPM   PI    AP
03F4 05DB 20 80               LI    H'80'
```

```
03F5 05DD 52              LR    TTIM,A
03F6 05DE 2A 06 0C        DCI   CHTN
03F7 05E1 90 E9           BR    TUBA
03F8 05E3 73        AP    LIS   H'03'
03F9 05E4 E5              XS    DAT
03FA 05E5 84 17           BZ    L30
03FB 05E7 76              LIS   H'06'
03FC 05E8 E5              XS    DAT
03FD 05E9 94 E1           BNZ   TUBA
03FE 05EB A4              INS   4
03FF 05EC 22 80           OI    H'80'
0400 05EE B4              OUTS  4
0401 05EF 7F              LIS   H'0F'
0402 05F0 F3              NS    TEM1
0403 05F1 25 0C           CI    H'0C'
RU
0404 05F3 84 0C           BZ    SAAB
0405 05F5 7C              LIS   H'0C'
0406 05F6 C3              AS    TEM1
0407 05F7 53        L33   LR    TEM1,A
0408 05F8 A1        SAAB  INS   1
0409 05F9 22 80           OI    H'80'
040A 05FB B1              OUTS  1
040B 05FC 1C              POP
040C 05FD A4        L30   INS   4
040D 05FE 21 7F           NI    H'7F'
040E 0600 B4              OUTS  4
040F 0601 7F              LIS   H'0F'
0410 0602 F3              NS    TEM1
0411 0603 25 0C           CI    H'0C'
0412 0605 94 F2           BNZ   SAAB
0413 0607 20 E0           LI    H'E0'
0414 0609 F3              NS    TEM1
0415 060A 90 EC           BR    L33
0416                  *
0417                  *
0418 060C 45        CHTN  LR    A,DAT
0419 060D 24 F7           AI    H'F7'
041A 060F 92 04           BNC   S02
041B 0611 29 01 15 NICK   JMP   L1
041C 0614 2B        S02   NOP
041D 0615 A4              INS   4
041E 0616 21 00           NI    H'00'
041F 0618 24 4E           AI    H'4E'
0420 061A B4              OUTS  4
0421 061B 70              CLR
0422 061C 59              LR    NEXT,A
0423 061D 45              LR    A,DAT
0424 061E 24 F8           AI    D'-8'
0425 0620 91 12           BM    L42
0426 0622 44              LR    A,TEM2
0427 0623 22 7A           OI    H'7A'
0428 0625 54              LR    TEM2,A
0429 0626 28 04 DC L35    PI    DECO
042A                  *RETURN*RETURN*
042B 0629 45              LR    A,DAT
042C 062A B0              OUTS  0
042D 062B 71              LIS   H'01'
042E 062C B1              OUTS  1
042F 062D 2A 06 3A        DCI   CHUN
0430 0630 29 03 A7        JMP   GGET
0431 0633 45        L42   LR    A,DAT
0432 0634 15              SL    4
0433 0635 C4              AS    TEM2
0434 0636 54              LR    TEM2,A
0435 0637 45              LR    A,DAT
0436 0638 90 ED           BR    L35
0437                  *
0438                  *
0439 063A 44        CHUN  LR    A,TEM2
043A 063B 21 0F           NI    H'0F'
```

```
043B 063D 84 09              BZ     L37
043C 063F 45                 LR     A,DAT
043D 0640 24 FC              AI     D'-4'
043E 0642 91 04              BM     L37
043F 0644 29 03 A7           JMP    GGET
0440 0647 45         L37     LR     A,DAT
0441 0648 C4                 AS     TEM2
0442 0649 54                 LR     TEM2,A
0443 064A 28 04 DC           PI     DECO
0444                *RETURN*RETURN*
0445 064D 45                 LR     A,DAT
0446 064E B1                 OUTS   1
0447 064F 20 EE              LI     H'EE'
0448 0651 59                 LR     NEXT,A
0449 0652 29 06 CF           JMP    INST
044A 0655 2B                 NOP
044B 0656 45         SDAY    LR     A,DAT
044C 0657 24 F8              AI     H'F8'
044D 0659 92 04              BNC    SPIT
044E 065B 29 01 15  SS01     JMP    L1
044F 065E 45         SPIT    LR     A,DAT
0450 065F 21 FF              NI     H'FF'
0451 0661 84 F9              BZ     SS01
0452 0663 15                 SL     4
0453 0664 13                 SL     1
0454 0665 21 E0              NI     H'E0'
0455 0667 53                 LR     TEM1,A
0456 0668 28 04 DC           PI     DECO
0457                *RETURN*RETURN*
0458 066B 45                 LR     A,DAT
0459 066C B4                 OUTS   4
045A 066D 20 4E              LI     H'4E'
045B 066F B0                 OUTS   0
045C 0670 20 5B              LI     H'5B'
045D 0672 B1                 OUTS   1
045E 0673 20 80              LI     H'80'
045F 0675 52                 LR     TTIM,A
0460 0676 2A 06 7C           DCI    SHTN
0461 0679 29 03 A7           JMP    GGET
0462                *AT THIS POINT TEM1=DAY-----
0463                *
0464 067C 28 05 19  SHTN     PI     HTN
0465 067F 2A 06 85           DCI    SHTU
0466 0682 29 03 A7           JMP    GGET
0467                *TEM1 NOW CONTAINS UP TO DAY-1010
0468                *
0469 0685 28 05 4A  SHTU     PI     HTU
046A 0688 28 04 DC           PI     DECO
046B 068B 45                 LR     A,DAT
046C 068C B0                 OUTS   0
046D 068D 2A 06 93           DCI    SMTN
046E 0690 29 03 A7           JMP    GGET
046F                *TEM1 NOW CONTAINS UP TO DAY-1100
0470                *
0471                *
0472 0693 45         SMTN    LR     A,DAT
0473 0694 24 FA              AI     H'FA'
0474 0696 92 05              BNC    L67
0475 0698 29 01 15           JMP    L1
0476 069B 55                 LR     DAT,A
0477 069C 45         L67     LR     A,DAT
0478 069D 25 02              CI     H'02'
0479 069F 81 03              BP     L69
047A 06A1 24 05              AI     H'05'
047B 06A3 15         L69     SL     4
047C 06A4 2B                 NOP
047D 06A5 54                 LR     TEM2,A
047E 06A6 28 04 DC           PI     DECO
047F                *RETURN:RETURN*
0480 06A9 45                 LR     A,DAT
0481 06AA B1                 OUTS   1
```

```
0482 06AB 2A 06 B1           DCI    SMTU
0483 06AE 29 03 A7           JMP    GGET
0484                  *
0485                  *
0486 06B1 45          SMTU   LR     A,DAT
0487 06B2 C4                 AS     TEM2
0488 06B3 54                 LR     TEM2,A
0489 06B4 28 04 DC           PI     DECO
048A                  *RETURN*RETURN*
048B 06B7 45                 LR     A,DAT
048C 06B8 B4                 OUTS   4
048D 06B9 2A 06 C2           DCI    SFAM
048E 06BC 20 80              LI     H'80'
048F 06BE 52                 LR     TTIM,A
0490 06BF 29 03 A7           JMP    GGET
0491                  *
0492                  *
0493 06C2 28 05 E3   SFAM    PI     AF
0494 06C5 40                 LR     A,FLAG
0495 06C6 22 81              OI     H'81'
0496 06C8 50                 LR     FLAG,A
0497 06C9 70                 CLR
0498 06CA 59                 LR     NEXT,A
0499 06CB 29 01 15           JMP    L1
049A 06CE 2B                 NOP
049B 06CF 20 14      INST    LI     H'14'
049C 06D1 0B                 LR     IS,A
049D 06D2 4C         LUK1    LR     A,S
049E 06D3 23 FF              XI     H'FF'
049F 06D5 84 5E              BZ     ENTR
04A0                  *
04A1                  *
04A2                  *
04A3 06D7 2B                 NOP
04A4 06D8 43                 LR     A,TEM1
04A5 06D9 1F                 INC
04A6 06DA 57                 LR     TMP1,A
04A7                  *
04A8 06DB 4C                 LR     A,S
04A9 06DC 1F                 INC
04AA 06DD 18                 COM
04AB 06DE 1F                 INC
04AC 06DF C7                 AS     TMP1
04AD 06E0 84 09              BZ     BIT1
04AE 06E2 92 20              BNC    BMP1
04AF                  *
04B0 06E4 0A                 LR     A,IS
04B1 06E5 24 02              AI     H'02'
04B2 06E7 0B                 LR     IS,A
04B3 06E8 90 E9              BR     LUK1
04B4                  *
04B5                  *
04B6 06EA 4D         BIT1    LR     A,I
04B7 06EB 4C                 LR     A,S
04B8 06EC E4                 XS     TEM2
04B9 06ED 21 80              NI     H'80'
04BA 06EF 94 04              BNZ    BIT2
04BB                  *
04BC                  *
04BD 06F1 4E                 LR     A,D
04BE 06F2 90 41              BR     ENTR
04BF                  *
04C0                  *
04C1 06F4 44         BIT2    LR     A,TEM2
04C2 06F5 21 80              NI     H'80'
04C3 06F7 84 0A              BZ     BMF0
04C4 06F9 0A                 LR     A,IS
04C5 06FA 1F                 INC
04C6 06FB 0B                 LR     IS,A
04C7 06FC 4C                 LR     A,S
04C8 06FD E3                 XS     TEM1
```

```
04C9 06FE 84 35              BZ    ENTR
04CA 0700 90 02              BR    BMP1
04CB 0702 4E      BMP0       LR    A,D
04CC              *
04CD              *
04CE 0703 0A      BMP1       LR    A,IS
04CF 0704 55                 LR    DAT,A
04D0              *
04D1              *
04D2 0705 0A      LUK2       LR    A,IS
04D3 0706 24 02              AI    H'02'
04D4 0708 0B                 LR    IS,A
04D5 0709 4C                 LR    A,S
04D6 070A 23 FF              XI    H'FF'
04D7 070C 84 08              BZ    BMP2
04D8 070E 0A                 LR    A,IS
04D9 070F 21 3E              NI    H'3E'
04DA 0711 84 26              BZ    RET
04DB 0713 90 F1              BR    LUK2
04DC              *
04DD              *
04DE 0715 0A      BMP2       LR    A,IS
04DF 0716 24 FE              AI    H'FE'
04E0 0718 0B                 LR    IS,A
04E1              *
04E2              *
04E3 0719 4C      BMP3       LR    A,S
04E4 071A 51                 LR    TMP0,A
04E5 071B 0A                 LR    A,IS
04E6 071C 24 02              AI    H'02'
04E7 071E 0B                 LR    IS,A
04E8 071F 41                 LR    A,TMP0
04E9 0720 5C                 LR    S,A
04EA 0721 0A                 LR    A,IS
04EB 0722 24 FF              AI    H'FF'
04EC 0724 0B                 LR    IS,A
04ED 0725 4C                 LR    A,S
04EE 0726 51                 LR    TMP0,A
04EF 0727 0A                 LR    A,IS
04F0 0728 24 02              AI    H'02'
04F1 072A 0B                 LR    IS,A
04F2 072B 41                 LR    A,TMP0
04F3 072C 5C                 LR    S,A
04F4              *
04F5 072D 0A                 LR    A,IS
04F6 072E 24 FD              AI    H'FD'
04F7 0730 0B                 LR    IS,A
04F8 0731 E5                 XS    DAT
04F9 0732 94 E2              BNZ   BMP2
04FA              *
04FB              *
04FC 0734 43      ENTR       LR    A,TEM1
04FD 0735 5D                 LR    I,A
04FE 0736 44                 LR    A,TEM2
04FF 0737 5C                 LR    S,A
0500              *
0501              *
S
0502 0738 40      RET        LR    A,FLAGGc
0503 0739 21 FA              NI    H'FA'
0504 073B 50                 LR    FLAG,A
0505 073C 20 80              LI    H'80'
0506 073E 52                 LR    TTIM,A
0507 073F 29 01 15           JMP   L1
0508 0742 2B                 NOP
0509              TMP1       EQU   H'07'
050A 0743 4C      CHCH       LR    A,S
050B 0744 21 0F              NI    H'0F'
050C 0746 23 0E              XI    H'0E'
050D 0748 84 6B              BZ    LEEV
050E 074A 4C                 LR    A,S
```

| | | | | | |
|---|---|---|---|---|---|
| 050F | 074B | 21 7F | | NI | H'7F' |
| 0510 | 074D | 84 0A | | BZ | TVOF |
| 0511 | 074F | 25 79 | | CI | H'79' |
| 0512 | 0751 | 81 03 | | BF | LT80 |
| 0513 | 0753 | 24 06 | | AI | H'06' |
| 0514 | 0755 | 57 | LT80 | LR | TMP1,A |
| 0515 | 0756 | 90 06 | | BR | TVON |
| 0516 | 0758 | 24 60 | TVOF | AI | H'60' |
| 0517 | 075A | B5 | | OUTS | 5 |
| 0518 | 075B | 90 58 | | BR | LEEV |
| 0519 | 075D | A5 | TVON | INS | 5 |
| 051A | 075E | 55 | | LR | DAT,A |
| 051B | 075F | A5 | | INS | 5 |
| 051C | 0760 | E5 | | XS | DAT |
| 051D | 0761 | 94 FB | | BNZ | TVON |
| 051E | 0763 | C5 | | AS | DAT |
| 051F | 0764 | 21 20 | | NI | H'20' |
| 0520 | 0766 | 84 12 | | BZ | NOWT |
| 0521 | 0768 | 20 C0 | | LI | H'C0' |
| 0522 | 076A | F0 | | NS | FLAG |
| 0523 | 076B | 50 | | LR | FLAG,A |
| 0524 | 076C | 20 0F | | LI | H'0F' |
| 0525 | 076E | B5 | | OUTS | 5 |
| 0526 | 076F | 20 B8 | | LI | H'B8' |
| 0527 | 0771 | 52 | | LR | TTIM,A |
| 0528 | 0772 | 20 77 | | LI | WAT1 |
| 0529 | 0774 | 59 | | LR | NEXT,A |
| 052A | 0775 | 90 14 | | BR | WUSH |
| 052B | 0777 | 70 | WAT1 | CLR | |
| 052C | 0778 | 59 | | LR | NEXT,A |
| 052D | 0779 | 70 | NOWT | CLR | |
| 052E | 077A | 53 | | LR | TEM1,A |
| 052F | 077B | 47 | | LR | A,TMP1 |
| 0530 | 077C | 14 | | SR | 4 |
| 0531 | 077D | 21 0F | ONES | NI | H'0F' |
| 0532 | 077F | B4 | | OUTS | 4 |
| 0533 | 0780 | A5 | | INS | 5 |
| 0534 | 0781 | 22 20 | | OI | H'20' |
| 0535 | 0783 | B5 | | OUTS | 5 |
| 0536 | 0784 | 20 FC | | LI | H'FC' |
| 0537 | 0786 | 52 | | LR | TTIM,A |
| 0538 | 0787 | 20 94 | | LI | WAT2 |
| 0539 | 0789 | 59 | | LR | NEXT,A |
| 053A | 078A | 20 10 | WUSH | LI | H'10' |
| 053B | 078C | 0B | | LR | IS,A |
| 053C | 078D | 4C | | LR | A,S |
| 053D | 078E | 22 03 | | OI | H'03' |
| 053E | 0790 | 5C | | LR | S,A |
| 053F | 0791 | 29 01 1E | | JMP | INT1 |
| 0540 | 0794 | 70 | WAT2 | CLR | |
| 0541 | 0795 | 59 | | LR | NEXT,A |
| 0542 | 0796 | A5 | | INS | 5 |
| 0543 | 0797 | 21 DF | | NI | H'DF' |
| 0544 | 0799 | B5 | | OUTS | 5 |
| 0545 | 079A | 70 | | CLR | |
| 0546 | 079B | B4 | | OUTS | 4 |
| 0547 | 079C | 71 | | LIS | H'01' |
| 0548 | 079D | C3 | | AS | TEM1 |
| 0549 | 079E | 53 | | LR | TEM1,A |
| 054A | 079F | 71 | | LIS | H'01' |
| 054B | 07A0 | E3 | | XS | TEM1 |
| 054C | 07A1 | 94 0E | | BNZ | LEAV |
| 054D | 07A3 | 20 FC | | LI | H'FC' |
| 054E | 07A5 | 52 | | LR | TTIM,A |
| 054F | 07A6 | 20 AB | | LI | WAT3 |
| 0550 | 07A8 | 59 | | LR | NEXT,A |
| 0551 | 07A9 | 90 E0 | | BR | WUSH |
| 0552 | 07AB | 70 | WAT3 | CLR | |
| 0553 | 07AC | 59 | | LR | NEXT,A |
| 0554 | 07AD | 47 | | LR | A,TMP1 |
| 0555 | 07AE | 90 CE | | BR | ONES |

```
0556 07B0 20 80    LEAV   LI    H'80'
0557 07B2 FC              NS    S
0558 07B3 5C              LR    S,A
0559 07B4 29 03 EE LEEVS  JMP   CJMK
055A 07B7 2B              NOP
055B 07B8 70      SRCH    CLR
055C 07B9 58              LR    SEC,A
055D 07BA C6              AS    CHAN
055E 07BB 94 06           BNZ   CHON
055F 07BD 40              LR    A,FLAG
0560 07BE 21 80           NI    H'80'
0561 07C0 84 3A           BZ    MTRM
0562 07C2 20 3E   CHON    LI    H'3E'
0563 07C4 0B              LR    IS,A
0564              *
0565 07C5 4C      LOUP    LR    A,S
0566 07C6 21 E0           NI    H'E0'
0567 07C8 94 0F           BNZ   LOOP
0568 07CA 4A              LR    A,HR
0569 07CB 21 E0           NI    H'E0'
056A 07CD 25 E0           CI    H'E0'
056B 07CF 84 08           BZ    LOOP
056C 07D1 25 20           CI    H'20'
056D 07D3 84 04           BZ    LOOP
056E 07D5 CD              AS    IRU
056F 07D6 90 29           BR    MTF
0570              *
0571 07D8 4D      LOOP    LR    A,I
0572 07D9 EA      MTF     XS    HR
0573 07DA 84 0C           BZ    EQHR
0574              *
0575              *
0576              *
0577 07DC 0A      LUPE    LR    A,IS
0578 07DD 23 15           XI    H'15'
0579 07DF 84 1B           BZ    MTRM
057A              *
057B              *
057C 07E1 0A              LR    A,IS
057D 07E2 24 FD           AI    H'FD'
057E 07E4 0B              LR    IS,A
057F 07E5 90 DF           BR    LOUP
0580              *
0581              *
0582 07E7 4C      EQHR    LR    A,S
0583 07E8 21 80           NI    H'80'
0584 07EA EB              XS    MIN
0585 07EB 94 F0           BNZ   LUPE
0586 07ED 4C              LR    A,S
0587 07EE 21 7F           NI    H'7F'
0588 07F0 56              LR    CHAN,A
0589 07F1 40              LR    A,FLAG
058A 07F2 22 40           OI    H'40'
058B 07F4 50              LR    FLAG,A
058C 07F5 28 02 D9        PI    CHDS
058D 07F8 29 07 43        JMP   CHCH
058E 07FB 70      MTRM    CLR
058F 07FC 58              LR    SEC,A
0590 07FD 29 02 78        JMP   L80
0591                      END
12

AJ1   0412   AJ2   041C   AJ4   0427   AMPM  05D8   ANY   0455
AP    05E3   BACK  04C9   BEB1  0022   BEER  0457   BER   0457
BIN   01A9   BIFP  01B6   BIT1  06EA   BIT2  06F4   BMP0  0702
BMP1  0703   BMP2  0715   BMP3  0719   BOBA  0475   BON   023A
BOXI  013A   CAR   059D   CCNT  0094   CHAN  0006   CHCC  0320
CHCH  0743   CHDS  02D9   CHNG  03AE   CHON  07C2   CHTN  060C
CHUN  063A   CJMK  03EE   CKDS  00CD   CKST  0031   CNG   03AE
```

| | | | | | | | | | |
|---|---|---|---|---|---|---|---|---|---|
| COP | 0225 | CSEC | 008E | DAT | 0005 | DATZ | 001D | DB | 0168 |
| DBNC | 018E | DDDE | 02A8 | DDL | 0108 | DECO | 04DC | DEDT | 036B |
| DEL1 | 048E | DEL2 | 0499 | DEL4 | 049B | DEL5 | 04A4 | DEL6 | 04C1 |
| DEL9 | 04D5 | DELA | 04D2 | DELB | 04A1 | DELM | 01F6 | DIDE | 027F |
| DIS1 | 03AA | DIS2 | 045D | DIT | 043F | DL5 | 04A4 | DL9 | 04D5 |
| DODA | 039E | DORP | 052D | DTST | 0062 | ECC | 034F | EDIT | 03F7 |
| EDTS | 00C8 | ENTR | 0734 | EQHR | 07E7 | EXIT | 00C0 | FLAG | 0000 |
| GGET | 03A7 | GMIN | 00CF | HR | 000A | HTN | 0519 | HTU | 054A |
| HZ40 | 0037 | HZ60 | 0081 | HZCM | 006E | HZEX | 007E | HZR | 0012 |
| HZZ | 007A | INST | 06CF | INT1 | 011E | ISEC | 0032 | JJ11 | 01D4 |
| JNT1 | 01D7 | KDTS | 015F | KEP | 026D | KIR1 | 02D6 | L1 | 0115 |
| L10 | 01C0 | L111 | 047B | L115 | 0480 | L13 | 01C6 | L130 | 01FA |
| L131 | 031A | L133 | 030A | L135 | 0300 | L138 | 0399 | L139 | 0383 |
| L14 | 03AD | L140 | 03CA | L141 | 03DB | L143 | 03E4 | L145 | 03C6 |
| L146 | 03BC | L147 | 03D6 | L148 | 039D | L15 | 03A1 | L16 | 0526 |
| L18 | 0534 | L20 | 057F | L21 | 05A9 | L22 | 05BD | L23 | 05CE |
| L27 | 05C1 | L28 | 057B | L3 | 01DA | L30 | 05FD | L33 | 05F7 |
| L35 | 0626 | L37 | 0647 | L38 | 054F | L39 | 0569 | L4 | 023D |
| L41 | 05BC | L42 | 0633 | L45 | 0233 | L46 | 0237 | L47 | 0228 |
| L49 | 0282 | L5 | 0249 | L50 | 0332 | L51 | 0328 | L52 | 0342 |
| L57 | 0366 | L58 | 037C | L6 | 0257 | L67 | 069C | L69 | 06A3 |
| L75 | 02C8 | L76 | 02AF | L78 | 029C | L80 | 0278 | L81 | 02A0 |
| L86 | 0437 | L88 | 0430 | L99 | 0202 | LEAV | 07B0 | LEEV | 07B4 |
| LOOP | 07D8 | LOUP | 07C5 | LT80 | 0755 | LUK1 | 06D2 | LUK2 | 0705 |
| LUPE | 07DC | MEMT | 0381 | MF | 07D9 | MIN | 000B | MK | 00D4 |
| MTF | 07D9 | MTRM | 07FB | NEXT | 0009 | NICK | 0611 | NO | 01EC |
| NON1 | 016F | NOWT | 0779 | NURL | 0099 | ONES | 077D | OOPS | 014A |
| PACK | 04A8 | PDAY | 04E6 | PERT | 033A | PFF | 0009 | PHTN | 0510 |
| PHTU | 053C | PIT | 04EE | PMTN | 0571 | PMTU | 058F | PT | 0019 |
| PUT | 000B | PZO | 0006 | READ | 0150 | RET | 0738 | S02 | 0614 |
| SAAB | 05F8 | SAB | 05F8 | SDAY | 0656 | SEC | 0008 | SHTN | 067C |
| SHTU | 0685 | SKEE | 0268 | SKOP | 00A2 | SKPO | 0270 | SMTN | 0693 |
| SMTU | 06B1 | SOOT | 0211 | SOS | 0425 | SPAM | 06C2 | SPIT | 065E |
| SPM | 00F3 | SRCH | 07B8 | SS00 | 04EB | SS01 | 065B | TEM1 | 0003 |
| TEM2 | 0004 | TENC | 0100 | TMDP | 00C3 | TMK | 00D0 | TMPO | 0001 |
| TMP1 | 0007 | TOOH | 027D | TOP | 002B | TOT | 0559 | TRIB | 03F5 |
| TRID | 0477 | TRIP | 043C | TROD | 042E | TRTN | 0033 | TTIM | 0002 |
| TUBA | 05CB | TVOF | 0758 | TVON | 075D | TZ | 00FA | URS | 0568 |
| VCNT | 0013 | VEXI | 0134 | VOL | 0042 | VSV | 005F | VUDT | 0057 |
| VUDX | 006A | VZER | 0131 | WAK1 | 0184 | WAK2 | 018B | WAT1 | 0777 |
| WAT2 | 0794 | WAT3 | 07AB | WUSH | 078A | | | | |

*

What is claimed is:

1. In a television system, apparatus comprising:
digital tuner means for tuning said television system to various channels identified by respective channel numbers in a predetermined range of numbers in response to binary signals representing said channel numbers;
programmable means for at least temporarily storing binary signals representing information to be selected by a user;
keyboard means including a plurality of digit keys for normally generating binary signals representing said channel numbers in response to the operation of said digit keys by said user; and
control means responsive to the operation of at least one of said digit keys to generate binary signals representing channel numbers within said predetermined range of numbers for causing said digital tuner means to tune said television system to respective channels and responsive to the operation of at least one of said digit keys to generate binary signals representing a predetermined number not within said predetermined range of said numbers for enabling said programmable means to receive binary signals generated in response to the subsequent operation of said digit keys.

2. The apparatus recited in claim 1 wherein:
said television system includes signal processing means coupled to said digital tuner means for generating picture and audio signals representing respective picture and audio characteristics of said television system;
said signal processing means including characteristic control means for controlling one of said picture and audio signals in response to binary signals representing said respective characteristic;
said keyboard means includes at least one characteristic control key for normally generating binary signals representing changes of said characteristic in response to the operation of said characteristic control key by said user; and
said control means is responsive to the operation of at least one of said digit keys to generate binary signals representing channel numbers within said predetermined range of numbers followed by the operation of said characteristic control key to cause said characteristic control means to control said one of said picture and audio signals and responsive to the operation of at least one of said digit keys to generate binary signals representing said predetermined number followed by the operation of said characteristic control key to enable said programmable means to receive binary signals generated in response to the subsequent operation of said digit keys.

3. The apparatus recited in claim 2 wherein:

said keyboard means includes first and second characteristic control keys for normally generating binary signals representing opposite changes of said characteristic; and said control means is responsive to the operation of at least one of said digit keys to generate binary signals representing channel numbers within said predetermined range of numbers followed by the operation of one of said first and second characteristic control keys to cause said characteristic control means to control said one of said picture and audio signals accordingly and responsive to the operation of at least one of said digit keys to generate binary signals representing said predetermined number followed by the operation of said first characteristic key to enable said programmable means to receive binary signals generated in response to the subsequent operation of said digit keys and thereafter in response to the operation of said second characteristic key to cause said programmable means to store the binary signals previously generated in response to the operation of said digit keys.

4. The apparatus recited in claim 3 wherein:

said programmable means include clock means for generating binary signals representing the present time;

said programmable means includes memory means having a number of memory slots each for storing binary signals representing a future selection comprising a future day and time of day and the channel number of a channel to be tuned by said digital tuner means at said future day and time of day;

said television system includes display means normally for selectively displaying the present time in response to binary signals generated by said clock means and the channel number of a presently tuned channel in response to one of binary signals generated in response to the operation of said digit keys and binary signals stored in said memory means;

said control means is responsive to the operation of said first characteristic control key followed by the operation of predetermined ones of said digit keys to initiate respective ones of a clock setting, programming and editing modes;

said control means causing binary signals representing present time information generated in response to the operation of said digit keys during said clock setting mode to be coupled to said clock means to set the present time;

said control means causing binary signals representing future selection information generated in response to the operation of said digit keys during said programming mode to be coupled to said memory means to select said future selections; and said control means causes binary signals representing future selection information stored in said memory means to be coupled to said display means during said editing mode to review said future selections.

5. The apparatus recited in claim 4 wherein:

said display means also displays various symbols in response to corresponding binary signals;

said control means causes binary signals representing a first symbol indicative of said clock setting mode to be coupled to said display means when said clock setting mode is initiated;

said control means causes binary signals representing a second symbol indicative of said programming mode to be coupled to said display means when said programming mode is initiated; and said control means causes binary signals representing a third symbol indicative of said editing mode to be coupled to said display means when said editing mode is initiated.

6. The apparatus recited in claim 3 wherein:

said television system includes first power supply means for selectively coupling and decoupling operating power to at least signal processing means to establish on and off conditions, respectively, of said television system;

said television system includes second power supply means for coupling operating power to said control means; and said control means is responsive to binary signals representing a channel number within said predetermined range of numbers to enable said first power supply means to couple operating power to at least one of said digital tuner means and said signal processing means and is responsive to binary signals representing said predetermined number to disable said first power supply means from coupling operating power to at least one of said digital tuner means and said signal processing means.

7. The apparatus recited in claim 6 wherein:

said television system includes clock means for generating binary signals representing the present time;

said keyboard includes ten digits keys for generating binary signals representing the digits 0 through 9;

said memory means includes a number of memory slots each for storing binary signals representing a future selection comprising a future day and time of day and the channel number of a channel to be tuned by said digital tuner means at said future day and time of day;

said control means is responsive to the operation of said first characteristic control key followed by the operation of a first of two predetermined digit keys when said television system is in said off condition to initiate a clock setting mode in which binary signals representing present time information generated in response to the subsequent operation of said digit keys are coupled to said clock means; and said control means is responsive to the operation of said first characteristic control key followed by the operation of any one of the remaining eight digit keys excluding said two predetermined keys when said television system is in said off condition to initiate a programming mode in which binary signals representing future selection information generated in response to the subsequent operation of said digit keys are coupled to said memory means, seven of said remaining eight digit keys corresponding to the seven days of the week and the eighth of said eight remaining digit keys corresponding to a predetermined group of days.

8. The apparatus recited in claim 7 wherein:

said television system includes display means normally for selectively displaying the present time in response to binary signals generated by said clock means and the channel number of a presently tuned channel in response to one of binary signals generated in response to the operation of said digit keys when the television system is on and binary signals stored in said memory means, said display means also displaying various symbols in response to corresponding binary signals, said display means receiving operating power from said second power supply means;

said control means causes binary signals representing a first symbol including at least one letter indicative of the clock setting mode to be coupled to said display means at the initiation of said clock setting mode; and said control means causes binary signals representing a second symbol including at least one letter indicative of the programming mode to be coupled to said display means at the initiation of said programming mode.

9. The apparatus recited in claim 8 wherein:

said control means is responsive to the operation of said first characteristic control key followed by the operation of the second of said two predetermined digit keys when said television system is in said off condition to initiate an editing mode in which binary signals stored in said memory means representing future selections are coupled to said display means in response to the subsequent operation of the one of said remaining eight digit keys corresponding to the day or said predetermined group of days for which said future selections are to be reviewed.

10. The apparatus recited in claim 8 wherein:

said control means causes binary signals representing a fourth symbol including at least one letter indicative of said editing mode to be coupled to said display means.

11. The apparatus recited in claim 10 wherein:

said control means is responsive to the operation of said first characteristic control key during said editing mode to remove binary signals representing the one of said future selections being presently reviewed from said memory means.

12. The apparatus recited in claim 11 wherein:

said control means is responsive to the operation of said first characteristic control key during said editing mode to cause binary signals representing a fourth symbol including at least one letter indicative of the deletion of one of said future selections to be coupled to said display means.

13. In a television system, apparatus comprising:

digital tuning means for tuning said television system to various channels identified by respective channel numbers in response to binary signals representing said channel numbers to thereby generate an IF signal having components representing picture and audio information;

signal processing means for deriving picture and audio signals from said components of said IF signal;

first power supply means for selectively coupling and decoupling operating power to at least one of said digital tuner means and said signal processing means to thereby establish an on condition of said television system and an off condition of said television system;

programmable means for at least temporarily storing binary signals representing information selected by a user;

keyboard means including digit keys for normally generating binary signals representing said channel numbers in response to the operation of said digit keys by said user; and second power supply means;

control means receiving operating power from said second power supply means and being coupled to said first power supply means for enabling binary signals generated in response to the operation of said digit keys to be coupled to said digital tuner means when said television system is in said on condition and for enabling binary signals generated in response to the operation of said digit keys to be coupled to said programmable means when said television system is in said off condition.

14. The apparatus recited in claim 13 wherein:

said signal processing means includes characteristic control means for controlling at least one of said picture and audio signals to thereby control a characteristic of said television system in response to binary signals;

said keyboard means includes at least one characteristic control key for normally generating binary signals for controlling said one of said picture and audio signals when operated by said user;

said control means is responsive to the operation of said characteristic control key when said television system is in said on condition to enable binary signals generated in response to the operation of said characteristic control key to be coupled to said characteristic control means; and said control means is responsive to the operation of said characteristic control key followed by the operation of predetermined ones of said digit keys when said television system is in said off condition to initiate respective modes of operation for variously processing binary signals stored in said programmable means.

15. The apparatus recited in claim 14 wherein:

said keyboard means includes first and second characteristic control keys for normally generating binary signals representing opposite changes of said one of said picture and audio signals;

said control means is responsive to the operation of one of said first and second characteristic control keys when said television system is in said on condition to cause said characteristic control means to control said one of said picture and audio signals accordingly and responsive to the operation of said first characteristic key followed by the operation of said predetermined ones of said digit keys when said television system is in said off condition to initiate said modes of operation and thereafter in response to the operation of said second characteristic key to terminate said modes.

* * * * *

UNITED STATES PATENT AND TRADEMARK OFFICE
CERTIFICATE OF CORRECTION

PATENT NO. : 4,162,513

DATED : July 24, 1979

INVENTOR(S): Billy Wesley Beyers, Jr., et al

It is certified that error appears in the above-identified patent and that said Letters Patent is hereby corrected as shown below:

In column 4, line 19, change "ofa" to --of a--.

In column 10, line 9, change "is" to --in--.

In column 11, line 16, change "TT1M" to --TTIM--.

In Column 12, line 20, after "P4-0" insert --through P4-3--.

In column 12, line 59, change "supplied t" to --supplied to--.

In column 14, line 2, the word "INITIALIZATION" should be on a separate line.

In column 14, line 15, the word "KEYBOARD" should be on a separate line.

In column 14, line 66, change "aroutine" to --a routine--.

In column 15, line 39, the words "MODE SELECT" should be on a separate line.

In column 15, line 64, change "37 1" " to --"1"--.

In column 17, line 12, after "CS" insert --PR--.

In column 17, line 36, "CKDS AND EDTS" should be on a separate line.

In column 17, line 62, "CHDS" should be on a separate line.

UNITED STATES PATENT AND TRADEMARK OFFICE
CERTIFICATE OF CORRECTION

PATENT NO. : 4,162,513            Page 2 of 2

DATED : July 24, 1979

INVENTOR(S) : Billy Wesley Beyers, Jr., et al

It is certified that error appears in the above-identified patent and that said Letters Patent is hereby corrected as shown below:

In column 18, line 1, change "the" (first occasion) to --and--.

In column 21, line 29, change "digit" to --digits--.

In the Abstract:

In column 2, line 17, change "signal" to --signals--.

In column 2, line 24, change "predeterined" to --predetermined--

Signed and Sealed this

Twenty-fifth Day of December 1979

[SEAL]

Attest:

SIDNEY A. DIAMOND

Attesting Officer      Commissioner of Patents and Trademarks